US009978808B2

United States Patent
Schneider, Jr. et al.

(10) Patent No.: US 9,978,808 B2
(45) Date of Patent: May 22, 2018

(54) MONOLITHIC MULTICOLOR DIRECT VIEW DISPLAY CONTAINING DIFFERENT COLOR LEDS AND METHOD OF MAKING THEREOF

(71) Applicant: GLO AB, Lund (SE)

(72) Inventors: Richard P. Schneider, Jr., Albuquerque, NM (US); Benjamin Leung, Sunnyvale, CA (US)

(73) Assignee: GLO AB, Lund (SE)

( * ) Notice: Subject to any disclaimer, the term of this patent is extended or adjusted under 35 U.S.C. 154(b) by 0 days. days.

(21) Appl. No.: 15/585,420

(22) Filed: May 3, 2017

(65) Prior Publication Data
US 2017/0323925 A1    Nov. 9, 2017

Related U.S. Application Data

(60) Provisional application No. 62/331,859, filed on May 4, 2016, provisional application No. 62/464,504, filed on Feb. 28, 2017.

(51) Int. Cl.
*H01L 33/24* (2010.01)
*H01L 27/15* (2006.01)
(Continued)

(52) U.S. Cl.
CPC ........ *H01L 27/156* (2013.01); *H01L 33/0075* (2013.01); *H01L 33/24* (2013.01);
(Continued)

(58) Field of Classification Search
CPC ... H01L 27/156; H01L 33/32; H01L 33/0075; H01L 33/24; H01L 33/502; H01L 33/04
See application file for complete search history.

(56) References Cited

U.S. PATENT DOCUMENTS 8,969,890 B2    3/2015  Balkenende et al.
9,054,233 B2    6/2015  Ohlsson et al.
(Continued)

FOREIGN PATENT DOCUMENTS

JP    2007-116097 A    5/2007
KR    10-0857410 B1    9/2008
WO    WO 2016/025325 A1    2/2016

OTHER PUBLICATIONS

International Search Report and Written Opinion, International Application No. PCT/US2014/041308, dated Oct. 1, 2014.
(Continued)

*Primary Examiner* — David Vu
(74) *Attorney, Agent, or Firm* — The Marbury Law Group PLLC

(57) ABSTRACT

A direct view multicolor light emitting device includes blue, green and red light emitting diodes (LEDs) in each pixel. The different light emitting diodes can be formed by depositing different types of active region layers in a stack such that deposition area of each subsequent active region is less than the deposition area of any preceding active region, and by patterning the active region layers into different types of stacks. The active region layers may be formed as planar layers, or may be formed on semiconductor nanowires. The active region layers can emit light at the respective target wavelength range. Alternatively, at least one of green and red phosphor materials, dye materials, or quantum dots may be used instead of or in addition to the active regions that emit light at a wavelength different from a target wavelength of a respective LED.

5 Claims, 38 Drawing Sheets

(51) Int. Cl.
    *H01L 33/00*    (2010.01)
    *H01L 33/32*    (2010.01)
    *H01L 33/04*    (2010.01)
    *H01L 33/50*    (2010.01)

(52) U.S. Cl.
    CPC .............. *H01L 33/32* (2013.01); *H01L 33/04* (2013.01); *H01L 33/502* (2013.01)

(56) References Cited

U.S. PATENT DOCUMENTS

| | | |
|---|---|---|
| 9,281,442 B2 | 3/2016 | Romano et al. |
| 9,620,559 B2 | 4/2017 | Schubert et al. |
| 2005/0082543 A1 | 4/2005 | Alizadeh et al. |
| 2005/0230693 A1 | 10/2005 | Chen |
| 2008/0149946 A1* | 6/2008 | Kim ............... H01L 33/007 257/89 |
| 2011/0309233 A1 | 12/2011 | Seo et al. |
| 2012/0135260 A1 | 5/2012 | Jang et al. |
| 2012/0223289 A1 | 9/2012 | Gwo et al. |
| 2015/0221814 A1 | 8/2015 | Ohlsson et al. |
| 2015/0325743 A1 | 11/2015 | Mi et al. |
| 2015/0382426 A1 | 12/2015 | Odnoblyudov et al. |
| 2016/0093665 A1 | 3/2016 | Schubert et al. |
| 2017/0062531 A1 | 3/2017 | Hack |

OTHER PUBLICATIONS

Neubert et al., "Investigations on Local Ga and In Incorporation of GaInN Quantum Wells on Facets of Selectively Grown GaN Stripes," Phys. Stat. Sol. (c), No. 6, May 2006, pp. 1587-1590.
Ueda et al., "Mechanisms of Metalorganic Vapor Phase Epitaxy of InGaN Quantum Wells on GaN Microfacet Structures," Phys. Stat. Sol. (c), No. 7, May 2007, pp. 2826-2829.
Funato et al., "Monolithic Polychromatic Light-Emitting Diodes Based on InGaN Microfacet Quantum Wells Toward Tailor-Made Solid-State Lighting," Applied Physics Express 1, Jan. 2008, 3pgs.
Hong et al., "Visible-Color-Tunable Light-Emitting Diodes," Advanced Materials, 2011, XX, pp. 1-5.
Birkel, A. et al., "Advanced Inorganic Materials for Solid State Lighting," Material Matters, vol. 7, No. 2, pp. 22-27, (view date Mar. 2016).
Setlur, A. A., "Phosphors for LED-Based Solid-State Lighting," The Electrochemical Society Interface, pp. 32-36, (Winter 2009).
U.S. Appl. No. 15/432,216, filed Feb. 14, 2017, GLO AB.
U.S. Appl. No. 15/464,641, filed Mar. 21, 2017, GLO AB.
U.S. Appl. No. 15/597,654, filed May 17, 2017, GLO AB.
International Search Report and Written Opinion of the International Searching Authority for PCT/US2017/030758, dated Aug. 8, 2017, 14 pages.

* cited by examiner

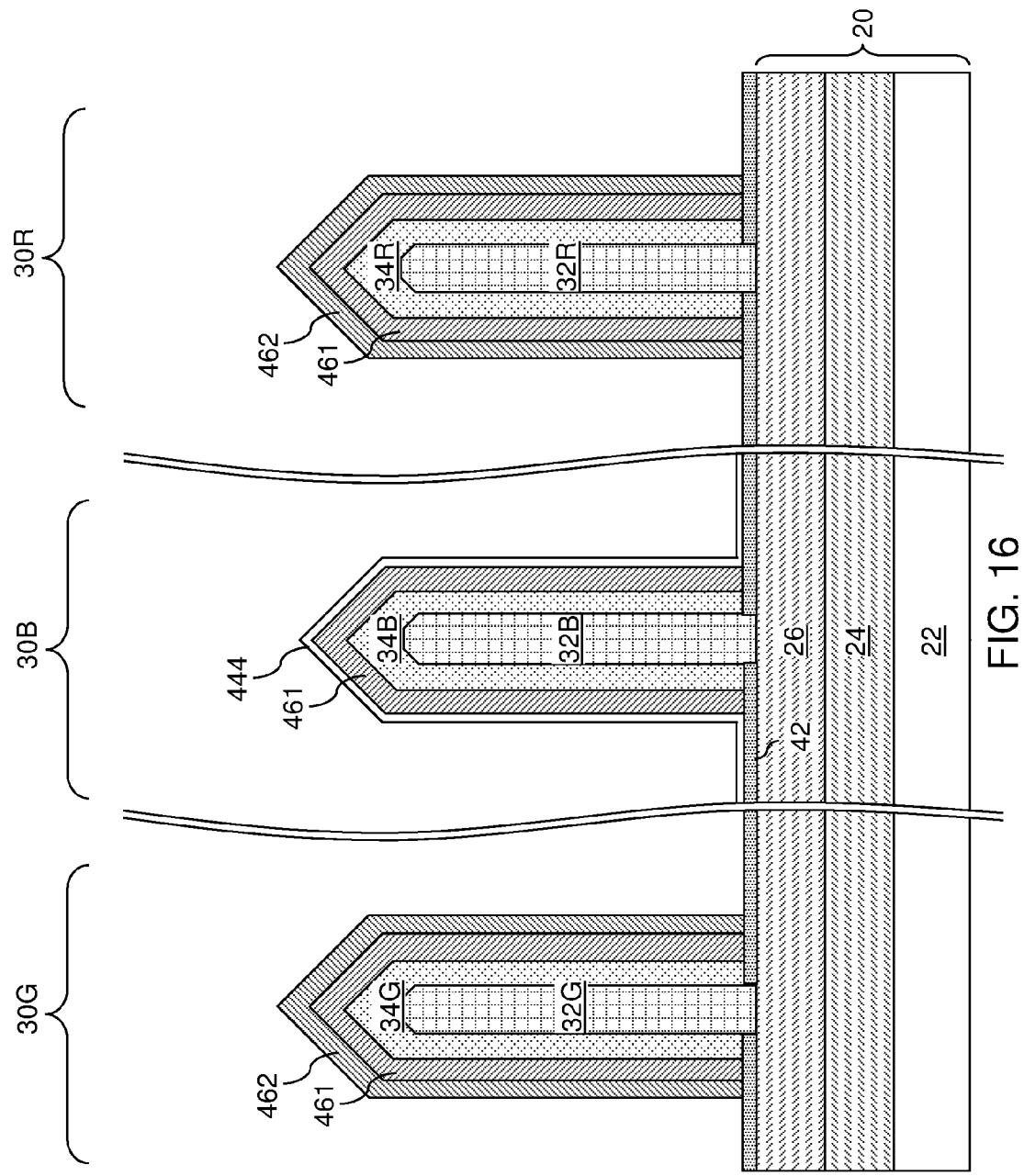

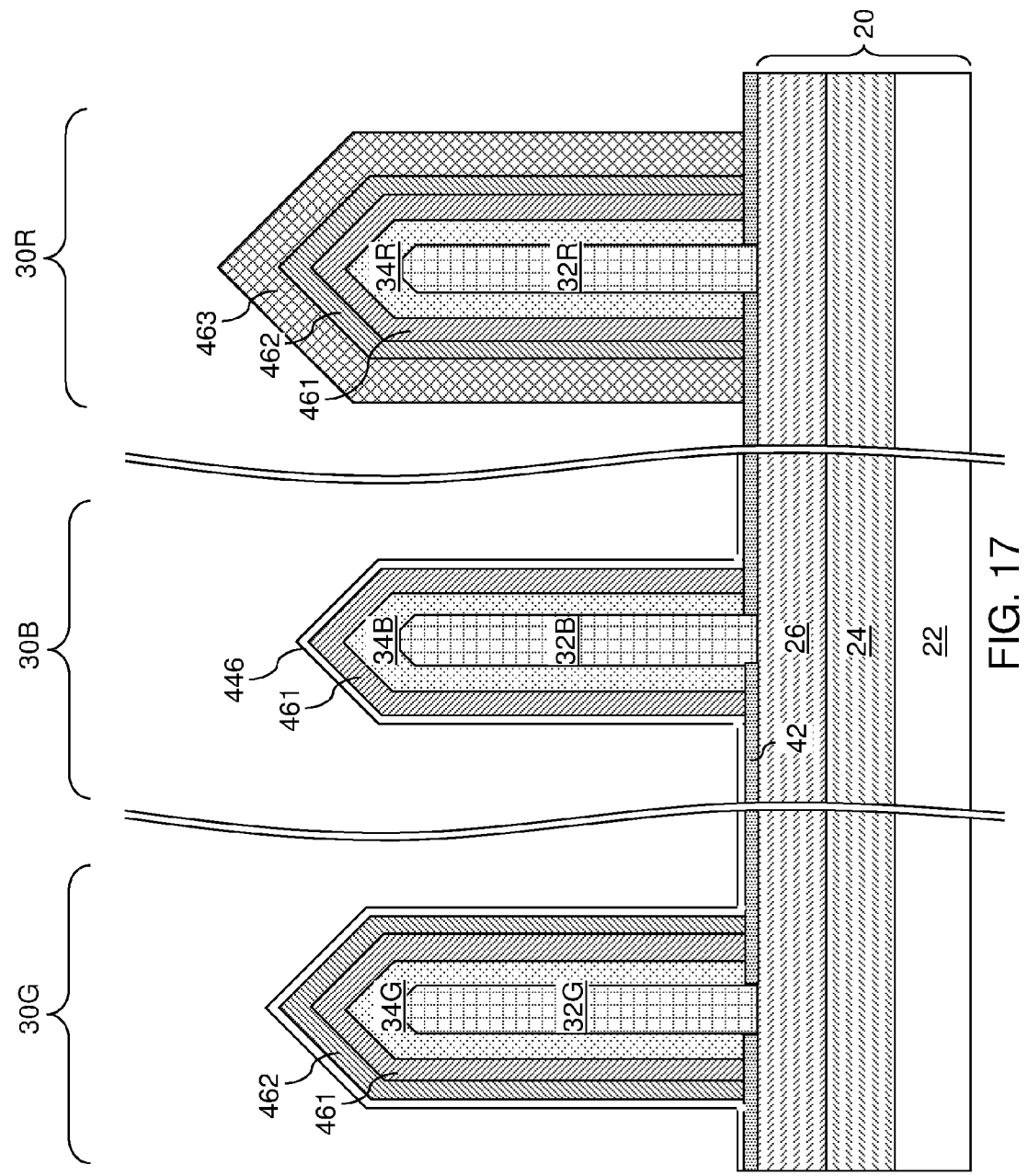

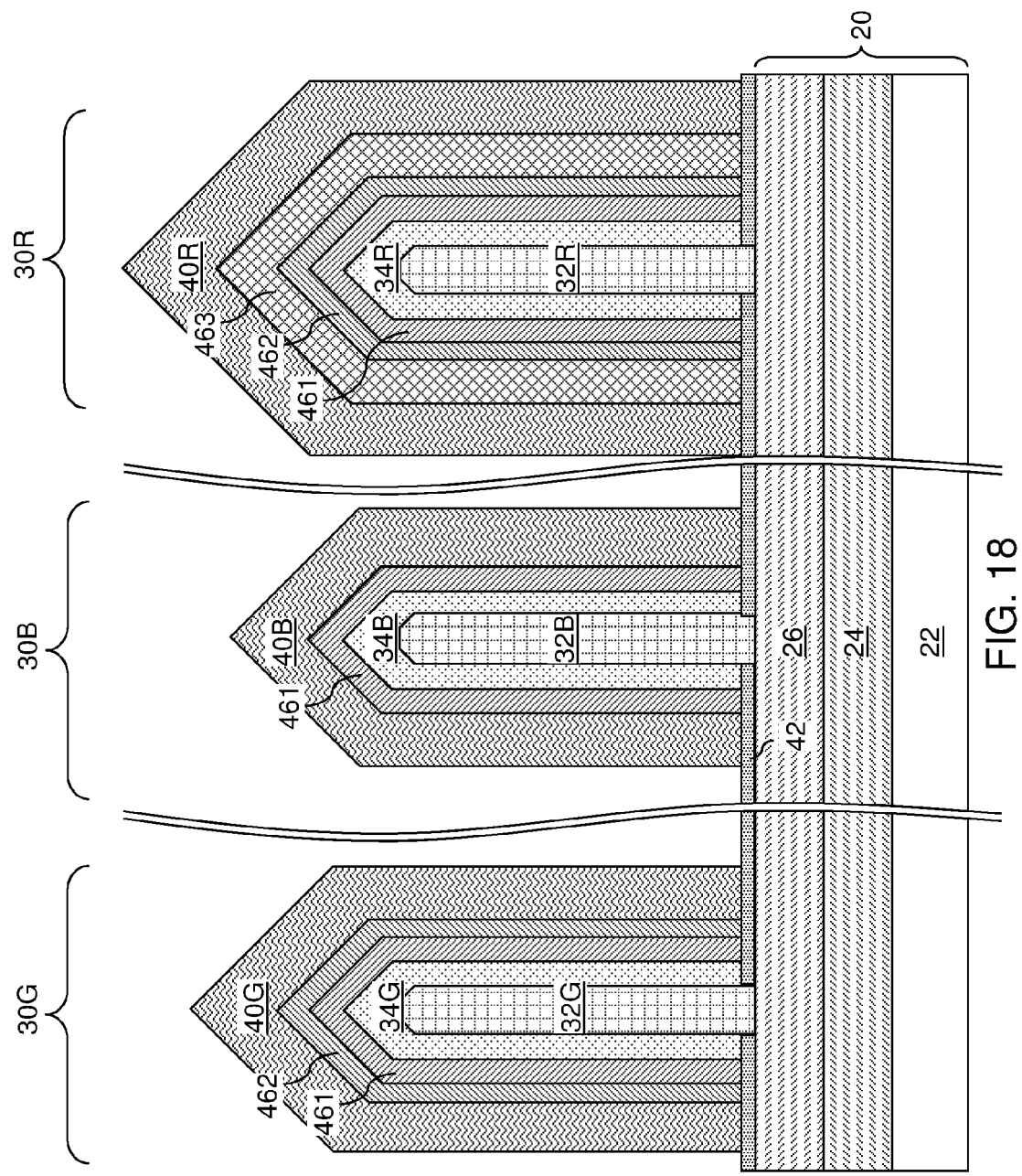

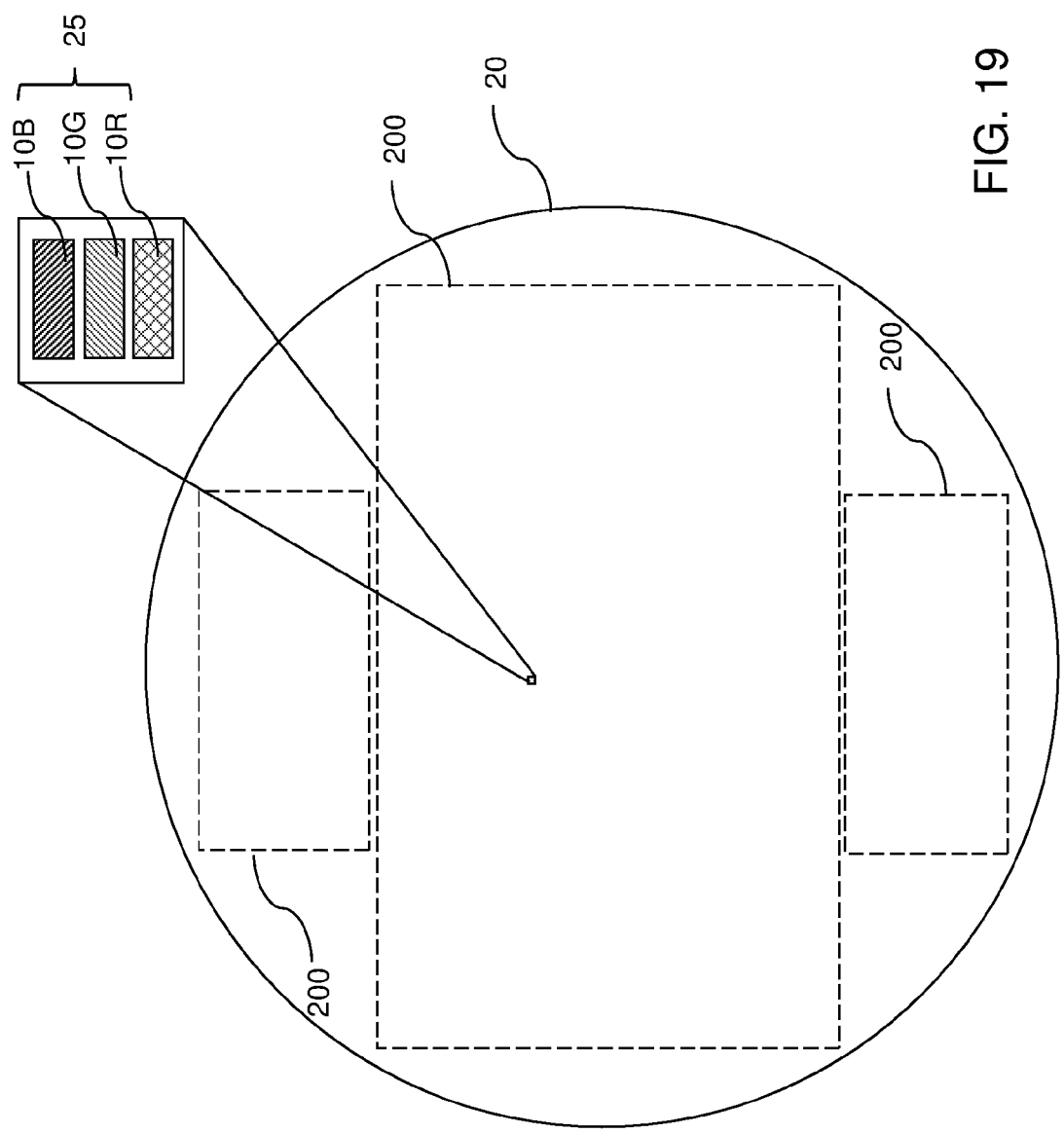

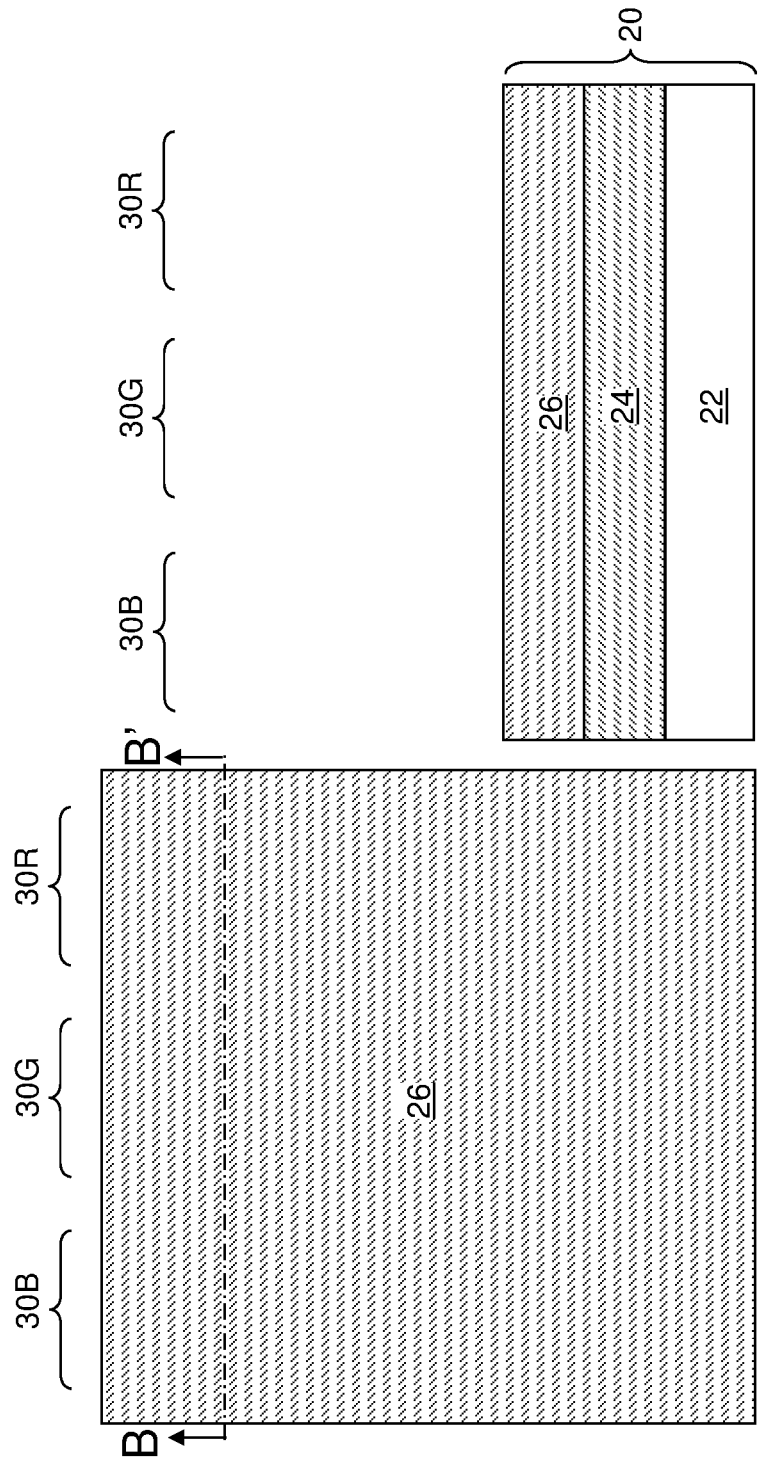

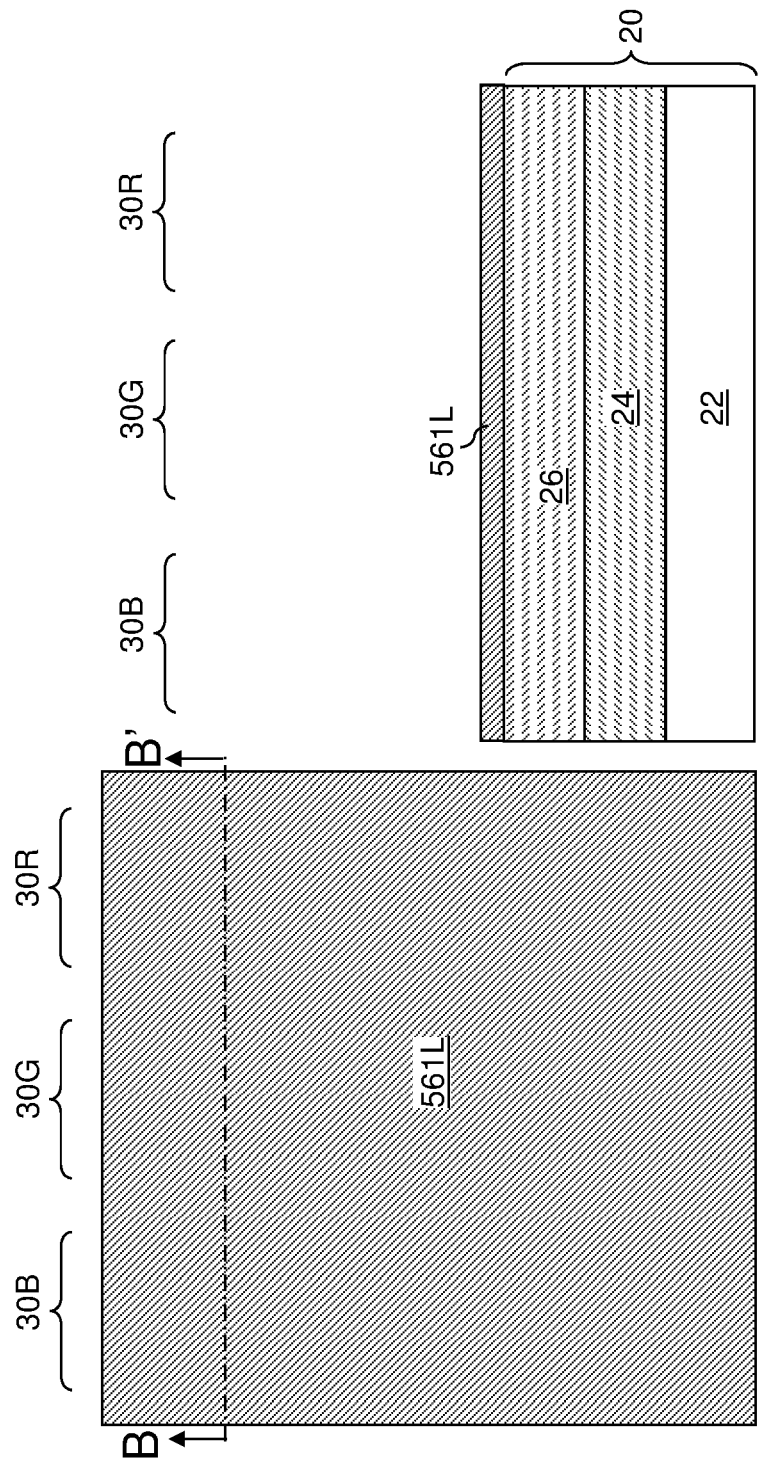

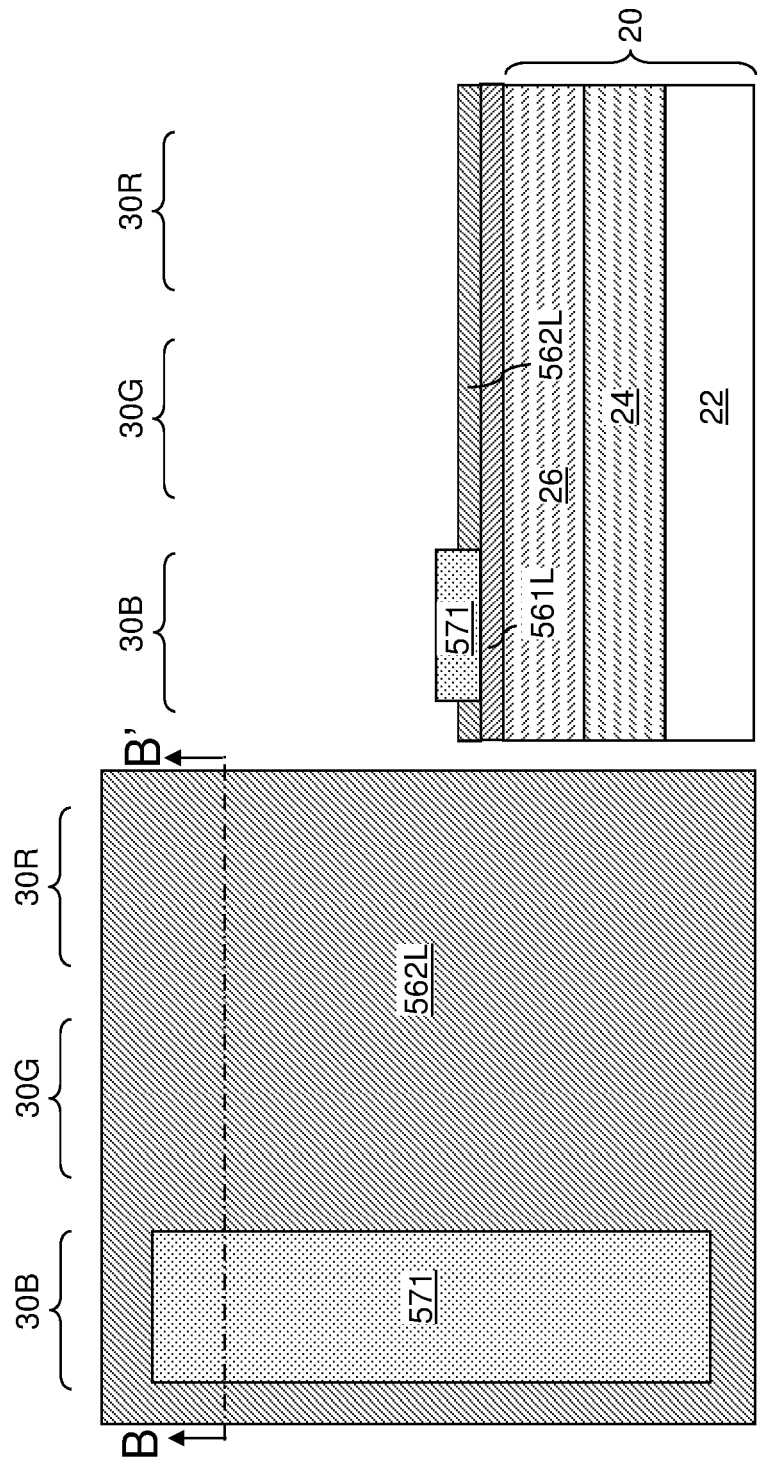

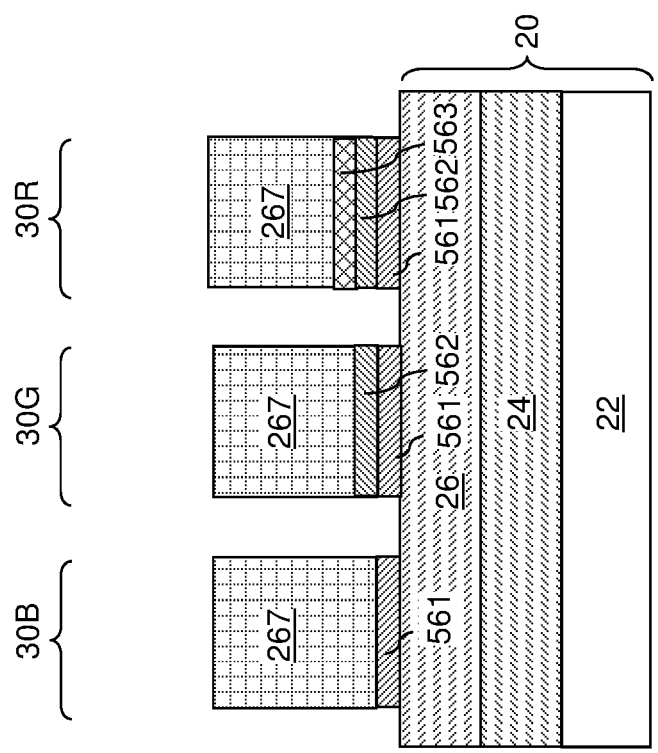

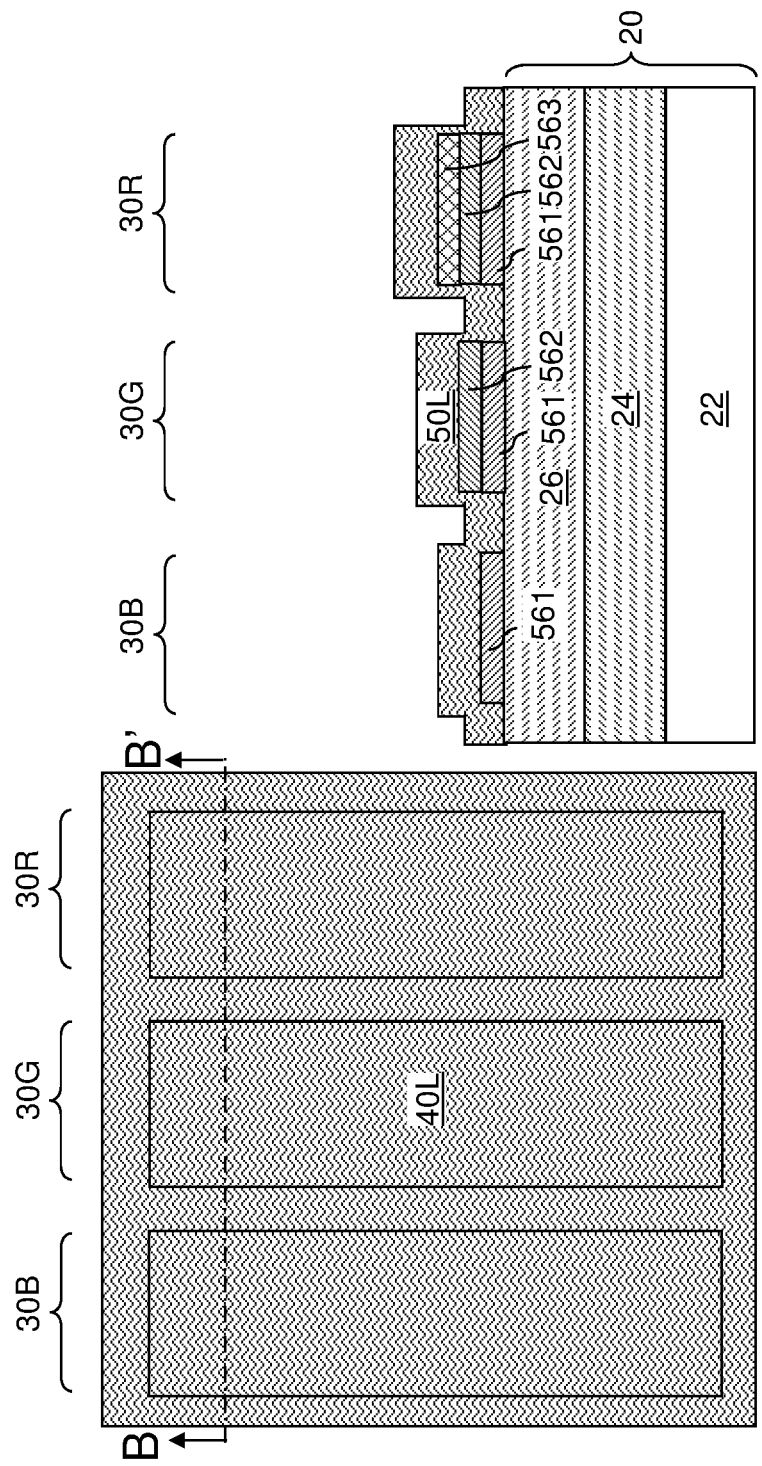

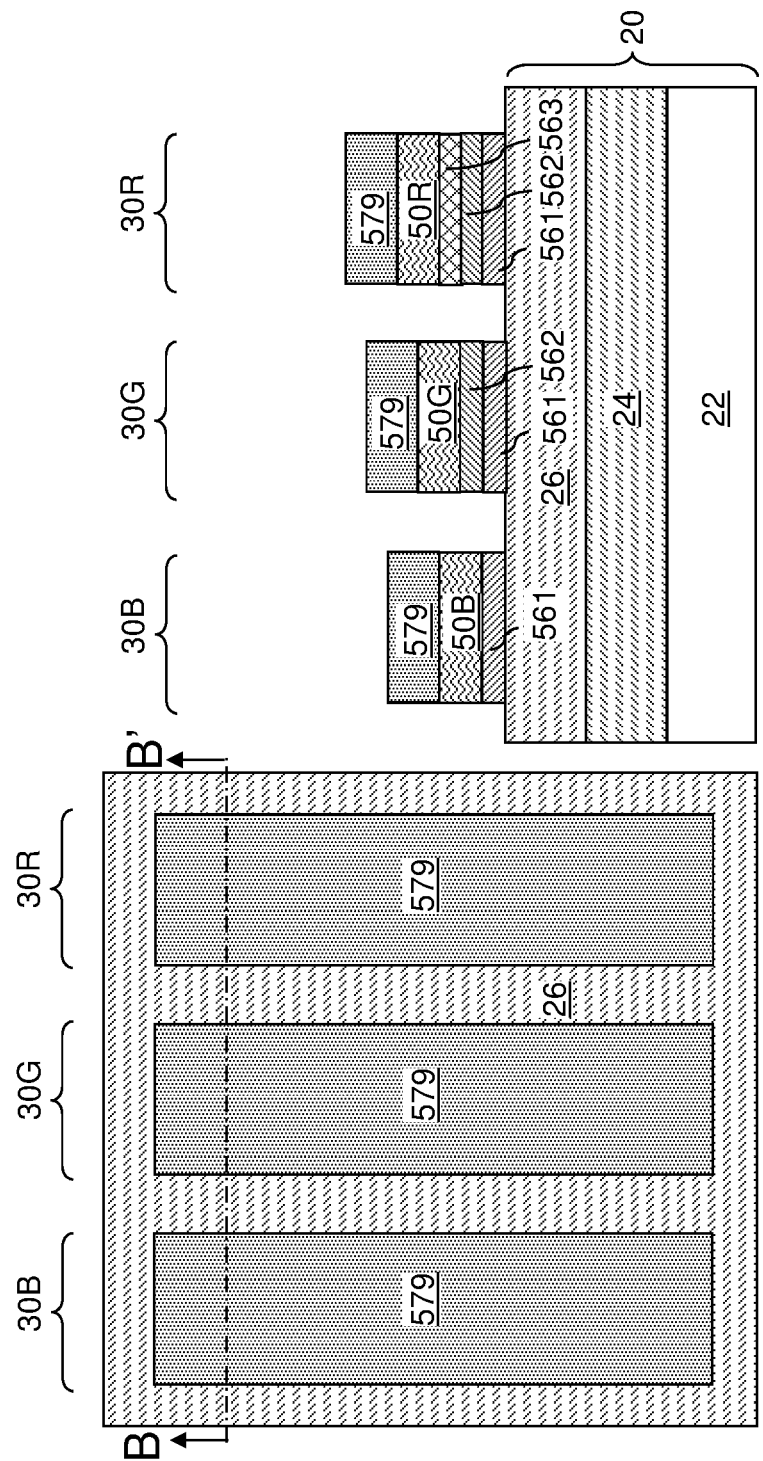

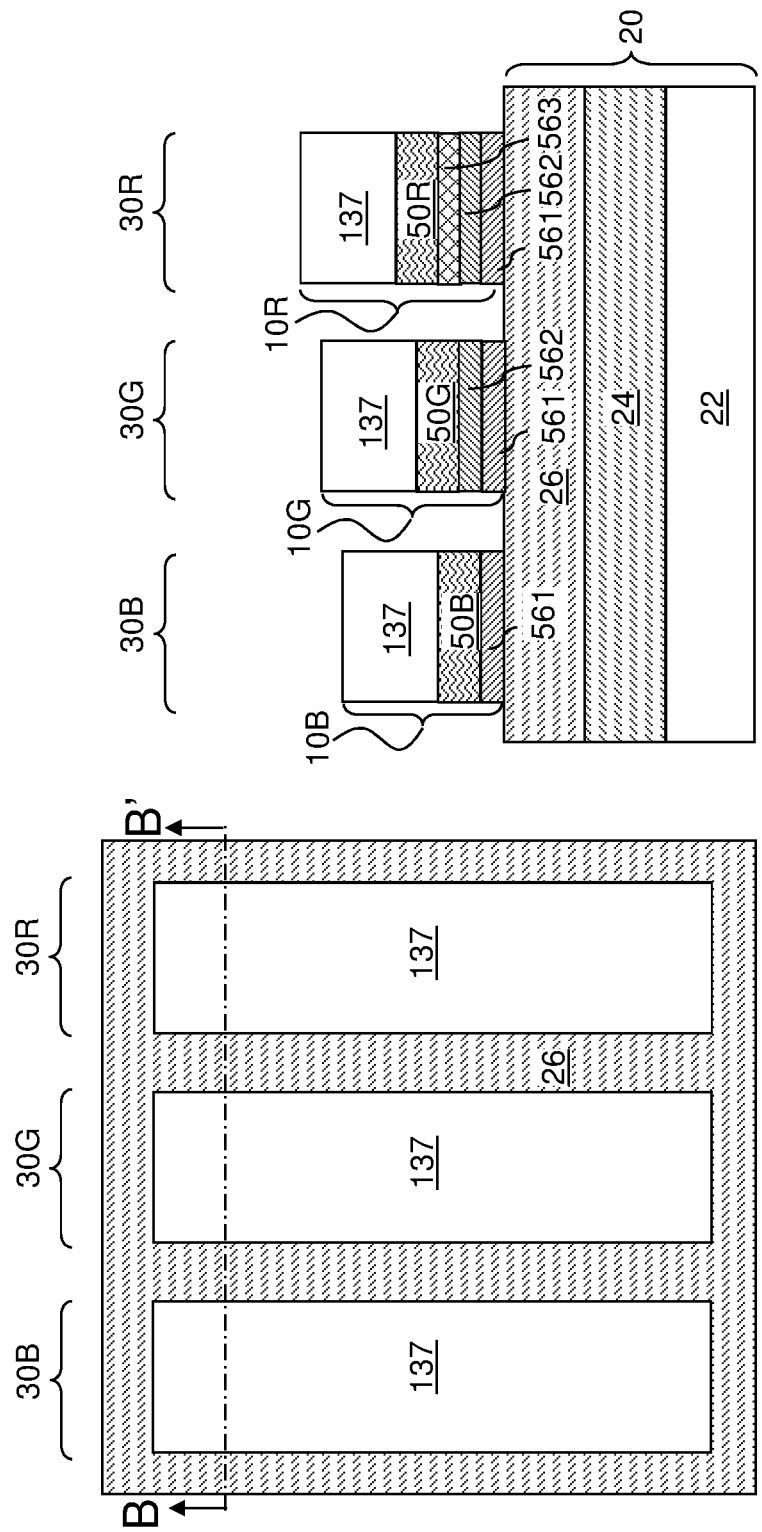

MONOLITHIC MULTICOLOR DIRECT VIEW DISPLAY CONTAINING DIFFERENT COLOR LEDS AND METHOD OF MAKING THEREOF

RELATED APPLICATIONS

This application claims the benefit of priority from U.S. Provisional Application Ser. Nos. 62/331,859 filed on May 4, 2016 and 62/464,504 filed on Feb. 28, 2017, the entire contents of which are incorporated herein by reference.

FIELD

The present invention relates to monolithic multicolor display devices, and particularly to monolithic multicolor direct view display devices containing different color LEDs and methods of fabricating the same.

BACKGROUND

For light emitting devices, such as light emitting diodes (LED), the emission wavelength is determined by the band gap of the active region of the LED together with thickness determined confinement effects. Often the active region includes one or more bulk semiconductor layers or quantum wells (QWs). For III-nitride based LED devices, such as GaN based devices, the active region (e.g., bulk semiconductor layer or QW well layer) material is preferably ternary, such as $In_xGa_{1-x}N$, where $0<x<1$.

The band gap of such III-nitride is dependent on the amount of In incorporated in the active region. Higher indium incorporation will yield a smaller band gap and thus longer wavelength of the emitted light. As used herein, the term "wavelength" refers to the peak emission wavelength of the LED. It should be understood that a typical emission spectra of a semiconductor LED is a narrow band of wavelength centered around the peak wavelength.

Multi-color LED arrays in the prior art suffer from several drawbacks. Some multi-color LEDs form nanowire LEDs which emit different color light (i.e., different wavelength) from different portions of the same nanowire, which makes it difficult to control and selectively activate the different emission wavelengths from the same nanowire LED.

SUMMARY

According to an aspect of the present disclosure, a light emitting device is provided, which comprises a plurality of light emitting diodes located on the substrate. The plurality of light emitting diodes comprises: a first light emitting diode that includes a first-type active region configured to emit light at a first peak wavelength; a second light emitting diode that includes a second-type active region configured to emit light at a second peak wavelength that is the same as or different than the first peak wavelength; and a third light emitting diode configured to emit light at a third peak wavelength that is greater than the first and second peak wavelength.

According to another aspect of the present disclosure, a method of forming a light emitting device is provided, which comprises the steps of: forming a first light emitting diode including a first-type active region configured to emit light at a first peak wavelength over a substrate; forming a second light emitting diode that includes a second-type active region configured to emit light at a second peak wavelength that is the same as or different than the first peak wavelength over the substrate; and forming a third light emitting diode configured to emit light at a third peak wavelength that is greater than the first and second peak wavelength.

According to an aspect of the present disclosure, a light emitting device comprises a first light emitting diode including a first stack containing a first-type active region, and configured to emit light at a first peak wavelength, a second light emitting diode including a second stack including the first-type active region and a second-type active region having a different composition than the first-type active region, and configured to emit light at a second wavelength that is different from the first wavelength, and a third light emitting diode including a third stack containing the first-type active region, the second-type active region and a third-type active region having a different composition from the first and second-type active regions, and configured to emit light at a third wavelength that is different from the first and second wavelengths.

According to an aspect of the present disclosure, a method of making a semiconductor device comprises steps of: forming a first semiconductor layer, forming a first masking layer on a first portion of the first semiconductor layer, forming a second semiconductor layer on a second portion of the first semiconductor layer exposed by the first masking layer, while the first masking layer is located on the first portion of the first semiconductor layer, forming a second masking layer on a first portion of the second semiconductor layer, forming a third semiconductor layer on a second portion of the second semiconductor layer exposed by the second masking layer, while the first masking layer is located on the first portion of the first semiconductor layer and the second masking layer is located on the first portion of the second semiconductor layer, forming a third masking layer on a first portion of the third semiconductor layer, while a second portion of the third semiconductor layer is exposed, and etching the first, second and third semiconductor layers to form first, second and third stacks.

According to an aspect of the present disclosure, a light emitting device comprises a plurality of light emitting diodes located on the substrate, wherein each of the plurality of light emitting diodes comprise a semiconductor nanowire of a first conductivity type, an active region surrounding a respective nanowire, and a semiconductor junction layer laterally surrounding a respective active region, the semiconductor junction layer having a doping of a second conductivity type that is the opposite of the first conductivity type. The plurality of light emitting diodes comprises a first light emitting diode that includes a first-type active region emitting light at a first peak wavelength, a second light emitting diode that includes a second-type active region emitting light at a second peak wavelength that is the same as or different than the first peak wavelength, and a third light emitting diode that includes a third-type active region and a light emitting structure located over the third-type active region. The light emitting structure emits light at a third peak wavelength that is greater than the first and second peak wavelength.

According to another aspect of the present disclosure, a method of forming a light emitting device array comprises providing a substrate including a semiconductor material layer, forming a patterned growth mask comprising a plurality of openings therethrough on a top surface of the substrate, forming a first semiconductor nanowire, a second semiconductor nanowire, and a third semiconductor nanowire through the patterned growth mask, each of the first, second, and third semiconductor nanowires extending through a respective opening in the patterned growth mask along a direction substantially perpendicular to the top surface of the substrate, forming a first-type active region, a first instance of a second-type active region, and a second instance of the second-type active region around the first, second, and third nanowires, respectively, and forming a first semiconductor junction layer, a second semiconductor junction layer, and a combination of a third semiconductor junction layer and a light emitting structure over the first-type active region, the first instance of the second-type active region, and the second instance of the second-type active region, respectively. The first-type active region is configured to emit light at a first peak wavelength, each instance of the second-type active region is configured to emit light at a second peak wavelength that is the same as or different than the first peak wavelength, and the light emitting structure is configured to emit light at a third peak wavelength that is greater than the first and the second peak wavelengths.

According to another aspect of the present disclosure, a method of making a semiconductor device comprises forming a first semiconductor layer, forming a first masking layer over a first portion of the first semiconductor layer, selectively growing a second semiconductor layer on a second portion of the first semiconductor layer exposed by the first masking layer but not on the first masking layer, forming a second masking layer over a first portion of the second semiconductor layer, and selectively growing a third semiconductor layer on a second portion of the second semiconductor layer exposed by the second masking layer and but not on the second masking layer.

According to another aspect of the present disclosure, a light emitting device comprises a plurality of blue light emitting nanowire light emitting diodes, a plurality of green light emitting nanowire light emitting diodes, and a plurality of red light emitting organic light emitting diodes.

BRIEF DESCRIPTION OF THE DRAWINGS

FIG. 16 is a vertical cross-sectional view of the third exemplary structure after formation of second-type active regions in the second and third light emitting regions according to an embodiment of the present disclosure.

FIG. 17 is a vertical cross-sectional view of the third exemplary structure after formation of a third-type active region in the third light emitting regions according to an embodiment of the present disclosure.

FIG. 18 is a vertical cross-sectional view of the third exemplary structure after formation of semiconductor junction layers according to an embodiment of the present disclosure.

FIG. 19 is a plan view of a substrate with light emitting diodes of multiple colors according to an embodiment of the present disclosure.

FIG. 20A is a plan view of a fourth exemplary structure after providing a substrate with a semiconductor material layer according to an embodiment of the present disclosure. FIG. 20B is a vertical cross-sectional view along the vertical plane B-B' of FIG. 20A.

FIG. 21A is a plan view of the fourth exemplary structure after formation of a first-type active region layer according to an embodiment of the present disclosure.

FIG. 21B is a vertical cross-sectional view along the vertical plane B-B' of FIG. 21A.

FIG. 22A is a plan view of the fourth exemplary structure after formation of a first masking layer and a second-type active region layer according to an embodiment of the present disclosure.

FIG. 22B is a vertical cross-sectional view along the vertical plane B-B' of FIG. 22A.

FIG. 26C-26G are sequential vertical cross-sectional views of an alternative embodiment of the fourth exemplary structure during formation of multiple types of active regions according to an embodiment of the present disclosure.

FIG. 27A is a plan view of the fourth exemplary structure after depositing a continuous semiconductor junction layer according to an embodiment of the present disclosure.

FIG. 27B is a vertical cross-sectional view along the vertical plane B-B' of FIG. 27A.

FIG. 28A is a plan view of the fourth exemplary structure after patterning the continuous semiconductor junction layer according to an embodiment of the present disclosure.

FIG. 28B is a vertical cross-sectional view along the vertical plane B-B' of FIG. 28A.

FIG. 29A is a plan view of the fourth exemplary structure after forming transparent conductive layers according to an embodiment of the present disclosure.

FIG. 29B is a vertical cross-sectional view along the vertical plane B-B' of FIG. 29A.

DETAILED DESCRIPTION

Figure 1:
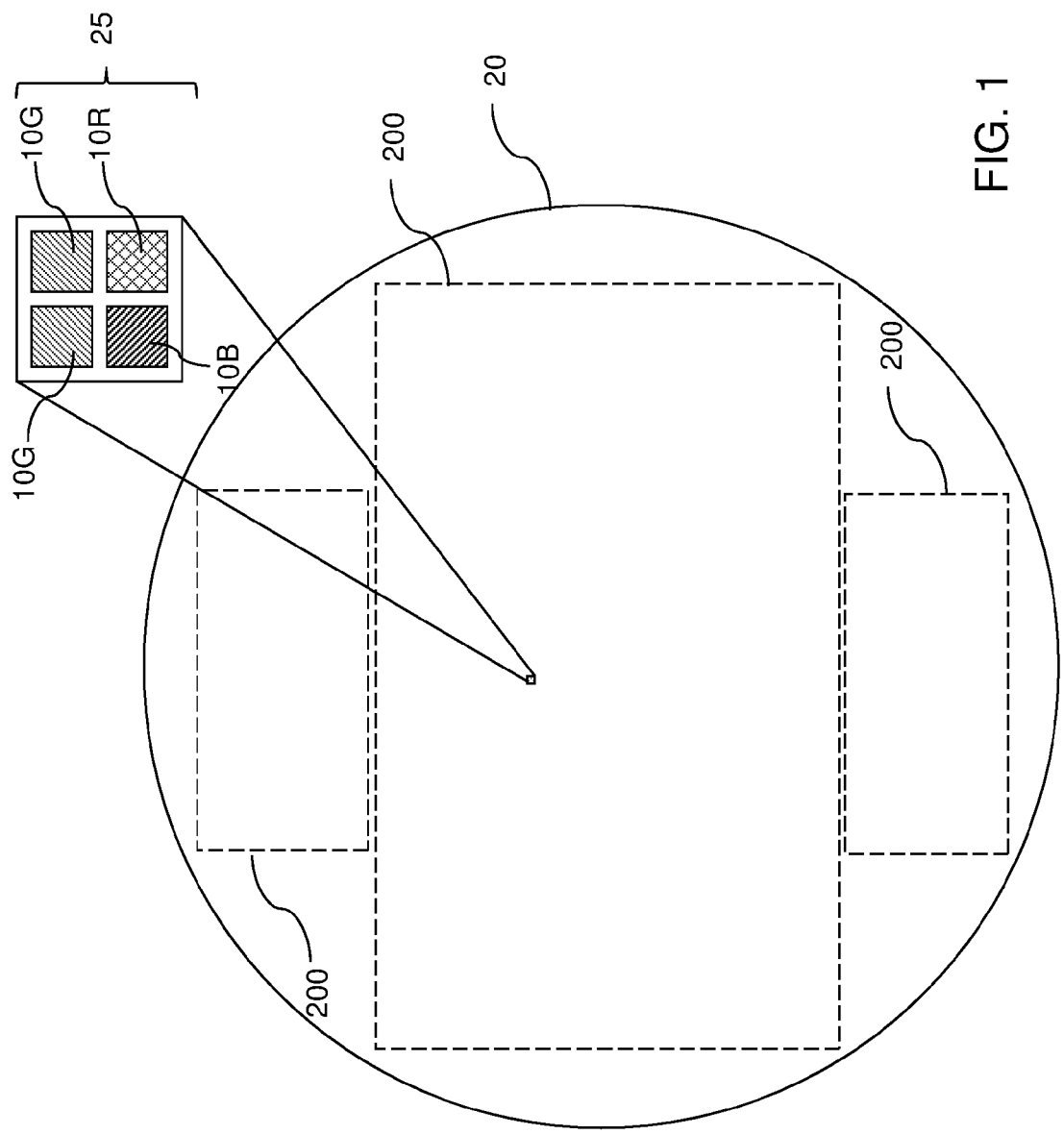
FIG. 1 is a plan view of a substrate with light emitting diodes of multiple colors according to an embodiment of the present disclosure.

As used herein, a "p-plane" means a "pyramid plane," which can by any of the $\{1\bar{1}01\}$ planes in the III-nitride system, a "c-plane" represents a $\{0001\}$ plane, and an "m-plane" represents any of the $\{10\bar{1}0\}$ planes. Growth rate means layer growth rate along the direction perpendicular to a growth surface when not otherwise specified.

Herein "kinetically limited growth regime" means a growth regime where growth rate predominantly is hindered by an energetic barrier (low temperature, cracking of source material, release of surface bonds etc.) to reach thermodynamic equilibrium. "Mass flow limited growth regime" means a growth regime where precipitation at the growth area is predominantly unhindered but growth rate is limited by concentration of source material at the growth area. "Group III limited growth regime" means a growth regime that is mass flow limited with regards to the column III element or elements while "group V limited growth regime" means a growth regime that is mass flow limited with regards to the column V element or elements.

Methods of forming light emitting diodes having different peak wavelengths on a single semiconductor substrate, i.e., without stacking multiple substrates over one another, is disclosed, for example, in U.S. Pat. No. 9,054,233 B2 to Ohlsson et al, which is incorporated herein by reference in its entirety. While such monolithic light emitting diodes employing a single semiconductor substrate provide significant advantage of eliminating die transfer processes during fabrication of a direct view display device, the process includes providing the peak emission wavelengths of three types of light emitting diodes for red, green, and blue emission spectra from each pixel based on three different geometrical features per pixel.

In the embodiments of the present disclosure, a method for fabrication of a multicolor (e.g., three or more color) direct view display may be performed by using less than 3 different geometrical features per pixel, such as two different geometric features per pixel or having all light emitting devices in each pixel with the same geometric features. In one embodiment, a red active region is formed over a blue or green active region in a nanowire light emitting diode (LED). In another embodiment, a down converting element (e.g., red emitting phosphor, dye or quantum dots) is formed over a blue or green light emitting LED. In another embodiment, a blue or green light emitting nanowire LED in each pixel is replaced with a regrown red emitting planar LED, such as an organic or inorganic red emitting planar LED.

A growth system is usually limited by a subset of these parameters in combination; i.e., a growth rate is often limited by source concentration even if a severe kinetic reaction barrier exists in the system. The relative weight of V to III limited growth rate is most easily adjusted by altering the total V/III-ratio. The relative weight of kinetical to mass flow limited growth rate is more complex, as it depends on the origin of the kinetical barrier. Usual parameters that change this are temperature, total pressure, total flow, carrier gas and V/III-ratio. It is also important to realize that in V/III growth where 50% of each element group is needed to proceed with precipitation, one group element can be kinetically limited while the other group elements are mass flow limited such that only one of the groups is causing the growth rate limitation. In traditional V/III growth, in MOVPE and similar growth methods, high quality material is often grown with a high overflow of V material, for example, in GaN using V/III source gas mass flow ratio of at least 1,000, such as 1,000 to 10,000. Under these conditions, the growth rate is group III limited while the group V concentration is high to keep a saturated overflow of V material to the growth surface. In contrast, in the group V limited growth mode, the V/III ratio is preferably less than 1,000, such as 0.001 to 100, for example less than 1, such as 0.001 to 0.1.

To determine the type of growth rate limitation at a certain growth condition is relatively straightforward and is done by changing the condition parameters and recording the change in growth rate (e.g., thickness measurements). Energy heights of kinetic barriers can be deduced by temperature dependent growth rate measurements.

Simultaneous growth of several color LEDs in one step would be of high commercial interest, not only for RGB (Red Green Blue), YB (Yellow Blue) or YGB (Yellow Green Blue) combinations for white rendition of light (i.e., white light emitting LED based on combination of RGB, YB or YGB peak wavelength emission) or direct view multi-color display where at least one LED emitted light color is viewed directly by a human observer, but also high efficiency GB (Green Blue) since viable green phosphors and green LEDs based on other material systems have been hard to realize. In view of the shortcomings of prior art devices, the present inventors have devised a selectively grown structure that can be used to form optoelectronic devices, e.g., LED arrays. As used herein, the term simultaneous growth in one step means that the corresponding layers or structures of different color emitting LEDs are grown in one step. Thus, for example, the nanostructure cores of different color emitting LEDs may be grown in the same first step, the active regions of different color emitting LEDs may be grown in the same second step and the junction forming elements or shells of different color emitting LEDs may be grown in the same third step.

Preferably but not necessarily, the arrays of semiconductor LED elements include nanostructured (e.g., nanowire or nanopyramid) cores, herein referred to as templates, surrounded by shells comprising active region and volume element shells. Such nanostructure LEDs may be considered as "point sources" of light or UV radiation, which are different from the prior art LED structures comprising elongated stripes or planar bulk semiconductor layers. The templates may comprise a single grown layer, such as a nanowire core, but also be formed from multiple layers as will be described below. Alternatively, the array of semiconductor LED elements may include planar monolithic light-emitting layer stacks including laterally-extending layers having respective uniform thicknesses.

In some of the following embodiments, the group V limited conditions/regimes are exemplified in a nanowire core growth step through an opening in a mask. However, any other suitable growth regime where the group V limitation is achieved with sufficiently good quality material as product, can be utilized, such as VLS growth or other selective growth methods. Thus, the selective nanowire growth as the group V limited growth step is therefore used to merely exemplify rather than limit the invention.

FIG. 1 illustrates the concept of direct view display devices 200 that can be formed on a substrate 20. As used herein, a direct view display device 200 is a display device in which each pixel 25 includes at least one light source that generates light from within upon application of a suitable electrical bias. The at least one light source can be a plurality of light emitting diodes that provide light emission at different wavelengths, such as red light, blue light, and green light. An array of pixels 25 can be fabricated directly on the substrate 20 by semiconductor fabrication methods without employing bonding of an additional substrate or transfer of dies such as light emitting diode dies. Thus, the manufacturing process includes only deposition processes, etch processes, lithographic patterning processes, and optional planarization processes (such as chemical mechanical planarization or a recess etch), and does not include any bonding of another substrate or transfer of dies fabricated on another substrate.

One or more direct view display devices 200 can be fabricated on the substrate 20. Each direct view display device 200 includes an array of pixels 25. Each pixel can include light emitting diodes that emit light at different wavelengths. For example, each pixel 25 can include at least one first-type light emitting diode 10G (such as at least one green-light-emitting diode, for example two green-light-emitting diodes) that emits light at a first peak wavelength (such as a peak wavelength in a range from 495 nm to 570 nm), at least one second-type light emitting diode 10B (such as at least one blue-light-emitting diode) that emits light at a second peak wavelength (such as a peak wavelength in a range from 400 nm to 495 nm), and at least one third-type light emitting diode 10R (such as at least one red-light-emitting diode 10R) that emits light at a third peak wavelength (such as a peak wavelength in a range from 600 nm to 700 nm). The number of each type of light emitting diodes within a pixel 25 can be selected to provide a suitable level of illumination per pixel. For example, plural nanowire LEDs which emit green, blue and red light are formed in each respective green, blue and red light emitting areas of the pixel 25. Optionally, one of the sites in the pixel 25 (e.g., the site of one of the green-emitting LEDs 10G) may be left vacant as a repair site for later attaching a repair LED device to compensate for a defective or non-functioning LED device 10G, 10B or 10R in a particular pixel 25. A vacant site may be employed for one or more additional functionalities for a display device such as touch recognition through use of an infrared photodiode.

Upon completion of fabrication of the pixels, each including light emitting diodes of at least two (such as three, and optionally four) types of light emitting diodes (10G, 10B, 10R), the substrate 20 can be diced to provide the at least one direct view display device 200. As such, each direct view display device includes an array of monolithic multicolor pixels. As used herein, a "multicolor" pixel refers to a pixel that can emit light of different peak wavelengths depending on application of electrical bias, and thus, inherently capable of displaying multiple colors. As used herein, "monolithic" multicolor pixels refer to multicolor pixels that are formed directly on the same substrate. In case a plurality of direct view display devices 200 is manufactured on a single substrate 20, the direct view display devices 200 may be of the same size and/or type, or may of different sizes and/or types. The direct view display devices 200 may diced from the growth substrate 20 and attached to a backplane containing various electrodes and electrical contacts. Alternatively, one or more pixels may be separately diced from the substrate 20 and attached to the backplane.

Figure 2:
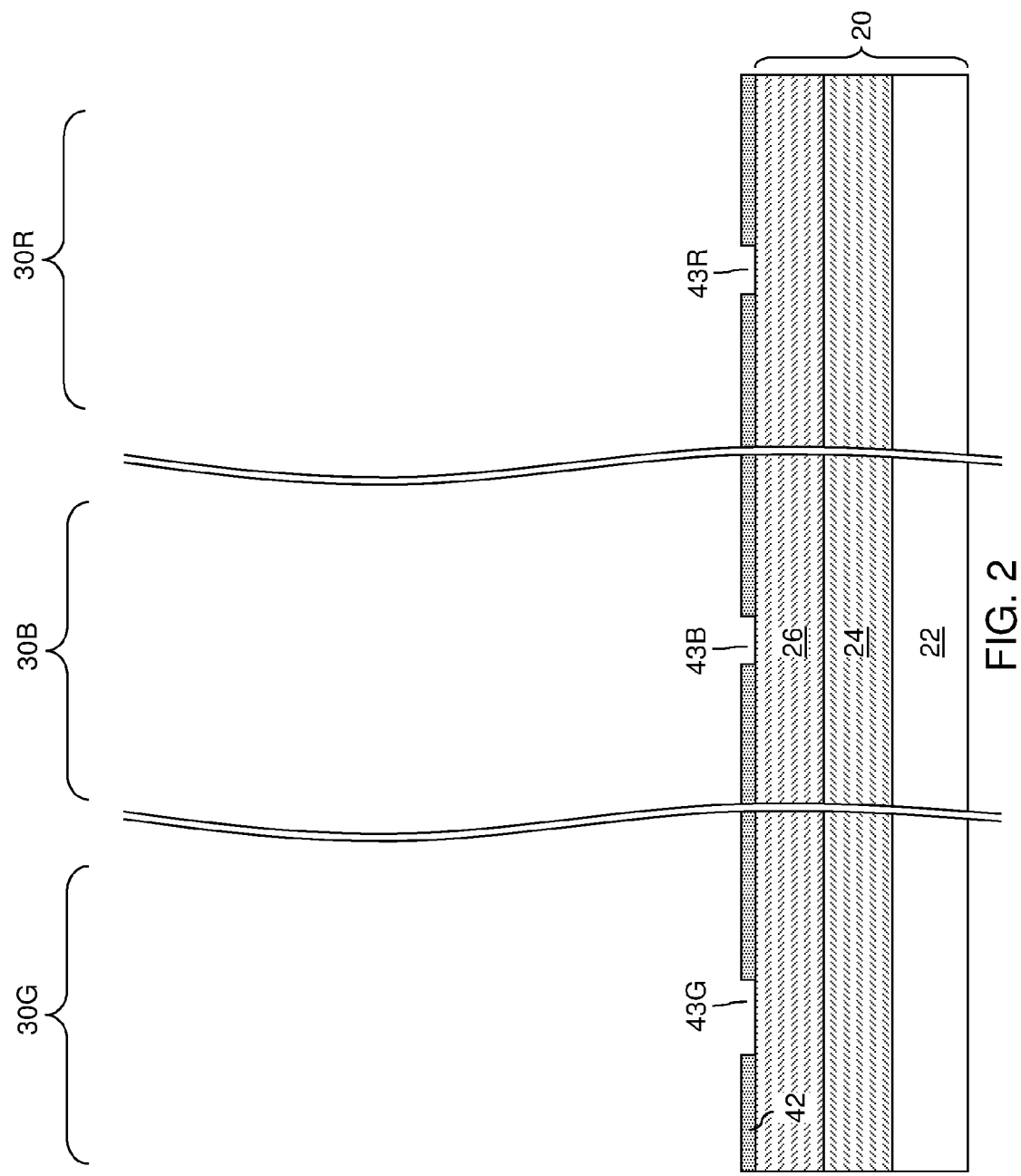
FIG. 2 is a vertical cross-sectional view of a first exemplary structure for forming a monolithic multicolor pixel after forming a patterned growth mask according to an embodiment of the present disclosure.

Referring to FIG. 2, a first exemplary structure is illustrated, which is an in-process structure for fabricating monolithic multicolor pixels on the substrate 20. As used herein, an "in-process" structure refers to a structure that is subsequently modified to make a final structure. A substrate 20 is provided, which can be a growth substrate including a handle substrate 22 (such as a sapphire substrate), a buffer semiconductor layer 24 (such as a GaN layer, an AlN layer, an AlGaN layer, graded variants thereof, or a stack thereof), and a base semiconductor layer 26 (such as an n-doped GaN layer). The base semiconductor layer 26 is a semiconductor material layer that includes a doped semiconductor material that functions as one node of each light emitting diode to be subsequently formed. The buffer semiconductor layer 24 and the base semiconductor layer 26 can be formed by an epitaxial deposition process so that each of the buffer semiconductor layer 24 and the base semiconductor layer 26 includes a single crystalline semiconductor material that is epitaxially aligned to the single crystalline structure of the handle substrate 22 (which can include a single crystalline sapphire ($Al_2O_3$) substrate). The base semiconductor layer 26 can have a doping of a first conductivity type, which may be p-type or n-type. In an illustrative example, the base semiconductor layer 26 can include n-doped GaN.

A growth mask 42 is subsequently formed on the top surface of the base semiconductor layer 26. The growth mask 42 may include a dielectric material or a metallic material. If a dielectric material is employed for the growth mask 42, silicon nitride or silicon oxide can be deposited, for example, by chemical vapor deposition and can be subsequently patterned lithographically. If a metallic material is employed, a refractory metal such as titanium may be deposited for the growth mask 42, and can be subsequently patterned lithographically. The thickness of the growth mask 42 can be in a range from 10 nm to 500 nm, although lesser and greater thicknesses can also be employed.

Openings 43G, 43B and 43R are formed through the growth mask 42, for example, by application and patterning of a photoresist layer (not shown) and a subsequent etch process that etches physically exposed portions of the growth mask 42 employing the patterned photoresist layer as an etch mask. The photoresist layer can be subsequently removed, for example, by ashing. The openings may be circular, elliptical, or polygonal. The maximum lateral dimensions of the openings can be selected differently across various light emitting regions, which may include a first light emitting region 30G (which may be a green light emitting region), a second light emitting region 30B (which may be a blue light emitting region), and/or a third light emitting region 30R (which may be a red light emitting region). For example, each opening 43G in the first light emitting region 30G can have a first maximum lateral dimension (such as the diameter of a circular opening or a diameter of a circumscribing circle of a regular polygon having an even number of vertices), each opening 43B in the second light emitting region 30B can have a second maximum lateral dimension, and each opening 43R in the third light emitting region 30R can have a third maximum lateral dimension. The second maximum lateral dimension can be less than the first maximum lateral dimension and the third maximum lateral dimension can be less than or equal to the first maximum lateral dimension. The third maximum lateral dimension may be the same as, or less than, or greater than the second maximum lateral dimension. In an illustrative example shown in FIG. 2, the first maximum lateral dimension may be in a range from 200 nm to 2 microns, and the second and third maximum lateral dimensions may be in a range from 50 nm to 500 nm, although lesser and greater maximum lateral dimensions can be employed for each. Alternatively, the first and third maximum lateral dimensions may be in a range from 200 nm to 2 microns, and the second maximum lateral dimension may be in a range from 50 nm to 500 nm.

While one opening 43G, 43B and 43R is shown in each respective region 30G, 30B and 30R for clarity, it should be understood that each region 30G, 30B and 30R may have a plurality of respective openings 43G, 43B and 43R located therein to form an array of nanowire LEDs 10G, 10B and 10R in each respective region 30G, 30B and 30R. The spacing between respective openings 43G, 43B and 43R and/or the size (e.g., diameter or width) of the respective openings 43G, 43B and 43R may be different in each respective region. For example, the spacing between openings 43G in region 30G may be greater than the spacing between openings 43B in region 30B. The spacing between openings 43R in region 30R may be the same as the spacing between openings 43B in region 30B, or the same as the spacing between openings 43G in region 30G, or different than the spacing between openings 43G and 43B in respective regions 30G and 30B. In another embodiment, the size of openings 43G in region 30G may be greater than the size of openings 43B in region 30B. The size of openings 43R in region 30R may be the same as the size of openings 43B in region 30B (as shown in FIG. 2), or the same as the size of openings 43G in region 30G, or different than the size of openings 43G and 43B in respective regions 30G and 30B. In another embodiment, both the spacing between the openings and the size of openings may be varied as described above.

Alternatively, the above opening spacing and size variation of the openings across the various light emitting regions (30G, 30B, 30R) may be described in terms of the amount of exposed base semiconductor layer 26 exposed through the openings in each region. For example, the ratio of the physically exposed areas of the base semiconductor layer 26 in the first light emitting region 30G to the total area of the first light emitting region 30G is greater than the ratio of the physically exposed areas of the base semiconductor layer 26 in the second light emitting region 30B to the total area of the second light emitting region 30B, and is greater than, less than or the same as the ratio of the physically exposed areas of the base semiconductor layer 26 in the third light emitting region 30R to the total area of the third light emitting region 30R. The ratio of the physically exposed areas of the base semiconductor layer 26 in the second light emitting region 30B to the total area of the second light emitting region 30B may be the same as, or may be greater than or less than, the ratio of the physically exposed areas of the base semiconductor layer 26 in the third light emitting region 30R to the total area of the third light emitting region 30R.

Figure 3:
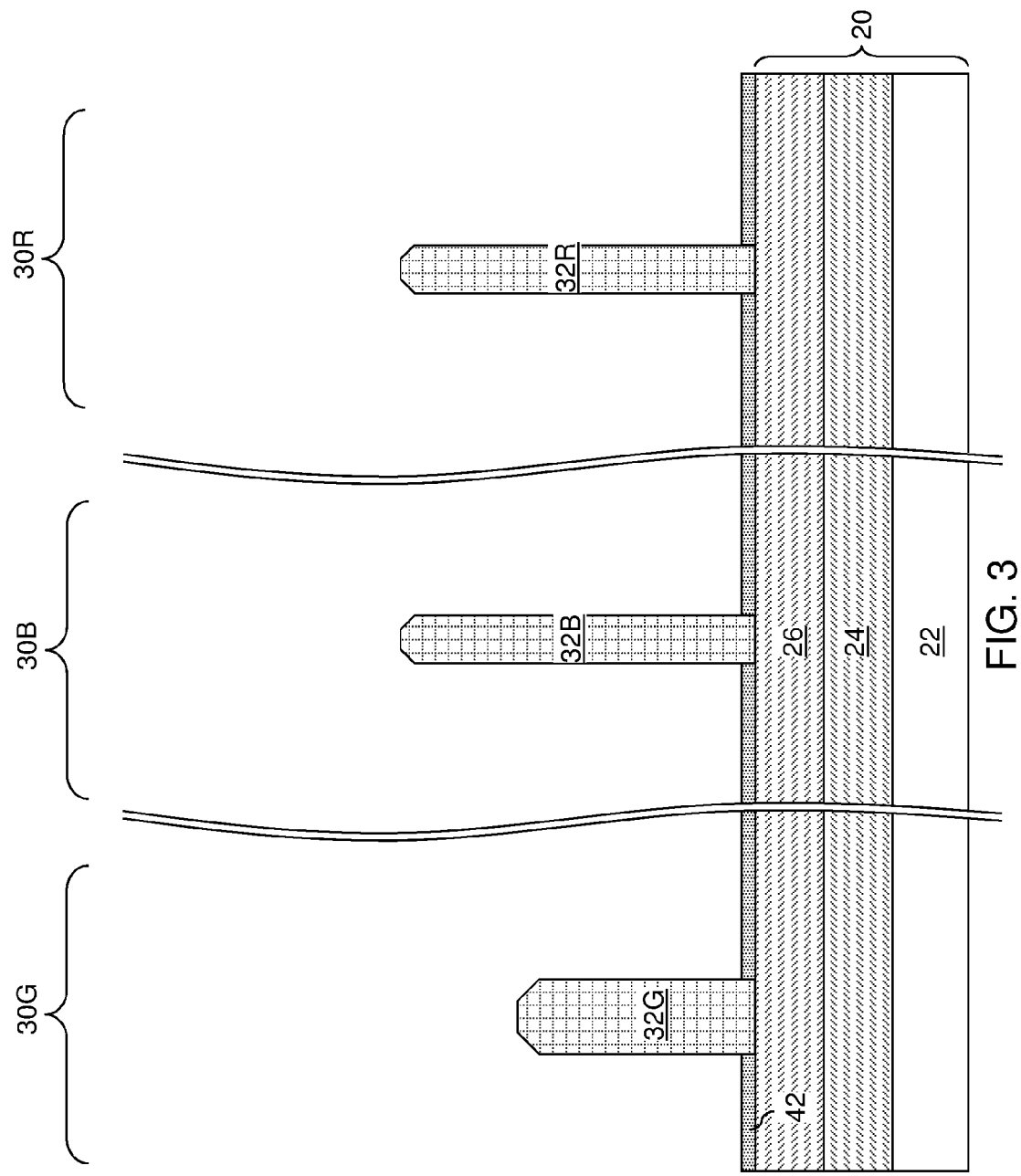
FIG. 3 is a vertical cross-sectional view of the first exemplary structure after forming semiconductor nanowires according to an embodiment of the present disclosure.

Referring to FIG. 3, at least one first semiconductor nanowire 32G, at least one second semiconductor nanowire 32B, and at least one third semiconductor nanowire 32R can be grown through the openings 32G, 32B and 32R in the patterned growth mask 42 by a selective epitaxy process. Each of the first, second, and third semiconductor nanowires (32G, 32B, 32R) extends through a respective opening in the patterned growth mask 42 along a direction substantially perpendicular to the top surface of the substrate 20. The semiconductor nanowires (32G, 32B, 32R) can be grown from the physically exposed surfaces of the base semiconductor layer 26 by a selective epitaxy process under process conditions that provide epitaxial growth of a single crystalline doped semiconductor material having a doping of the first conductivity type (such as n-doped GaN) along the direction perpendicular to the c-plane. The c-plane can be parallel to the top surface of the base semiconductor layer 26. Growth of the semiconductor nanowires (32G, 32B, 32R) can be performed by a selective semiconductor deposition process that grows a single crystalline semiconductor material from physically exposed semiconductor surfaces primarily along the c-direction, i.e., the direction perpendicular to the c-plane, while not growing any semiconductor material from surfaces of the growth mask 42. In one embodiment, a plurality of nanowires 32G, 32B and 32R are grown in each respective region 30G, 32B and 32R.

In one example, the growth of the semiconductor nanowires (32G, 32B, 32R) can be performed in a Group III limited (e.g., mass flow limited) MOCVD growth regime. The larger size of opening 43G compared to the size of the openings 43B and 43R causes the height of each first semiconductor nanowire 32G in the first light emitting region 30G to be less than the height of each second semiconductor nanowire 32B in the second light emitting region 30B, and to be less than the height of each third semiconductor nanowire 32R in the third light emitting region 30R, as shown in FIG. 3. For example, methods described in U.S. Pat. No. 9,054,233 B2, incorporated herein by reference in its entirety, may be employed to form semiconductor nanowires having different heights. In an alternative embodiment, if the size of the openings 43R is the same as the size of openings 43G, then the height of each second semiconductor nanowire 32B in the second light emitting region 30B may be higher than the height of each first and third nanowires 32G, 32R in the respective regions 30G, 30R.

In one embodiment, the various dimension of the openings in the growth mask 42 and the final heights of the semiconductor nanowires (32G, 32B, 32R) can be selected such that the height of the second semiconductor nanowires 32B is greater than the height of the first semiconductor nanowires 32G. The height of the third semiconductor nanowires 32R may be the same as, greater than or less than the height of the first semiconductor nanowires 32G and the height of the third semiconductor nanowires 32R may be the same as, greater than or less than the height of the second semiconductor nanowires 32B. For example, the height of nanowires 32R is the same as that of nanowires 32B. In an alternative embodiment, the height of all nanowires (32G, 32B, 32R) may be the same if the size of the openings 43G, 43B and 43R is the same.

As used herein, the aspect ratio of each semiconductor nanowire (32G, 32B, 32R) is defined as the final height of the semiconductor nanowire to the maximum lateral dimension at the base of the semiconductor nanowire, which may be the same as, or greater than, the maximum lateral dimension of the respective opening through the growth mask 42. In one embodiment, the aspect ratio of the second semiconductor nanowires 32B can be greater than the aspect ratio of the first semiconductor nanowires 32G by a factor in a range from 1.5 to 10 (such as from 2 to 5), although lesser and greater factors can also be employed. Likewise, the aspect ratio of the third semiconductor nanowires 32R can be greater than the aspect ratio of the first semiconductor nanowires 32G by a factor in a range from 1.5 to 10 (such as from 2 to 5). In an alternative embodiment, the aspect ratios of all nanowires 32G, 32B and 32R may be the same.

Figure 4:
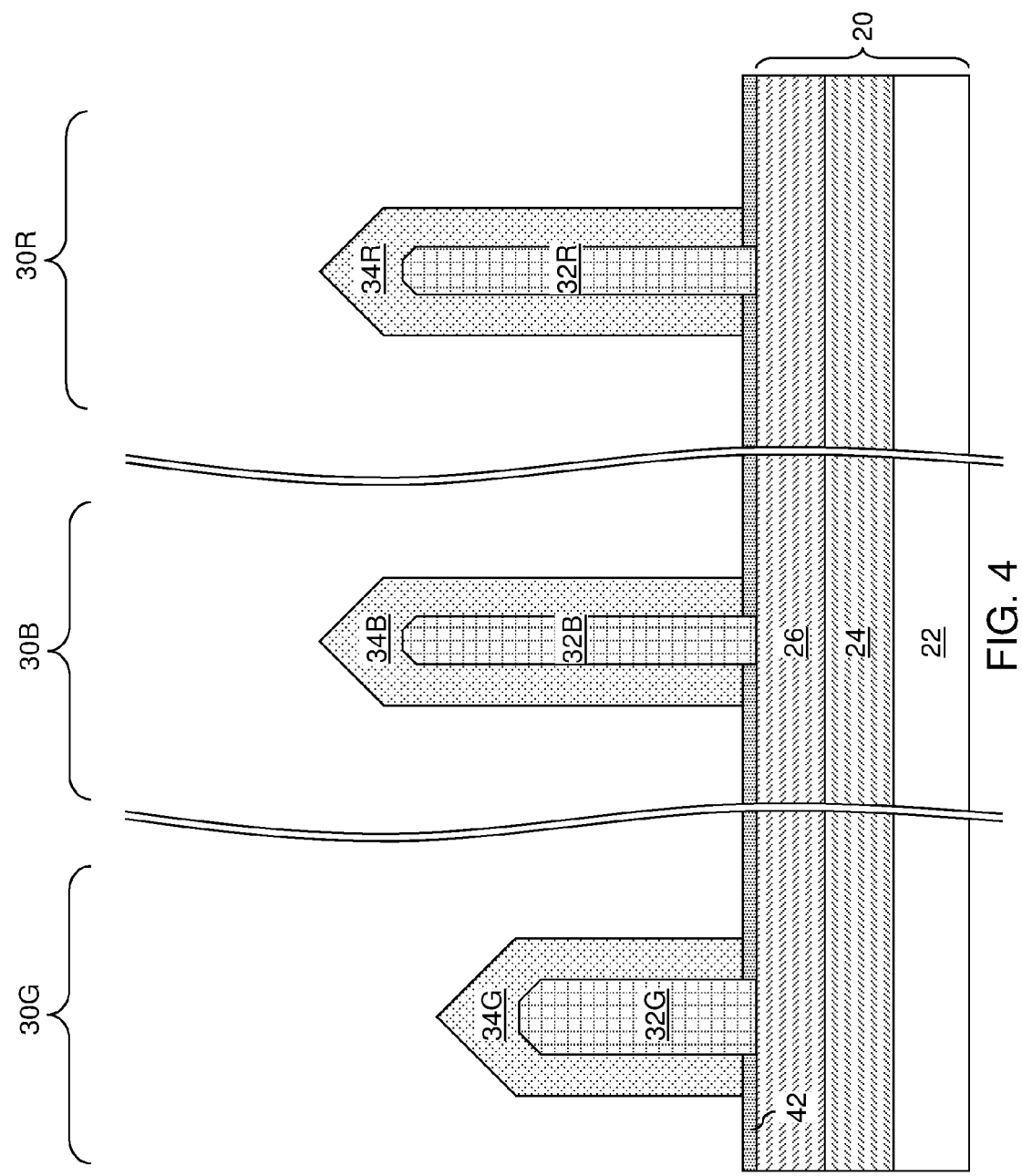
FIG. 4 is a vertical cross-sectional view of the first exemplary structure after forming inner shells according to an embodiment of the present disclosure.

Referring to FIG. 4, optional inner shells (34G, 34B, 34R) having a same type of doping as the semiconductor nanowires (32G, 32B, 32R) can be formed on the semiconductor nanowires (32G, 32B, 32R). A first inner shell 34G is formed around, and over, each first semiconductor nanowire 32G, a second inner shell 34B is formed around, and over, each second semiconductor nanowire 32B, and a third inner shell 34R is formed around, and over, each third semiconductor nanowire 32R. Each of the first, second, and third inner shells (34G, 34B, 34R) comprise a doped semiconductor material having a doping of the first conductivity type, which can be, for example, n-doped GaN. The inner shells (34G, 34B, 34R) can be grown by a selective semiconductor deposition process that grows a single crystalline semiconductor material from physically exposed semiconductor surfaces while not growing any semiconductor material from dielectric surfaces (such as the surfaces of the growth mask 42). The thickness of the inner shells (34G, 34B, 34R) can be in a range from 50 nm to 10 microns (which may be, for example, from 200 nm to 4 microns), although lesser and greater thicknesses can also be employed.

For example, the nanowires 32 may be grown by a CVD based process where the precursor source flows are continuous and precursor source flow rates are adjusted to achieve a low supersaturation in the growth zone where the V/III-ratio is 100 or less, such as in the range of 1-100, preferably in the range of 1-50, and even more preferably in the range of 5-50, at a relatively low temperature (e.g., below 800 C). The GaN inner shells 34 may be formed at the higher temperature (above 800 C, such as 900-1200 C) and higher V/III ratio higher than 100, such as 200-1000. Preferably, the inner shells 34 are grown in a Group III limited regime.

The ratio of the total physically exposed surface area of the second inner shells 34B in the second light emitting region 30B to the total area of the second light emitting region 30B (as seen in a plan view) is greater than the ratio of the total physically exposed surface area of the first inner shells 34G in the first light emitting region 30G. While the first inner shell 34G is shown as having both vertical m-plane sidewalls and an inclined p-plane tip, the first inner shell may have a pyramidal shape such that it lacks the vertical m-plane sidewalls while the inclined p-plane tip extends to the growth mask 42. In this configuration, the ratio of the p-plane area to the m-plane area of the first inner shells 34G in the first light emitting region is larger than the ratio of the p-plane area to the m-plane area of the second inner shells 34B in the second light emitting region 30B. Furthermore, as described above, the first inner shells 34G over nanowires 32G in region 30G are preferably (but not necessarily) farther spaced apart from each other (i.e., have a larger pitch) than the second inner shells 34B over nanowires 32B in region 30B.

Without wishing to be bound by a particular theory, it is believed that differences in the size of openings through the patterned growth mask 42 and/or the pitch among the openings may result in a larger indium incorporation in the active regions formed on the first inner shells 34G in the first light emitting region 30G than the active regions formed on the second inner shells 34B in the second light emitting region 30B. In one embodiment, more indium may be incorporated into the p-plane tip region and into the nano-ring (e.g., annular or eave) region at the junction of the p-plane tip region and the m-plane sidewall in the active regions of LEDs in region 30G than in region 30B, as described in U.S. Pat. No. 9,281,442 (issued Mar. 8, 2016) and PCT international published application WO 2016/025325 (published on Feb. 18, 2016), both of which are incorporated herein by reference in their entirety. The higher indium incorporation into the active regions of the LEDs in region 30G than in region 30B, may lead to longer peak wavelength (e.g., lower energy) light emission from the LEDs in the first light emitting region 30G than in the second light emitting region 30B. Thus, the LEDs in region 30G may emit green light while the LEDs in region 30B may emit blue light.

If the optional inner shells 34G, 34B and 34R are omitted, then the ratio of the total physically exposed surface area of the second nanowires 32B in the second light emitting region 30B to the total area of the second light emitting region 30B (as seen in a plan view) is greater than the ratio of the total physically exposed surface area of the first nanowires 32G in the first light emitting region 30G. Furthermore, as described above, the first nanowires 32G in region 30G are preferably (but not necessarily) farther spaced apart from each other (i.e., have a larger pitch) than the nanowires 32B in region 30B. If the active regions of the LEDs are deposited directly over the nanowires 32G, 32B in each region 30G, 30B, then the active regions in region 30G may have a higher indium content than the active regions in region 30B, which may lead to emission of light with a longer peak wavelength from LEDs in region 30G than in region 30B to some degree.

With regard to the third inner shells 34R, the ratio of the total physically exposed surface area of the third inner shells 34R in the third light emitting region 30R to the total area of the third light emitting region 30R (as seen in a plan view) may be greater, less than or the same as than the ratio of the total physically exposed surface area of the first or second inner shells 34G, 34B in the first or second light emitting regions 30G, 30B. Likewise, the ratio of the p-plane area to the m-plane area of the third inner shells 34R in the third light emitting region may be larger than, smaller than or the same as the ratio of the p-plane area to the m-plane area of the first or second inner shells 34G, 34B in the first or the second light emitting regions 30G, 30B. For example, as shown in FIG. 4, the third inner shells 34R may have the same configuration as the second inner shells 34B. Alternatively, the third inner shells 34R may have the same configuration as the first inner shells 34G or a different configurations from either the first or the second inner shells.

Figure 5:
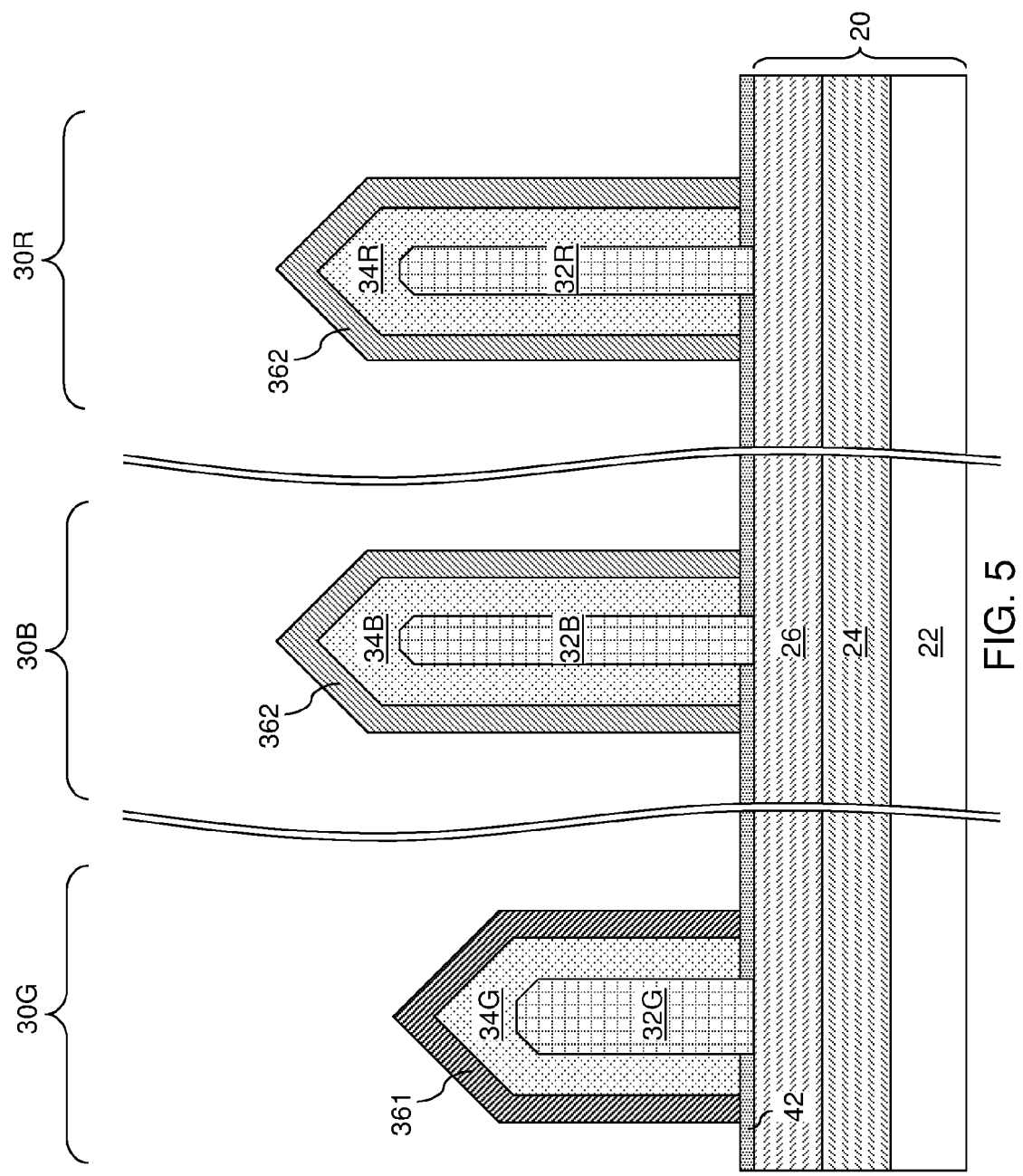
FIG. 5 is a vertical cross-sectional view of the first exemplary structure after forming active regions of two different types according to an embodiment of the present disclosure.

Referring to FIG. 5, active regions (361, 362) of at least two different types are formed on the inner shells (34G, 34B, 34R) (or on the nanowires if the inner shells are omitted) by depositing semiconductor materials emitting light at different wavelengths. A first-type active region 361 is formed directly on, around, and over each first inner shell 34G, and a second-type active region 362 is formed directly on, around, and over each second inner shell 34B and optionally over each third inner shell 34R. For example, a first instance of a second-type active region 362 can be formed on each second inner shell 34B, and a second instance of the second-type active region 362 can be formed on each third inner shell 34R.

The first-type and second-type active regions (361, 362) can be formed by at least one selective epitaxy process. Each instance of the first-type active region 361 and each instance of the second-type active region 362 can have a material composition emit light of target wavelength. In one embodiment, each instance of the first-type active region 361 can have an $In_xGa_{1-x}N$ layer, wherein x is a real number between 0 and 1, and each instance of the second-type active region 362 can have an $In_yGa_{1-y}N$ layer, wherein y is a real number between 0 and 1. In one embodiment, y is different from x. In another embodiment, y can be the same as x, as will be described in more detail below with respect to FIGS. 15-18. The difference between the value of x and the value of y can be induced by different incorporation rates of In atoms during the selective epitaxy process of the indium gallium nitride layer across the first light emitting region 30G and the second and third light emitting regions (30B, 30R) caused by the difference in the geometry of the openings through the patterned growth mask 42. In one embodiment, the first-type active regions 361 may have more indium than the second-type active regions 362.

Optionally, various other layers such as a buffer layer, a cap layer, at least one barrier layer, and/or at least one interlayer may be incorporated to enhance performance. Generally, the thickness of the first-type active region 361, the second-type active region 362, and/or of the various other incorporated layers can be relatively thin, and may have a thickness in a range from 1 nm to 100 nm, such as 1 nm to 20 nm to avoid build-up effects at the edge of the mask, although lesser and greater thicknesses can also be employed.

The first-type and second-type active regions (361, 362) can include a bulk or quasi-bulk semiconductor layer, such as the above described indium gallium nitride layer, which is intrinsic or lightly doped. A quasi-bulk semiconductor layer is a thin layer (e.g., having a thickness of 100 nm or less) which is not a quantum well layer (i.e., which is not located between two barrier layers). Alternatively, the first-type and second-type active regions (361, 362) can include single or multiple quantum wells. In one embodiment, the first-type and second-type active regions (361, 362) can consist essentially of Ga atoms, In atoms, and N atoms (e.g., one or more InGaN well regions with the same or different indium content in different regions) located between GaN, InGaN or AlGaN barrier layers with higher band gaps. In one embodiment, the first-type active regions 361 can be configured to emit light at a first peak wavelength in a range from 495 nm to 570 nm (e.g., green light) upon application of a suitable electrical bias voltage there across, and the second-type active regions 362 can be configured to emit light at a second peak wavelength in a range from 400 nm to 495 nm (e.g., blue light). The second peak wavelength can be smaller than the first peak wavelength. The difference between the compositions of the first-type and second-type active regions (361, 362) can be induced by different incorporation rates of In atoms during the selective epitaxy process of the indium gallium nitride layer across the first light emitting region 30G and the second and third light emitting regions (30B, 30R). For example, at least 5 atomic percent more indium may be incorporated into the so-called "nano-ring" (i.e., "eave") region located at the junction (i.e., structural discontinuity) between the p-plane and the m-plane of the first-type active region 361 (e.g., the green light emitting active region) than the nano-ring region of the second light emitting region 362 (e.g., the blue light emitting active region). The nano-ring (i.e., eave) region formation is described in U.S. provisional patent application Ser. No. 62/036,363 filed on Aug. 12, 2014 and in PCT international application publication number WO 2016/025325 A1 published on Feb. 18, 2016, both of which are incorporated herein by reference in their entirety.

Figure 6:
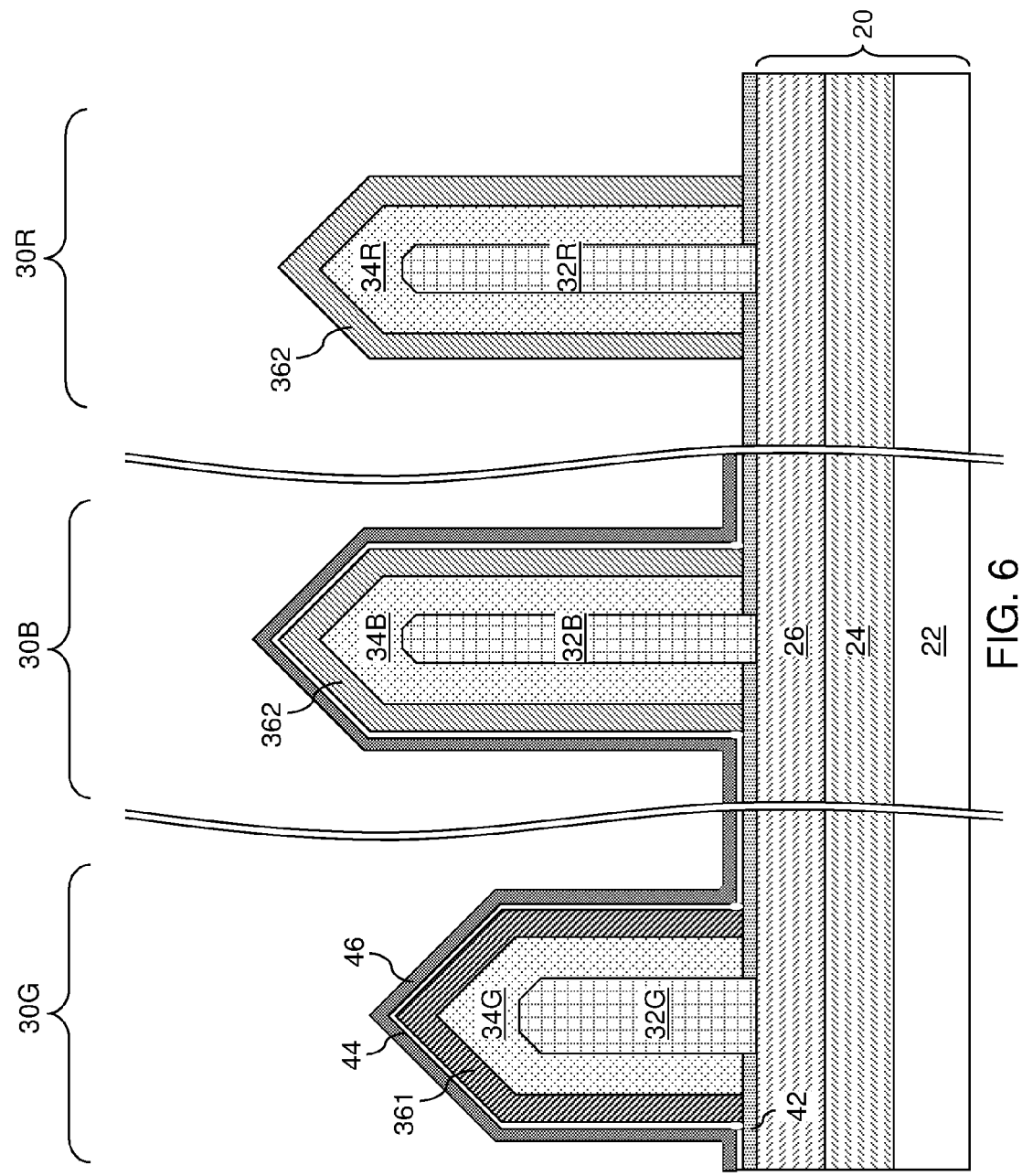
FIG. 6 is a vertical cross-sectional view of the first exemplary structure after formation of a patterned masking layer stack to cover green and blue light emitting regions according to an embodiment of the present disclosure.

Referring to FIG. 6, the active regions 361, 362 in regions 30G, 30B are masked, while leaving the active regions (e.g., 361, 362 or other active regions) unmasked. For example, each first-type active region 361 and each first instance of the second-type active region 362 in the second light emitting region 30B can be masked, while each second instance of the second-type active region 362 in the third light emitting region 30R becomes physically exposed. For example, a masking layer 46 or a masking layer stack (44, 46) can be formed over the first exemplary structure by conformal deposition methods. The masking layer stack (44, 46) can include a stack of dielectric material layers. For example, the masking layer stack (44, 46) can include a silicon oxide layer 44 and a silicon nitride layer 46. In an illustrative example, the silicon oxide layer 44 can have a thickness in a range from 6 nm to 100 nm, and the silicon nitride layer 46 can have a thickness in a range from 4 nm to 100 nm, although lesser and greater thicknesses can also be employed for each of the silicon oxide layer 44 and the silicon nitride layer 46. In one embodiment, the growth mask 42 and the silicon nitride layer 46 can comprise silicon nitride, and the thickness of the silicon nitride layer 46 can be less than the thickness of the growth mask 42. In this case, the thickness of the silicon nitride layer 46 can be in a range from 10% to 80% of the thickness of the growth mask 42.

The masking layer or stack (44, 46) can be patterned, for example, by applying and patterning a photoresist layer to cover the first and second light emitting device regions (30G, 30B), while not covering the third light emitting device region 30R, and by removing the portions of the masking layer 46 or stack (44, 46) that are not covered by the patterned photoresist layer. For example, the physically exposed portions of the silicon nitride layer 46 can be removed selective to the silicon oxide layer 44. Subsequently, physically exposed portions of the silicon oxide layer 44 (if present) can be removed selective to the material of the growth mask 42 (which may include, for example, silicon nitride). The patterned photoresist layer can be subsequently removed, for example, by ashing.

Figure 7:
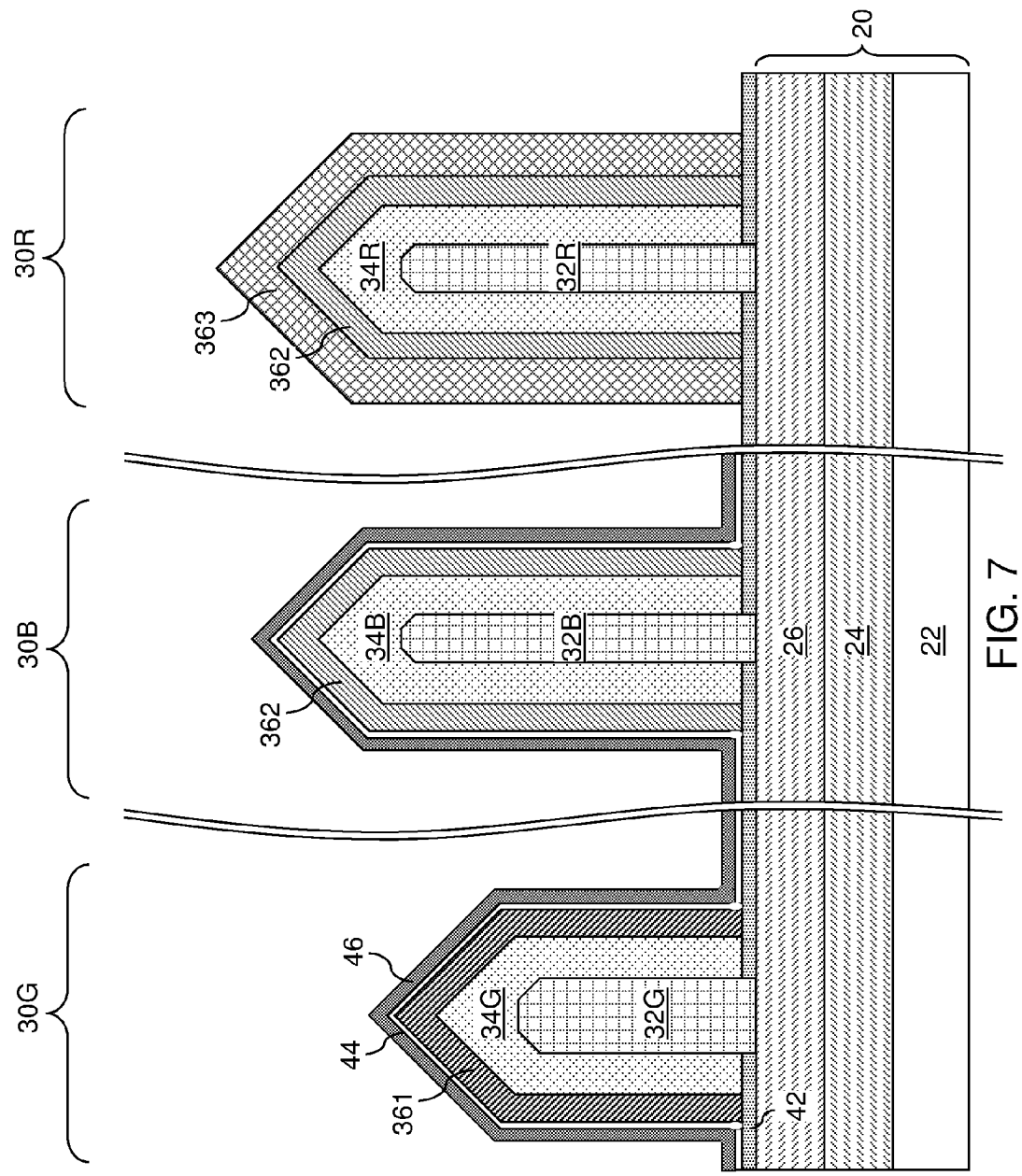
FIG. 7 is a vertical cross-sectional view of the first exemplary structure after formation of an active region emitting red light according to an embodiment of the present disclosure.

Referring to FIG. 7, a light emitting structure 363 that emits light having a longer wavelength than the wavelength emitted by the active regions 361 and 362 is formed in region 30R. In the first embodiment, the light emitting structure 363 is a third-type active region 363 epitaxially grown on each physically exposed outer surface of instances of the active region (e.g., second-type active region 362 or active region 361 or another active region) located in region 30R. The third-type active region 363 has a different composition than the first and the second-type active regions (361, 362) can be formed over, and around the active region (e.g., 362 or another active region, such as 361) that is located in the third light emitting region 30R (and thus, is not masked by the masking layer 46 or stack (44, 46)). A selective epitaxial semiconductor deposition process can be employed to form the third-type active regions 363. In an illustrative example, the third-type active region 363 can include a bulk or quasi-bulk $In_xGa_{1-z}N$ layer, wherein z is a real number between 0 and 1 and different from x and y. Alternatively, the third-type active region 363 can include a single quantum well or multiple quantum wells having $In_xGa_{1-z}N$ well layers configured emit light of a different wavelength than the first-active region 361 and the second-active region 362. Optionally, various other layers such as a buffer layer, a cap layer, at least one barrier layer, and/or at least one interlayer may be incorporated to enhance performance. Generally, the thickness of the third-type active region 363 and/or of the various other incorporated layers can be relative thin, and may have a thickness in a range from 1 nm to 100 nm, such as 1 nm to 20 nm to avoid build-up effects at the edge of the mask, although lesser and greater thicknesses can also be employed.

Each third-type active region 363 is a light emitting structure configured to emit light at a third peak wavelength that is greater than the second peak wavelength. In one embodiment, the third peak wavelength can be in a range from 600 nm to 700 nm to form a red light emitting LED in region 30R. Each third-type active region 363 can be formed directly on a sidewall of the active region located in region 30R. The third-type active region can have a III-V compound semiconductor material configured to emit light at the third peak wavelength. In one embodiment, the light emitting structure can comprise an element in the Periodic Table of Elements that is not present in the first-type active region 361, and is not present in the second-type active region 362. In one embodiment, the first-type active region 361 can have an $In_xGa_{1-x}N$ layer, wherein x is a real number between 0 and 1, the second-type active region 362 can have an $In_yGa_{1-y}N$ layer, wherein y is a real number between 0 and 1 and different from x, and the third-type active region 363 can comprise at least one material selected from aluminum gallium arsenide, aluminum gallium indium phosphide, aluminum indium gallium nitride, gallium arsenide phosphide, gallium phosphide, high indium content InGaN (e.g., having a higher indium content than active regions 361 and 362, for example, $In_zGa_{1-z}N$ layer, wherein $0.3 \le z \le 0.5$, while x and y are less than or equal to 0.3), red emitting dilute III-nitride semiconductor (e.g., $In_wGa_{1-w}P_{1-u-v}As_uN_v$, wherein w and u are real numbers between 0 and 1, and $0.01 \le v \le 0.1$) or red light emitting, rare earth ion doped gallium nitride, such as europium or magnesium and europium doped gallium nitride or indium gallium nitride. In one embodiment, the first-type and second-type active regions (361, 362) consist essentially of Ga atoms, In atoms, and N atoms, and the light emitting structure as embodied as the third-type active region 363 can comprise at least one of Al, As, and P. If region 363 comprises at least one InGaN quantum well, then the barrier layers for the active region 363 may comprise materials with a higher band gap, such as InGaN, AlGaN, or GaN. In general, the active region 363 includes a red light emitting material.

Figure 8:
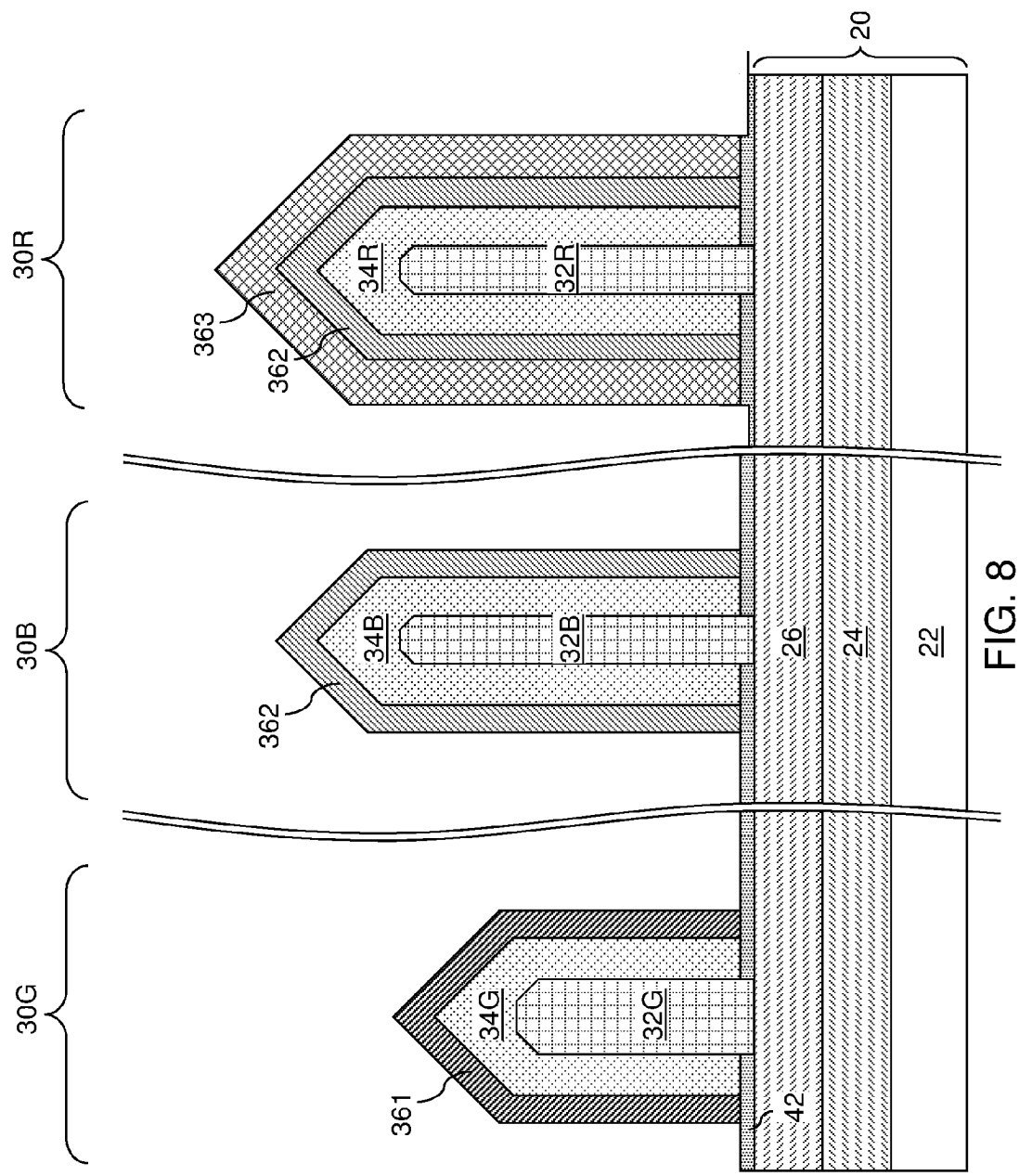
FIG. 8 is a vertical cross-sectional view of the first exemplary structure after removal of the patterned masking layer stack according to an embodiment of the present disclosure.

Referring to FIG. 8, the masking layer stack (44, 46) can be removed. The growth mask 42 can be collaterally thinned during removal of the masking layer stack (44, 46), but a remaining portion of the growth mask 42 can cover the entire top surface of the base semiconductor layer 26 that does not contact the semiconductor nanowires (32G, 32B, 32R). For example, if the growth mask 42 includes silicon nitride and the masking layer stack (44, 46) includes a stack of silicon oxide layer 44 and a silicon nitride layer 46, the thickness of the silicon nitride layer 46 can be in a range from 10% to 80% of the thickness of the growth mask 42, and the remaining portion of the growth mask 42 can cover the entirety of the top surface of the base semiconductor layer 26 not in physical contact with the semiconductor nanowires (32G, 32B, 32R) after removal of the masking layer stack (44, 46). In an illustrative example, if the masking layer stack (44, 46) includes a silicon oxide layer 44 and a silicon nitride layer 46, a wet etch employing hot phosphoric acid can be employed to etch the silicon nitride layer 46, and a wet etch employing hydrofluoric acid can be employed to etch the silicon oxide layer 44. The etch mask 42 can have a stepped periphery around each third-type active region 363 such that the etch mask 42 has the original thickness within the stepped periphery and has a lesser thickness outside the stepped periphery.

Figure 9:
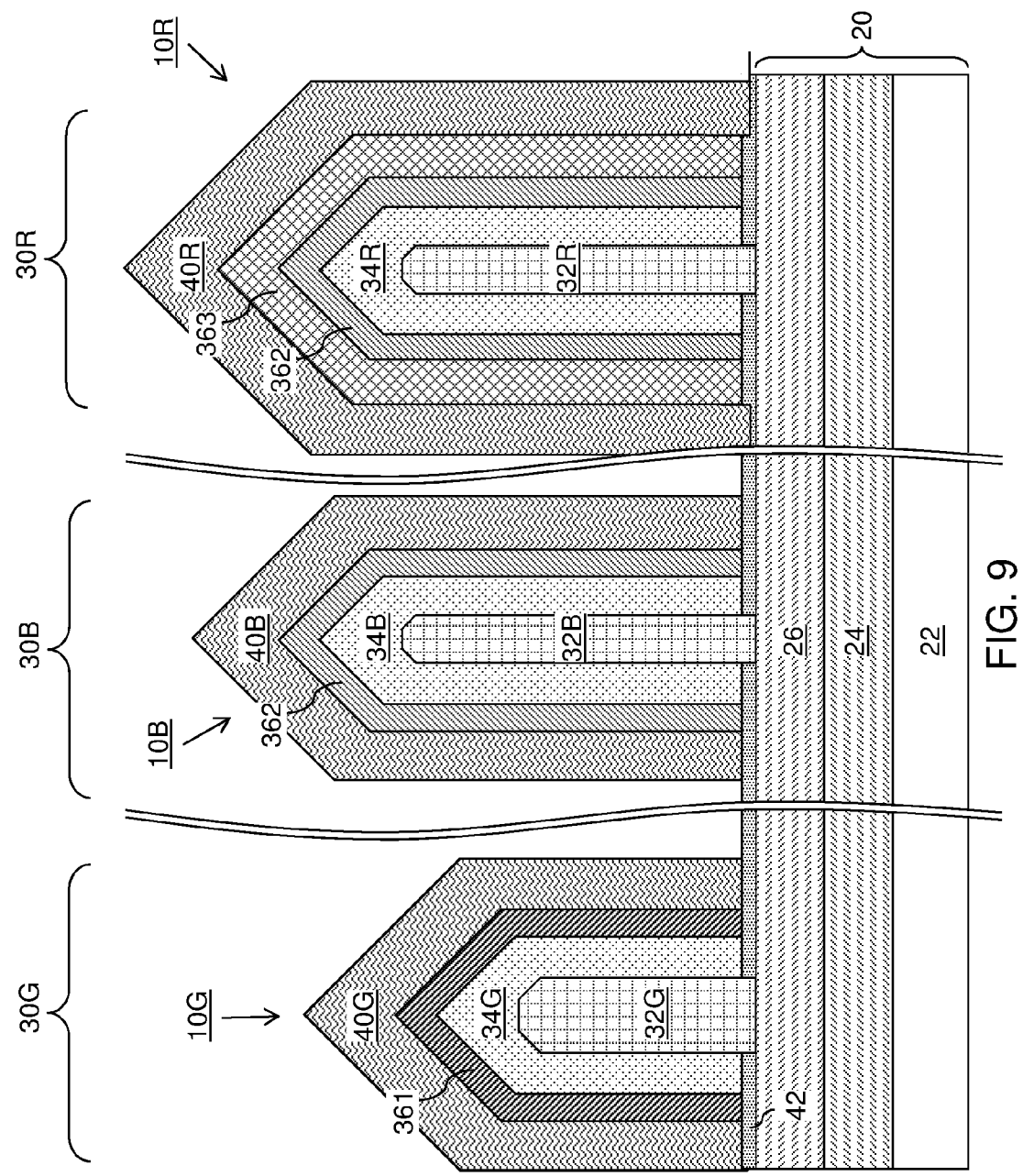
FIG. 9 is a vertical cross-sectional view of the first exemplary structure after formation of semiconductor junction layers according to an embodiment of the present disclosure.

Referring to FIG. 9, semiconductor junction layers (40G, 40B, 40R) may be formed on the physically exposed outer surfaces active regions (361, 362, 363). Alternatively, if the semiconductor junction layer 40G is a GaN layer, then it may be formed before removal of the masking layer stack (44, 46). As used herein, a "semiconductor junction layer" refers to a doped semiconductor material layer having a p-type doping or an n-type doping and forms one side of a p-n or p-i-n junction. If the active region includes an intrinsic semiconductor material, then the semiconductor junction layer forms a p-i-n junction with a semiconductor layer of opposite conductivity type located on the opposite side of the active region. If the active region comprises a p-type or n-type doped semiconductor material of the opposite conductivity type from that of the semiconductor junction layer, then the active region and the semiconductor junction layer form a p-n junction. In this embodiment, the semiconductor junction layer comprises an outer shell of a core-shell nanowire LED. Specifically, a first semiconductor junction layer 40G can be formed on the outer surfaces of each first-type active region 361 in the first light emitting region 30G, a second semiconductor junction layer 40B can be formed on the outer surfaces of the second-type active region 362 in the second light emitting region 30B, and a third semiconductor junction layer 40R can be formed on the outer surfaces of each third-type active region 363. Thus, a first semiconductor junction layer 40G, a second semiconductor junction layer 40B, and a combination of a third semiconductor junction layer 40R and a light emitting structure (as embodied as a third-type active region 363) are formed over a first-type active region 361, a first instance of the second-type active region 362, and a second instance of the second-type active region 362, respectively.

The first, second, and third semiconductor junction layers (40G, 40B, 40R) can include a doped semiconductor material having a doping of a second conductivity type, which is the opposite of the first conductivity type. If the first conductivity type is n-type, the second conductivity type is p-type, and vice versa. For example, the first, second, and third semiconductor junction layers (40G, 40B, 40R) can include p-doped GaN and/or p-doped AlGaN. In one embodiment, the first, second, and third semiconductor junction layers (40G, 40B, 40R) can be formed by a selective semiconductor deposition process that grows the doped semiconductor material only from the physically exposed semiconductor surfaces, i.e., the physically exposed surfaces of the active regions (361, 362, 363). Each physically adjoining (contacting) combination of a semiconductor nanowire (32G, 32B, or 32R), an inner shell (34G, 34B, or 34R), at least one active region (361, 362 or (362, 363)), and a semiconductor junction layer (40G, 40B, 40R) constitutes a light emitting diode. The locations of the openings through the growth mask 42 and the duration of the selective epitaxy process that forms the semiconductor junction layers (40G, 40B, 40R) can be selected such that each light emitting diode can be electrically isolated from other light emitting diodes, or can share a common semiconductor junction layer (40G, 40B, 40R) as needed. Each semiconductor junction layer may comprise plural sub-shells, such as p-GaN and p-AlGaN subshells.

Figure 10:
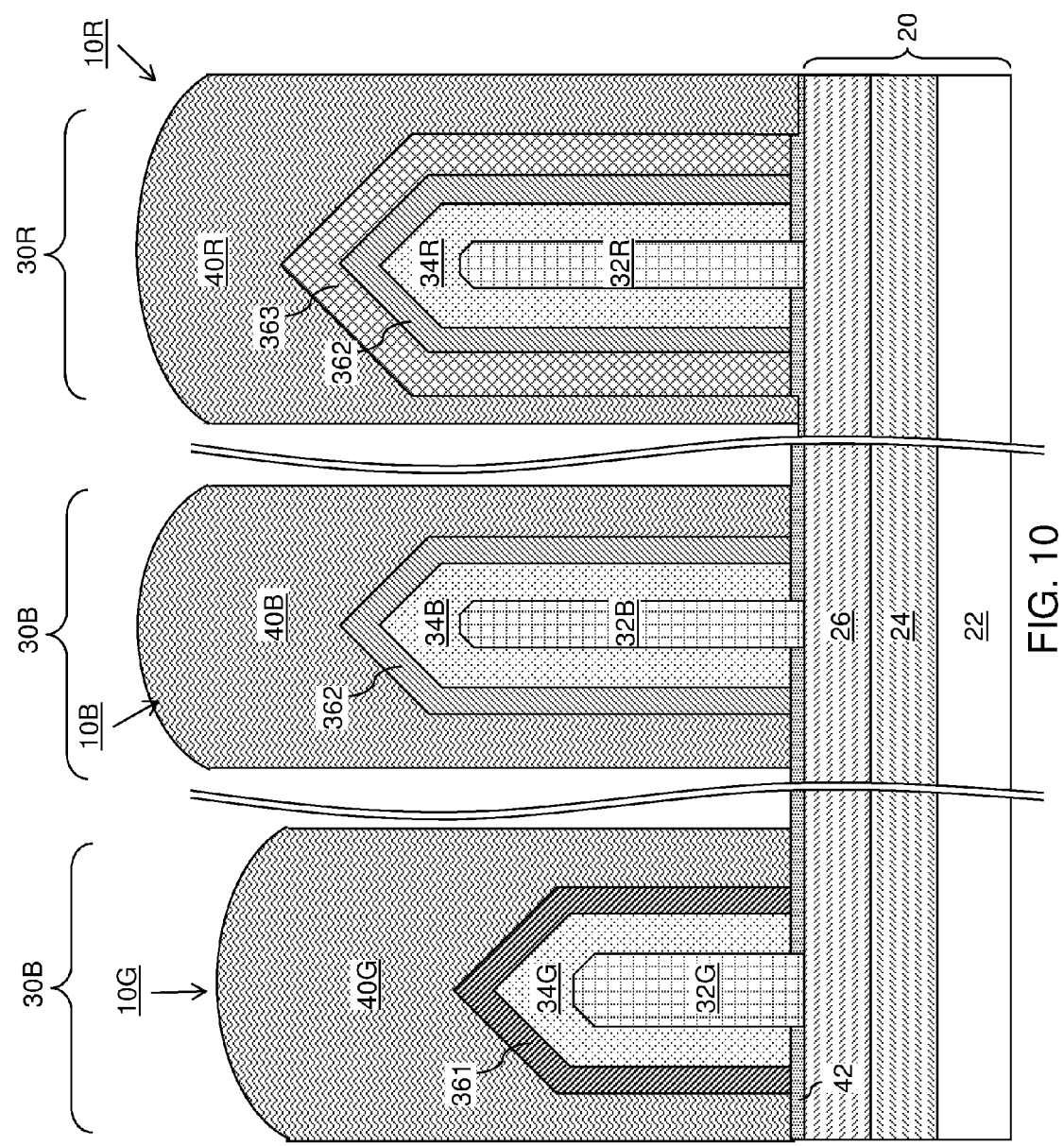
FIG. 10 is a vertical cross-sectional view of an alternative embodiment of the first exemplary structure after formation of semiconductor junction layers by deposition and patterning of a semiconductor junction layer according to an embodiment of the present disclosure.

Referring to FIG. 10, an alternative embodiment of the first exemplary structure is illustrated. In this case, a doped semiconductor material having a doping of the second conductivity type may be deposited selectively or non-selectively on the physically exposed surfaces of the active regions (361, 362 363) to form a continuous (e.g., coalesced p-GaN) semiconductor junction layer. The top surface of the semiconductor junction layer may have bumps at locations overlying the semiconductor nanowires (32G, 32B, 32R). The semiconductor junction layer can be patterned, for example, by a combination of lithographic methods that forms patterned photoresist portions and an anisotropic etch that removes portions of the semiconductor junction layer that are not masked by the patterned photoresist portions. Each continuous remaining portion of the semiconductor junction layer constitutes an outer shell semiconductor junction layer (40G, 40B, 40R), which surrounds at least one semiconductor nanowire (32G, 32B, 32R). Thus, a first semiconductor junction layer 40G, a second semiconductor junction layer 40B, and a combination of a third semiconductor junction layer 40R and a light emitting structure (as embodied as a third-type active region 363) can be formed over the first-type active region 361, a the second-type active region 362, and the active region (e.g., 361 or 362) in region 30R, respectively.

Figure 11:
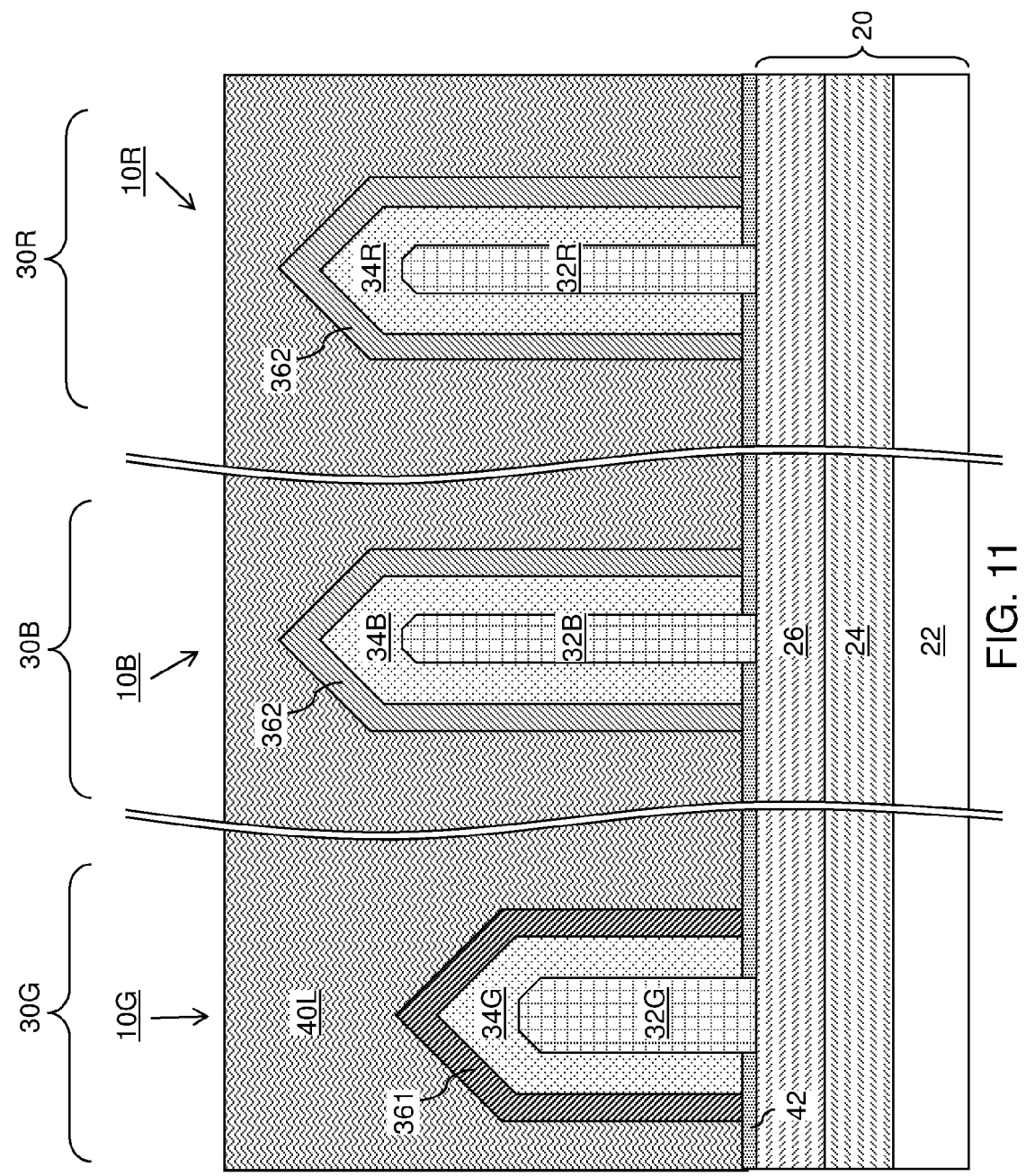
FIG. 11 is a vertical cross-sectional view of a second exemplary structure after formation of a semiconductor junction layer according to an embodiment of the present disclosure.

Referring to FIG. 11, a second exemplary structure can be derived from the first exemplary structure of FIG. 5 by omitting the processing steps of FIGS. 6-8 (i.e., by omitting forming active region 363) and by forming a semiconductor junction layer 40L (e.g., a coalesced p-GaN layer) or individual semiconductor junction layers described above. The semiconductor junction layer 40L can be the same as the semiconductor junction layer employed to form the embodiment of the first exemplary structure illustrated in FIG. 10. While not expressly illustrated, the top surface of the semiconductor junction layer 40L may include protruding bumps at locations overlying the semiconductor nanowires (32G, 32B, 32R) depending on the thickness of the semiconductor junction layer 40L.

Figure 12:
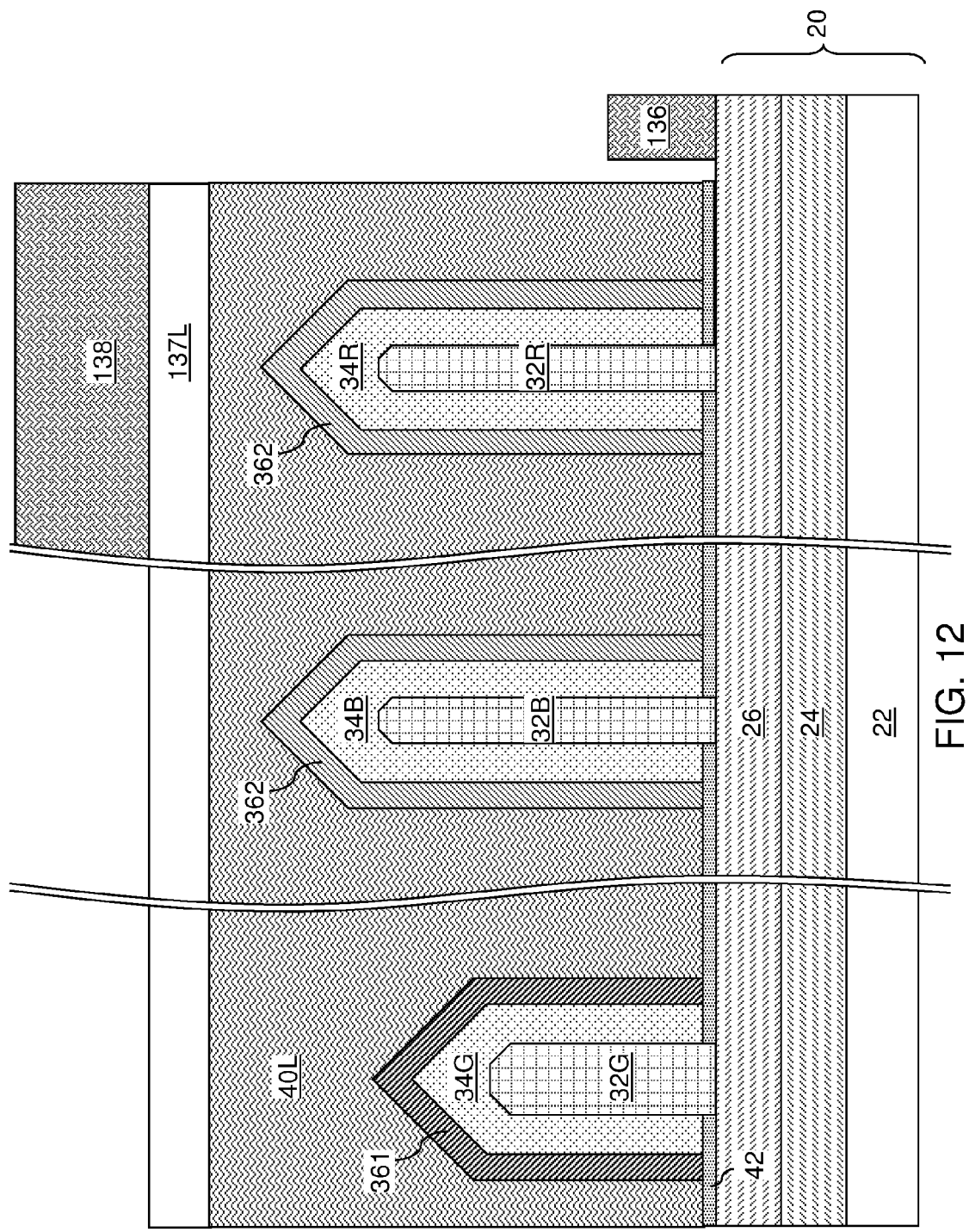
FIG. 12 is a vertical cross-sectional view of the second exemplary structure after formation of a red color emitting material portion in a red light emitting region according to an embodiment of the present disclosure.

Referring to FIG. 12, a transparent conductive material layer 137L can be formed over the semiconductor junction layer 40L. The transparent conductive material layer 137L can include a transparent conductive material such as indium tin oxide, doped zinc oxide, and a transparent conductive polymer, which acts as one of the electrodes (e.g., p-side electrode). A second electrode 136 may be formed in contact with the opposite conductivity side of the LEDs (e.g., with n-type layer 26 to form an n-side electrode).

A light emitting structure 138 of the second embodiment can be formed over the transparent conductive material layer 137L and over each third-type semiconductor nanowire 32R in the third light emitting region 30R. Each light emitting structure 138 may continuously extend over a region overlying at least one third-type semiconductor nanowire 32R, while not overlying any of the first-type semiconductor nanowire 32G or the second-type semiconductor nanowire 32B.

In the second embodiment, each light emitting structure 138 may comprise an inorganic phosphor, an organic dye or semiconductor quantum dots which emit light of a lower energy (e.g., longer wavelength) when light of a higher energy (e.g., shorter wavelength) emitted from the active region (e.g., 362) of the LED 10R. For example, the structure 138 emits red light when shorter wavelength (i.e., higher energy) green or blue light emitted from the active region (e.g., 362) of the LED 10R is incident on the structure. For example, the structure 138 may comprise a layer of down converting inorganic phosphor particles or a transparent matrix (e.g., polymer encapsulant) containing the inorganic phosphor particles. Non-limiting examples of down converting red emitting phosphors include europium activated nitride phosphors which are excited by blue light, such as $CaAlSiN_3:Eu^{2+}$, $CaAlSi_4N_7:Eu^{2+}$ or $SrSi_5N_8:Eu^{2+}$. While the present disclosure is described employing an embodiment in which light emitting structures 138 are formed over the transparent conductive material layer 137L, embodiments are expressly contemplated herein in which light emitting structures 138 are formed on the bottom side of the substrate in case the substrate is optically transparent, and light is emitted from the active region through the substrate (e.g., forming a bottom emitting LED).

In one embodiment, the light emitting structure 138 can comprise an element in the Periodic Table of Elements that is not present in the first-type active region 361, and is not present in the second-type active region 362. For example, the light emitting structure 138 can include carbon if the light emitting structure 138 includes an organic dye material, or can include a rare earth metal and/or a transition if the light emitting structure 138 includes an inorganic phosphor. The light emitting structure 138 can emit light at a third peak wavelength, which is longer than the second peak wavelength. In one embodiment, the third peak wavelength can be in a range from 600 nm to 700 nm. In one embodiment, the light emitting structure 138 can be a red color emitting material portion, and the third light emitting region 30R can be a red light emitting region.

Figure 13:
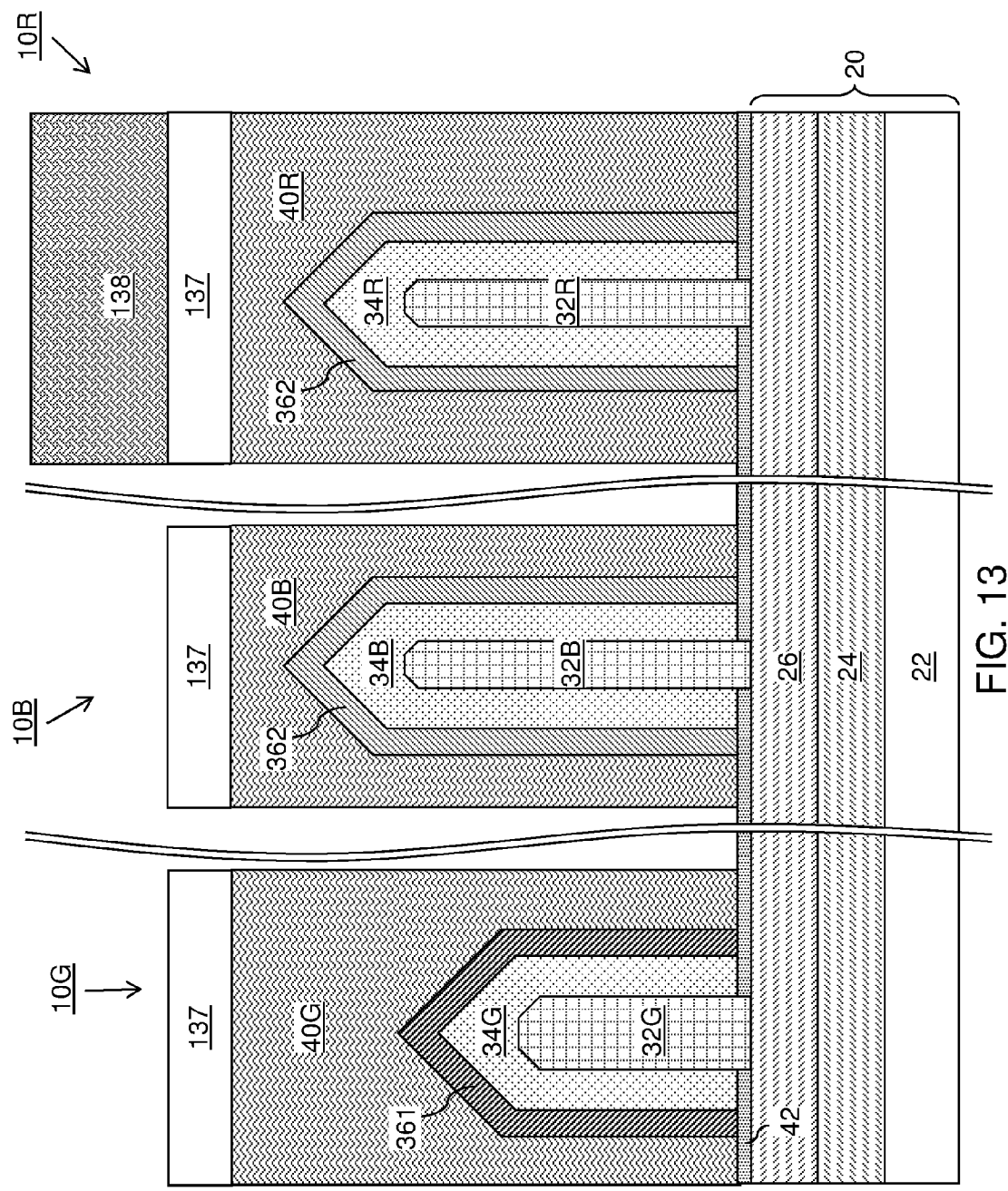
FIG. 13 is a vertical cross-sectional view of the second exemplary structure after patterning the semiconductor junction layer according to an embodiment of the present disclosure.

Referring to FIG. 13, a photoresist layer (not shown) can be applied over the light emitting structure 138 and the semiconductor junction layer 40L, and can be lithographically patterned to cover areas in which semiconductor junction layers (40G, 40B, 40R) are to be formed. The light emitting structure 138, the transparent conductive material layer 137L, and the semiconductor junction layer 40L can be patterned, for example, in an anisotropic etch process that employs the patterned photoresist layer as an etch mask. Each remaining portion of the transparent conductive material layer 137L constitutes an upper electrode, which can be employed in conjunction with lower electrodes (not shown) electrically connected to a respective semiconductor nanowire (32G, 32B, 32R) to provide two terminals for each light emitting diode. Each remaining portion of the semiconductor junction layer 40L constitutes an outer shell semiconductor junction layer (40G, 40B, 40R). A first semiconductor junction layer 40G is formed directly on the first-type active region 361, a second semiconductor junction layer 40B is formed directly on the first instance of the second-type active region 362, and a third semiconductor junction layer 40R is formed directly on the second instance of the second-type active region 362.

Each physically adjoining (contacting) combination of a semiconductor nanowire (32G, 32B, or 32R), an inner shell (34G, 34B, or 34R), an active region (361, 362), an outer shell semiconductor junction layer (40G, 40B, 40R), and a light emitting structure 138 if present over the semiconductor junction layer 40R constitutes a light emitting diode. The locations of the openings through the growth mask 42 and the duration of the selective epitaxy process that forms the semiconductor junction layers (40G, 40B, 40R) can be selected such that each light emitting diode can be electrically isolated from other light emitting diodes, or can share a common semiconductor junction layer (40G, 40B, 40R) as needed. The light emitting structure 138 of the third light emitting diode comprises a light emitting material portion located above the semiconductor junction layer 40R of the third light emitting diode.

In an alternative embodiment, the order of steps of FIGS. 12 and 13 may be reversed, where the structure 138 is formed after patterning of layer 40L. In another alternative embodiment, the structure 138 is formed in a device that lacks the coalesced p-GaN layer 40L. For example, the structure 138 may be formed over the semiconductor junction layers of individual nanowire LEDs in region 30R.

The various exemplary structures of the present disclosure can be incorporated into a light emitting device, which can be located on the substrate 20 or can be diced and attached to a backplane to form a direct view display device 200. The light emitting device array can comprise: a substrate 20 including a semiconductor material layer (such as a base semiconductor layer 26); a patterned growth mask 42 located on a top surface of the substrate 20 and comprising a plurality of openings therethrough; and a plurality of light emitting diodes located on the substrate 20. Each of the plurality of light emitting diodes comprise a semiconductor nanowire (32G, 32B, 32R) of a first conductivity type that extends through a respective opening through the patterned growth mask 42, an optional inner shell (34G, 34B, or 34R) comprising a doped semiconductor material having a doping of a first conductivity type and laterally surrounding, and overlying, a respective semiconductor nanowire (32G, 32B, or 32R); an active region (361, 362) laterally surrounding, and overlying, a respective inner shell (34G, 34B, or 34R) (or the respective nanowire if the inner shell is omitted), and a semiconductor junction layer (40G, 40B, 40R) laterally surrounding, and overlying, a respective active region (361, 362) and having a doping of a second conductivity type that is the opposite of the first conductivity type. The plurality of light emitting diodes comprises: a first light emitting diode that includes an instance of a first-type active region 361 emitting light at a first peak wavelength; a second light emitting diode that includes a first instance of a second-type active region 362 emitting light at a second peak wavelength; a third light emitting diode that includes an active region (e.g., 361 or 362) and a light emitting structure (363 or 138) that emits light at a third peak wavelength that is greater than the second peak wavelength.

In one embodiment, the light emitting structure of the third light emitting diode can comprise a third-type active region 363 having a different composition than the active region in region 30R. In another embodiment, the light emitting structure of the third light emitting diode can comprise a light emitting material portion 138 located above the semiconductor junction layer 40R of the third light emitting diode. In one embodiment, the semiconductor material layer 26, each of the semiconductor nanowires (32G, 32B, 32R), and each of the inner shells (34G, 34B, 34R) can be single crystalline and epitaxially aligned to one another. In one embodiment, each of the active regions (361, 362) and each of the semiconductor junction layers (40G, 40B, 40R) can be single crystalline and can be epitaxially aligned to the semiconductor material layer 26 through the semiconductor nanowires (32G, 32B, 32R) and the inner shells (34G, 34B, 34R).

Figure 14:
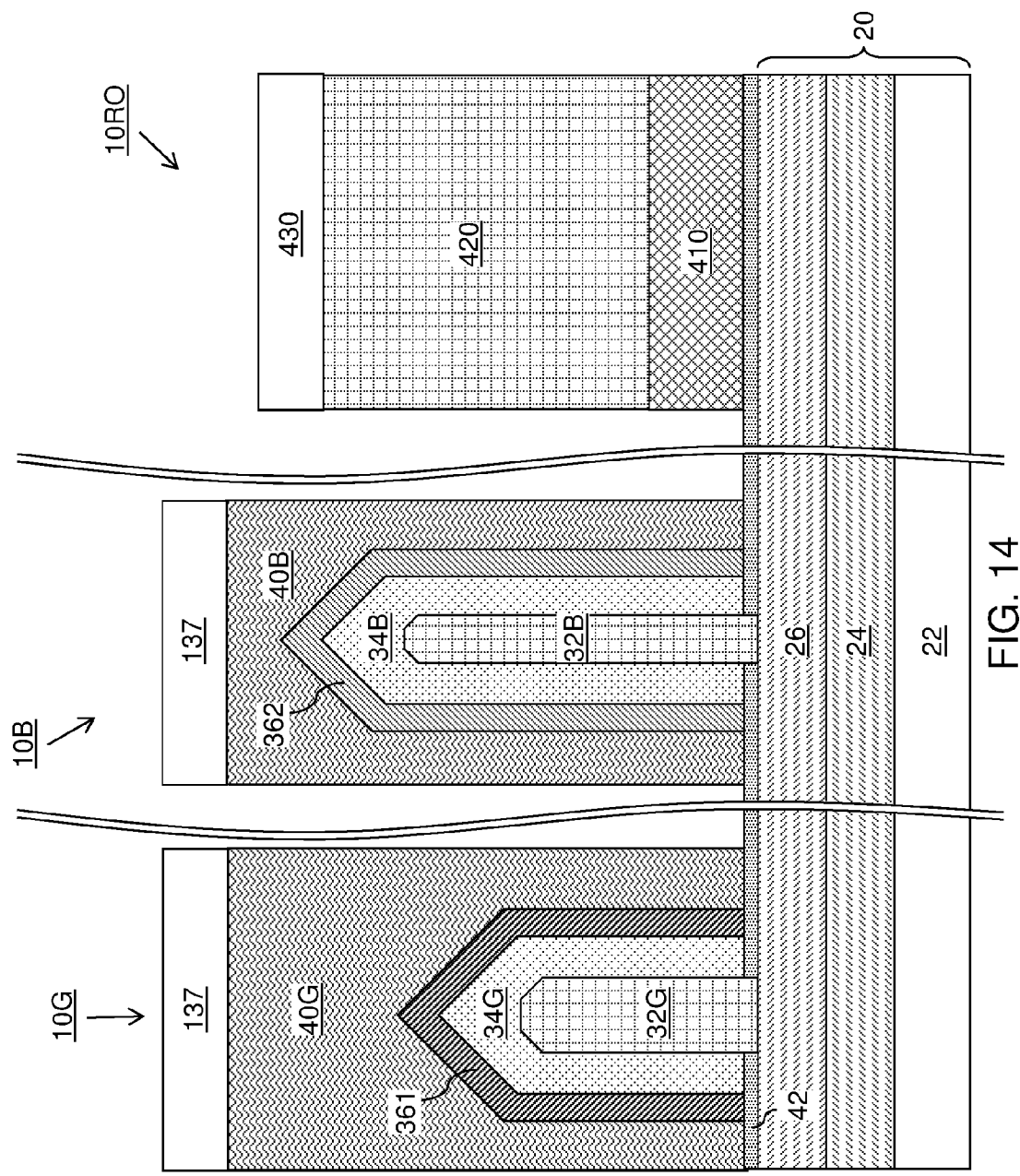
FIG. 14 is a vertical cross-sectional view of an alternate embodiment of a light emitting device array according to an embodiment of the present disclosure.

Referring to FIG. 14, a third embodiment of the light emitting device of the present disclosure is illustrated, which may be derived from the various light emitting device arrays of the present disclosure described above by replacing one or more of the third light emitting diodes 10R with an organic light emitting diode 10RO, which can include, for example, a lower electrode 410, an organic light emitting material 420, and an upper electrode 430. Thus, in the third embodiment, the light emitting structure comprises the organic LED ("OLED") 10RO, which is preferably a red emitting OLED. The organic light emitting material 420 may contain one or more organic light emitting layers, such as polymer and/or small molecule semiconductor light emitting layers. The polymer semiconductor electroluminescent layers may comprise undoped polymers (e.g., derivatives of poly(p-phenylene vinylene) (PPV), poly(naphthalene vinylene) or polyfluorine) or doped polymers (e.g., poly(N-vinylcarbazole) host material with organometallic complex (e.g., platinum or iridium complex) dopant which use electrophosphorescence to convert electrical energy into light). In contrast, inorganic light emitting diodes 10G, 10B include Group IV, Group III-V or Group II-V inorganic semiconductor light emitting materials. For example, gallium nitride, indium gallium nitride or aluminum gallium nitride may be used as the light emitting materials. The inorganic semiconductor light emitting diodes may include nanowires.

The OLED 10RO may be formed by forming a mask in regions 30G, 30R over the LEDS 10G, 10B which emit green and blue light, removing the materials deposited in region 30R, and forming the OLED 10RO layers 410, 420 and 430 in region 30R. If portions of any of the layers (410, 420, 430) are formed over the mask, then they may be removed by lifting off the mask and/or by etching or planarization.

In another alternative device, the green and blue LEDs 10G and 10B may be formed using the method of U.S. application Ser. No. 14/865,459 filed on Sep. 25, 2015 and incorporated herein by reference in its entirety. Rather than forming nanowire LEDs with a different indium concentration in regions 10G and 10B as described above, identical LEDs may be formed in regions 30G and 30B, followed by removing the tip portions of the LEDs in region 30B but not removing the tip portions of the LEDs in region 30G. It is believed that the active regions of the tip (e.g., p-plane) portions and the nano-ring portions of the LEDs contain a higher indium content than the sidewalls (e.g., m-plane) portions. By removing the tip portions from the LEDs in region 30B, the green light emitted from the tip portions of LEDs 10B is eliminated in region 30B to leave blue light emitting LEDs 10B which emit only blue light from the remaining m-plane portions of the active region. In contrast, the tip portions in the LEDs 10G remain to emit green light from region 30G.

Figure 15:
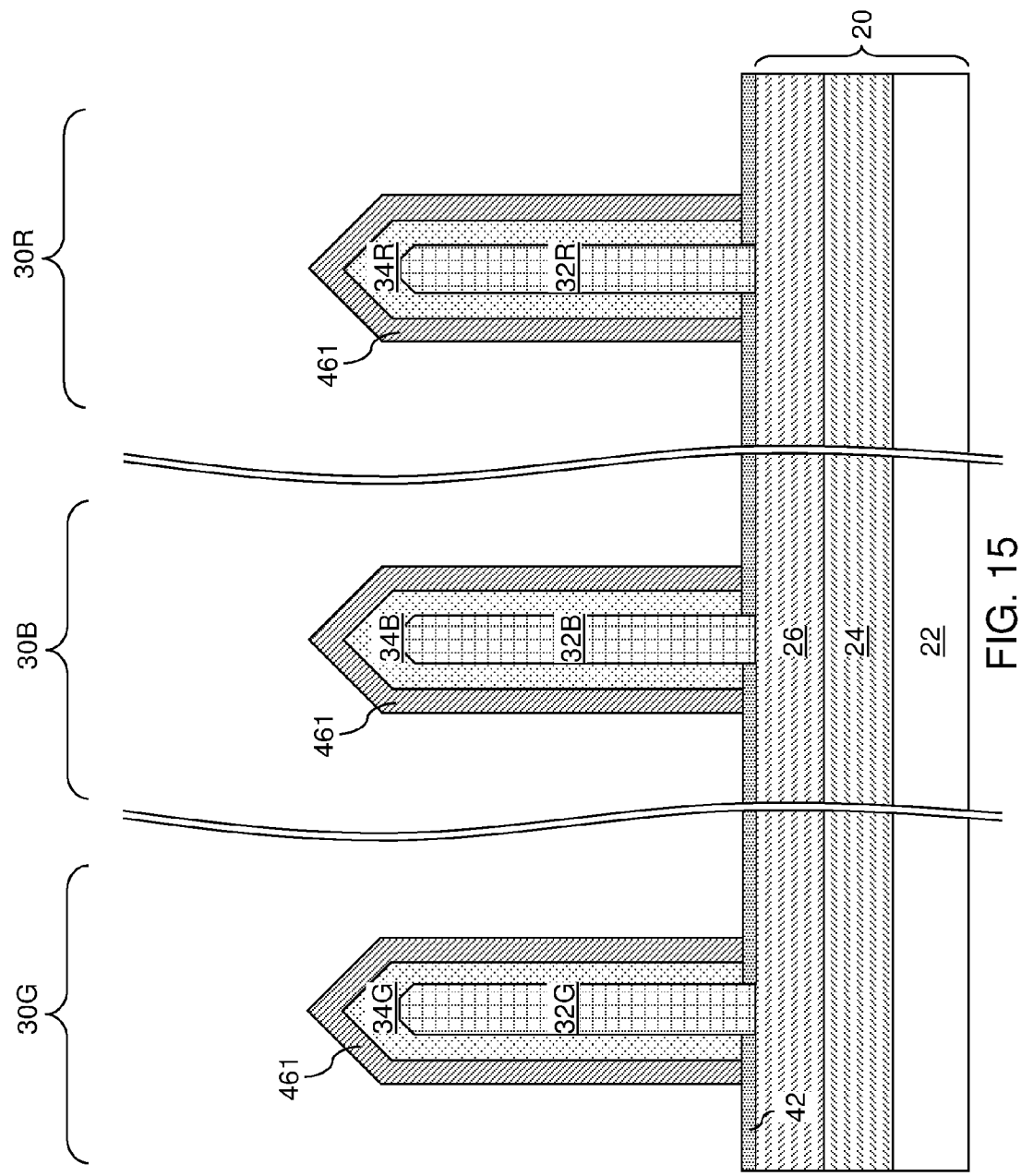
FIG. 15 is a vertical cross-sectional view of a third exemplary structure after formation of first-type active regions in the first, second, and third light emitting regions according to an embodiment of the present disclosure.

Referring to FIG. 15, a third exemplary structure is illustrated, which is not limited by any geometrical consideration for inducing different compositions between first-type active regions 361 and second-type active regions 362 as in the case of the first and second exemplary structures. Thus, there is no limitation on the size of the openings and shapes through the growth mask 42 at the processing steps of FIG. 2.

Subsequently, the processing steps of FIGS. 3 and 4 are performed to form at least one first semiconductor nanowire 32G, at least one second semiconductor nanowire 32B, and at least one third semiconductor nanowire 32R can be grown through the openings 32G, 32B and 32R in the patterned growth mask 42 by a selective epitaxy process. Optional inner shells (34G, 34B, 34R) having a same type of doping as the semiconductor nanowires (32G, 32B, 32R) can be formed on the semiconductor nanowires (32G, 32B, 32R). A first inner shell 34G is formed around, and over, each first semiconductor nanowire 32G, a second inner shell 34B is formed around, and over, each second semiconductor nanowire 32B, and a third inner shell 34R is formed around, and over, each third semiconductor nanowire 32R.

First-type active regions 461 can be formed on each inner shell (34G, 34B, 34B) (or in case the inner shells are absent, on each semiconductor nanowire (32G, 32B, 32R)). First-type active regions 461 may have the same composition, or may have different compositions, across the light emitting regions (30G, 30B, 30R). The first-type active regions 461 can be formed employing the same methods as the first-type and second-type active regions (361, 362) of the first and second embodiments. In one embodiment, the process conditions during deposition of the first-type active regions 461 can be selected such that the wavelength of light to be emitted from the first-type active regions 461 is optimized in a light emitting region (such as the second light emitting region 30B) in which no additional active regions are subsequently formed. In one embodiment, the wavelength of light to be emitted from the first-type active regions 461 can be the shortest wavelength among a set of wavelengths to be employed in a direct view display device to be subsequently formed. For example, for an RGB device, the first-type active regions 461 can be configured to emit blue light.

Referring to FIG. 16, a first masking layer 444 is deposited and patterned to cover the second light emitting region 30B, while not covering the first light emitting region 30G and the third light emitting region 30R. The first masking layer 444 includes a dielectric material that is different from the dielectric material of the growth mask 42. For example, the growth mask 42 can include silicon nitride, and the first masking layer 444 can include silicon oxide (e.g., a silicon oxide layer or a stack of layers that includes a silicon oxide layer). The thickness of the first masking layer 444 can be in a range from 3 nm to 100 nm, although lesser and greater thicknesses can also be employed.

Second-type active regions 462 can be formed on each physically exposed first-type active region 461. Second-type active regions 462 have a different composition than the first-type active regions 461. The second-type active regions 462 may have the same composition, or may have different compositions, across the light emitting regions (30G, 30R). The second-type active regions 462 can be formed by selective epitaxy of a doped compound semiconductor material such as InGaN. In one embodiment, the process conditions during deposition of the second-type active regions 462 can be selected such that the wavelength of light to be emitted from the second-type active regions 462 is optimized in a light emitting region (such as the first light emitting region 30G) in which no additional active regions are subsequently formed. In one embodiment, the wavelength of light to be emitted from the second-type active regions 462 can be the second shortest wavelength among the set of wavelengths to be employed in a direct view display device to be subsequently formed. For example, for an RGB device, the second-type active regions 462 can be configured to emit green light.

Referring to FIG. 17, the first masking layer 444 can be removed employing an etch process while maintaining at least a portion of the growth mask 42 in all light emitting regions (30G, 30B, 30R). For example, if the first masking layer 444 includes silicon oxide and the growth mask 42 includes silicon nitride, the first masking layer 444 can be removed employing hydrofluoric acid. A second masking layer 446 is deposited and patterned to cover the first light emitting region 30G and the second light emitting region 30B, while not covering the third light emitting region 30R. Alternatively, the first masking layer 444 is not removed and the second masking layer 446 is deposited on top of the first masking layer 444. The second masking layer 446 includes a dielectric material that may be the same as or different from the dielectric material of the growth mask 42. For example, the growth mask 42 can include silicon nitride, and the second masking layer 446 can include silicon oxide (e.g., a silicon oxide layer or a stack of layers that includes a silicon oxide layer) or silicon nitride. The thickness of the second masking layer 446 can be in a range from 3 nm to 100 nm, although lesser and greater thicknesses can also be employed.

Third-type active regions 463 can be formed on each physically exposed first-type active region 461 (and 462?). Third-type active regions 463 have a different composition than the first-type active regions 461 and the second-type active region 462. The third-type active regions 463 can be formed by selective epitaxy of a compound semiconductor material such as InGaN. In one embodiment, the wavelength of light to be emitted from the third-type active regions 463 can be the third shorted wavelength among the set of three wavelengths to be employed in a direct view display device to be subsequently formed. If the direct view display device is an RGB device, the third-type active regions 463 can be configured to emit red light, which has the longest wavelength among red, green, and blue lights. In this embodiment, the active regions 461, 462 and 463 may comprise indium gallium nitride with different indium content (e.g., highest indium content in region 463, the lowest indium content in region 461 and intermediate indium content in region 462). Thus, in the red LED, the first additional red semiconductor active region 463 is located on the second additional green semiconductor active region 462, which is located on the blue active region 461. In the green LED, the second additional green semiconductor active region 462 is located on the blue active region 461. In the blue LED, no additional semiconductor active regions are located on the blue active region 461.

In one embodiment, the blue LED active regions are formed first, the green LED active regions are formed second and the red LED active regions are formed third. This is advantageous because the lattice constant of the blue InGaN active material is between that of the nanowire GaN material and the green InGaN active material which has a higher indium content than that of the blue active material. The lattice constant of the green active material is between that of the blue InGaN and the red InGaN active material (which has a higher indium content than that of the green and blue InGaN active materials). This order of active region formation results in "step-up" InGaN compositions for improved strain management (i.e., decreased lattice strain)

between the regions of the device by sequentially depositing active regions of the next closest lattice constant to the underlying material.

Referring to FIG. 18, semiconductor junction layers (40G, 40B, 40R) are formed on the physically exposed outer surfaces active regions (461, 462, 463) employing any of the methods described above. Contacts can be subsequently formed to the semiconductor junction layers (40G, 40B, 40R) and to the base semiconductor layer 26 as described above. Optionally, additional spacer/buffer layers and cap layers may also be formed on each side of each active layer.

An RGB direct view display device can be provided employing the light emitting device array of the present disclosure. In this case, the first peak wavelength can be in a range from 400 nm to 495 nm; the second peak wavelength can be in a range from 495 nm to 570 nm; and the third peak wavelength can be in a range from 600 nm to 700 nm. Pixels which emit other intermediate colors of light (such as orange, cyan and/or yellow, etc.) can also be employed in addition to, or in lieu of, red, green, and blue colors.

While nanowire devices are described above, the present disclosure is not limited to nanowire devices and may include planar semiconductor LEDs containing one or more planar semiconductor layers. Thus, one embodiment of the present disclosure provides a method of making a light emitting device (LED) array, comprising forming at least one semiconductor region of a first conductivity type, forming blue active regions in blue, green and red LED regions over the least one semiconductor region of the first conductivity type, forming green active regions on the blue active regions in the green and red LED regions, forming red active regions on the green active regions in the red LED regions, and forming at least one semiconductor region of a second conductivity type over the blue, green and red active regions in the blue, green and red LED regions.

The array may comprise a direct view multicolor light emitting device that contains the blue LED, the green LED and the red LEDs in each pixel. In one embodiment, forming the at least one semiconductor region of the first conductivity type comprises forming a plurality of semiconductor nanowires of the first conductivity type, the blue, green and red active regions comprise shells (e.g., radial shells which may optionally be quantum well or multiple quantum well shells) located over the plurality of semiconductor nanowires, and forming the at least one semiconductor region of the second conductivity type comprises forming outer shell semiconductor junction layers of the second conductivity type around the blue, green and red active regions and the plurality of semiconductor nanowires.

In another embodiment, forming the at least one semiconductor region of the first conductivity type comprises forming a planar semiconductor layer of the first conductivity type, the blue, green and red active regions comprise layers (bulk layers, quantum well or multiple quantum wells) located over the planar semiconductor layer of the first conductivity type, and forming the at least one semiconductor region of the second conductivity type comprises forming at least one planar semiconductor layer of the second conductivity type over the layers which comprise the blue, green and red active regions.

The resulting a light emitting device comprises a plurality of blue, green and red light emitting diodes (LEDs), where each of the plurality of blue, green and red LEDs comprises at least one semiconductor region of a first conductivity type and at least one semiconductor region of a second conductivity type. The blue LEDs further comprise a blue active region located between the least one semiconductor region of the first conductivity type and at least one semiconductor region of the second conductivity type. The green LEDs further comprise the blue active region and a green active region located between the least one semiconductor region of the first conductivity type and at least one semiconductor region of the second conductivity type. The red LEDs further comprise the blue active region, a green active region and a red active region located between the least one semiconductor region of the first conductivity type and at least one semiconductor region of the second conductivity type.

FIG. 19 illustrates direct view display devices 200 that can be formed on a substrate 20. Each direct view display device 200 is a display device in which each pixel 25 includes at least one light source that generates light from within upon application of a suitable electrical bias. As in the direct view display devices 200 illustrated in FIG. 1, an array of pixels 25 can be fabricated directly on the substrate 20 by semiconductor fabrication methods without employing bonding of an additional substrate or transfer of dies such as light emitting diode dies. Each pixel 25 includes at least one first-type light emitting diode 10B (such as at least one blue-light-emitting diode) that emits light at a first peak wavelength (such as a peak wavelength in a range from 400 nm to 495 nm), at least one second-type light emitting diode 10B (such as at least one green-light-emitting diode, for example two green-light-emitting diodes) that emits light at a second peak wavelength (such as a peak wavelength in a range from 495 nm to 570 nm), and at least one third-type light emitting diode 10R (such as at least one red-light-emitting diode 10R) that emits light at a third peak wavelength (such as a peak wavelength in a range from 600 nm to 700 nm). Each light emitting diode (10B, 10G, 10R) can have a planar structure in which each material layer is a planar material layer and each junction is a horizontal p-i-n or p-n junction located within a respective horizontal plane (i.e., a horizontal plane is parallel to the top surface of the substrate). There may be any suitable number of sub-pixels per pixel, such as three or more sub-pixels, for example four to six sub-pixel. For example, each pixel may contain one red light emitting sub-pixel, one blue light emitting sub-pixel and two green light emitting sub-pixels for example, for a total of four sub-pixels per pixel.

Referring to FIGS. 20A and 20B, a fourth exemplary structure is illustrated, which corresponds to an area of a single pixel 25 in a direct view display device 200 of FIG. 19 at the beginning of a manufacturing process, i.e., prior to formation of the light emitting devices thereoupon. A substrate 20 is provided, which can be a growth substrate 22 (such as a sapphire substrate), a buffer semiconductor layer 24 (such as a GaN layer, an AlN layer, an AlGaN layer, graded variants thereof, or a stack thereof), and a base semiconductor layer 26. The base semiconductor layer 26 may be a semiconductor layer of a first conductivity type, e.g., an n-type layer, such as an n-doped GaN layer. The base semiconductor layer 26 and the buffer semiconductor layer 24 are semiconductor material layers. The substrate 20 may be positioned such that the top surface of the base semiconductor layer 26 is within a horizontal plane (i.e., parallel to the top surface of the substrate 20). The substrate 20 can have a first light emitting region 30B, a second light emitting region 30G, and a third light emitting region 30R. The shape of each pixel (corresponding to the area illustrated in FIG. 20A) can be rectangular, triangular, hexagonal, or can be of any geometrical shape that can be replicated with periodicity in a two-dimensional plane. In one embodiment, each pixel can have a rectangular shape such that each side has a length in a range from 3 micron to 30 microns, although lesser and greater lengths can also be employed.

Referring to FIGS. 21A and 21B, a first-type active region layer 561L can be formed over the base semiconductor layer 26, which is a semiconductor material layer. The first-type active region layer 561L can have the same composition as the first-type active region 461 described above, and can be formed employing the same deposition method as the deposition method employed to form the first-type active regions 461. The first-type active region layer 561L is formed as a planar layer having a uniform thickness, which can be in a range from 5 nm to 30 nm, although lesser and greater thicknesses can also be employed. The first-type active region layer 561L can be formed as a single crystalline doped semiconductor material layer in epitaxial alignment with the single crystalline semiconductor material of the base semiconductor layer 26.

Referring to FIGS. 22A and 22B, a first masking layer 571 can be formed on a portion of the first-type active region layer 561L in the first light emitting region 30B. The first masking layer 571 can have the same composition as, and the same thickness as, the masking layer 46 or the masking layer stack (44, 46) described above. The first masking layer 571 can be deposited as a blanket film (i.e., an unpatterned film), and can be patterned to cover the area of the first light emitting region 30B, for example, by a combination of lithographic methods and an etch process that etches the material of the first masking layer 571 selective to the semiconductor material of the first-type active region layer 561L.

A second-type active region layer 562L can be formed on the physically exposed surface of the first-type active region layer 561L. The second-type active region layer 562L can have the same composition as the second-type active region 462 described above, and can be formed employing the same deposition method as the deposition method employed to form the second-type active regions 462. The second-type active region layer 562L is formed as a planar layer having a uniform thickness, which can be in a range from 5 nm to 30 nm, although lesser and greater thicknesses can also be employed. The second-type active region layer 562L can be formed as a single crystalline doped semiconductor material layer in epitaxial alignment with the single crystalline semiconductor material of the first-type active region layer 561L.

Figures 23A, 23B:
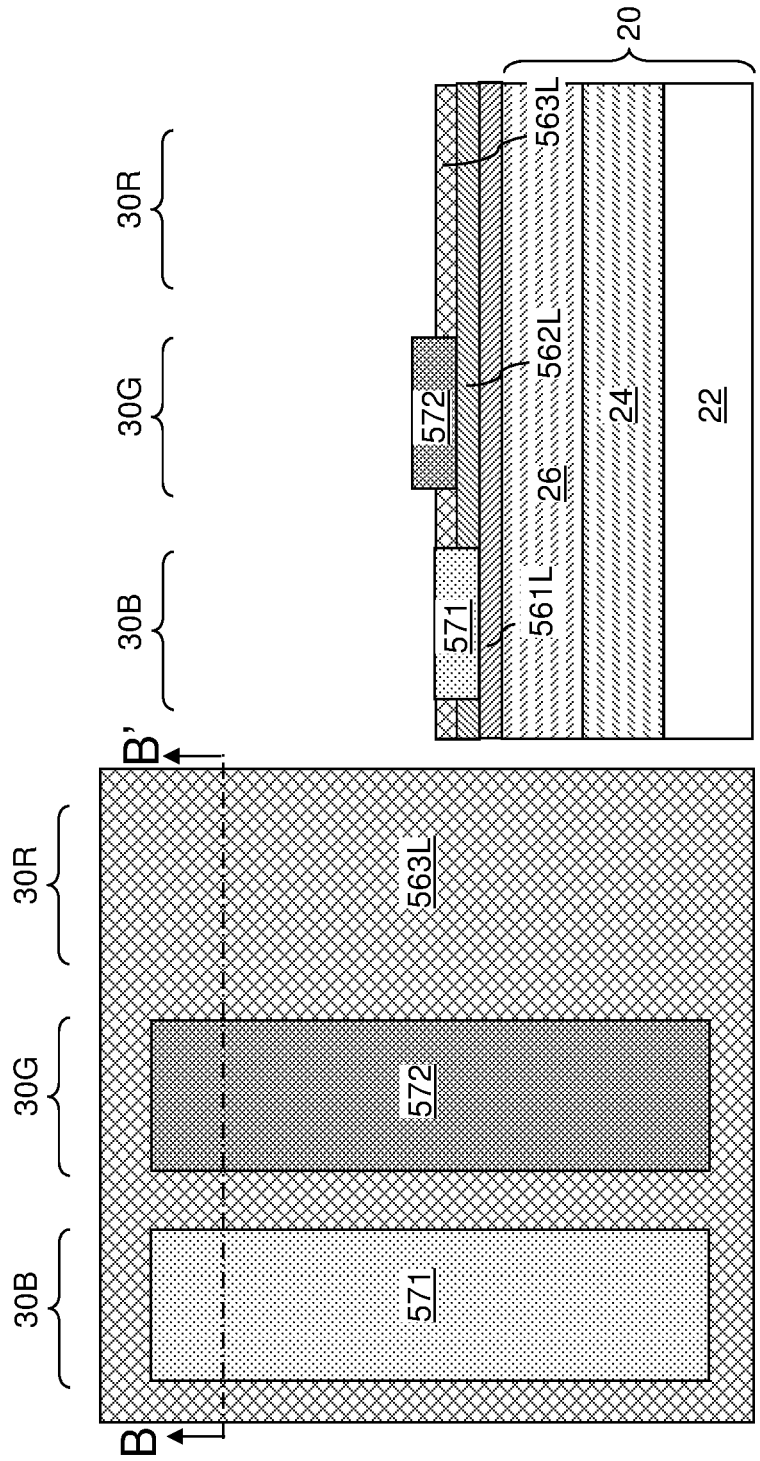
FIG. 23A is a plan view of the fourth exemplary structure after formation of a second masking layer and a third-type active region layer according to an embodiment of the present disclosure.
FIG. 23B is a vertical cross-sectional view along the vertical plane B-B' of FIG. 23A.

Referring to FIGS. 23A and 23B, a second masking layer 572 can be formed on a portion of the second-type active region layer 562L in the second light emitting region 30G. The second masking layer 572 can have the same composition as, and the same thickness as, the masking layer 46 or the masking layer stack (44, 46) described above. The second masking layer 572 can be deposited as a blanket film (i.e., an unpatterned film), and can be patterned to cover the area of the second light emitting region 30B, for example, by a combination of lithographic methods and an etch process that etches the material of the second masking layer 572 selective to the semiconductor material of the second-type active region layer 562L.

A third-type active region layer 563L can be formed on the physically exposed surface of the second-type active region layer 562L. The third-type active region layer 563L can have the same composition as the third-type active region 463 described above, and can be formed employing the same deposition method as the deposition method employed to form the third-type active regions 463. The third-type active region layer 563L is formed as a planar layer having a uniform thickness, which can be in a range from 5 nm to 30 nm, although lesser and greater thicknesses can also be employed. The third-type active region layer 563L can be formed as a single crystalline doped semiconductor material layer in epitaxial alignment with the single crystalline semiconductor material of the second-type active region layer 562L.

The first-type active region layer 561L, the second-type active region layer 562L, and the third-type active region layer 563L of the fourth embodiment can have the same composition as the first-type active regions 461, the second-type active regions 462, and the third-type active regions 463 of the third embodiment. In the fourth embodiment, the first-type active region layer 561L, the second-type active region layer 562L, and the third-type active region layer 563L are formed as planar layers having a respective horizontal top surface that is parallel to a horizontal top surface of the base semiconductor layer 26 (which is a semiconductor material layer). In the third embodiment, semiconductor nanowires (32B, 32G, 32R) that extend vertically from a top surface of the base semiconductor layer 26 (which is a semiconductor material layer) are formed, and a first-type active region layer including a first-type active region 461 is formed on sidewalls of each semiconductor nanowire (32B, 32G, 32R) as illustrated in FIG. 15. In the third embodiment, a second-type active region layer including a second-type active region 462 is formed on sidewalls of each physically exposed first-type active region layer as illustrated in FIG. 16. In the third embodiment, a third-type active region layer including a third-type active region 463 is formed on sidewalls of each physically exposed second-type active region layer as illustrated in FIG. 17.

Figures 24A, 24B:
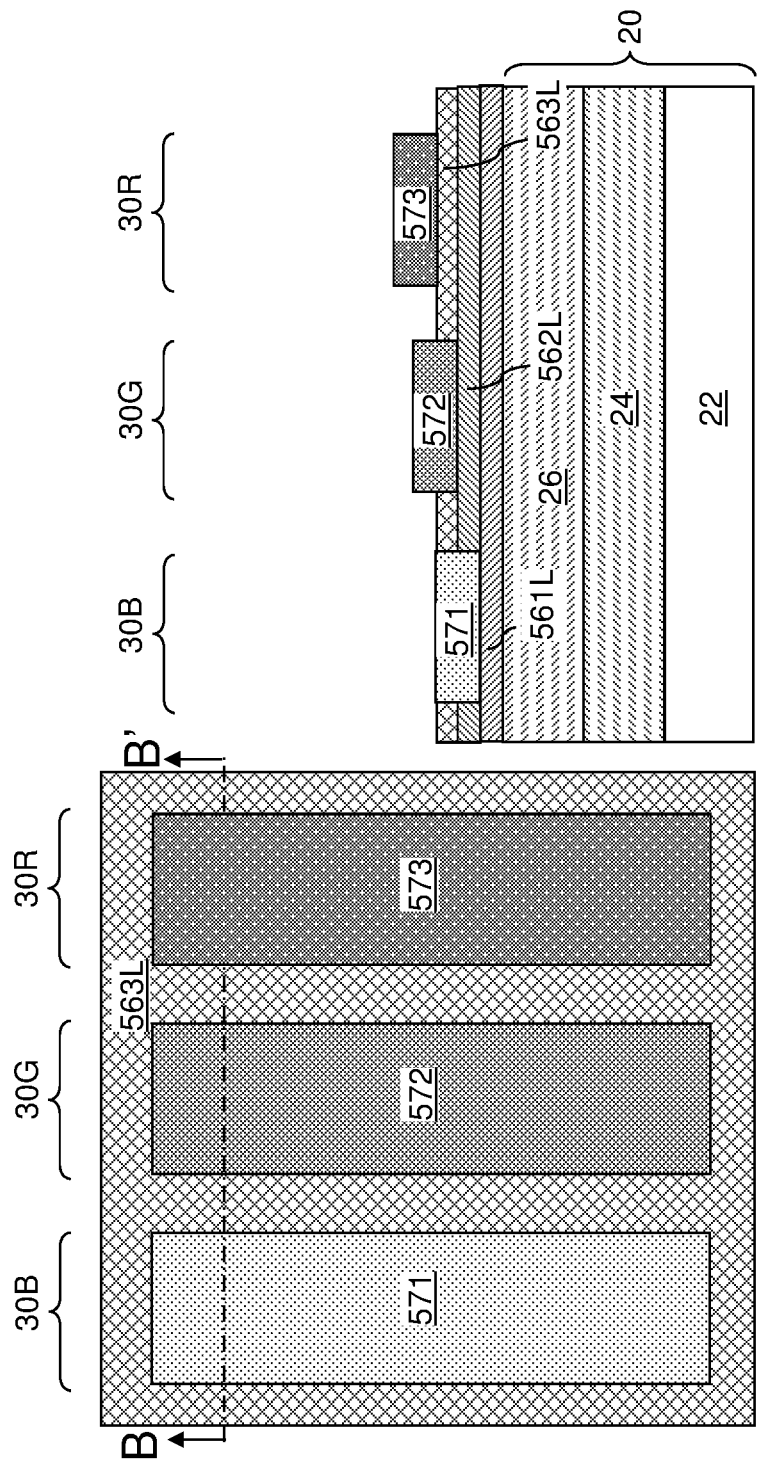
FIG. 24A is a plan view of the fourth exemplary structure after formation of a third masking layer according to an embodiment of the present disclosure.
FIG. 24B is a vertical cross-sectional view along the vertical plane B-B' of FIG. 24A.

Referring to FIGS. 24A and 24B, a third masking layer 573 can be formed on a portion of the third-type active region layer 563L in the third light emitting region 30R. The third masking layer 573 can have the same composition as, and the same thickness as, the masking layer 46 or the masking layer stack (44, 46) described above. The third masking layer 573 can be deposited as a blanket film (i.e., an unpatterned film), and can be patterned to cover the area of the third light emitting region 30R, for example, by a combination of lithographic methods and an etch process that etches the material of the third masking layer 573 selective to the semiconductor material of the third-type active region layer 563L.

Figures 25A, 25B:
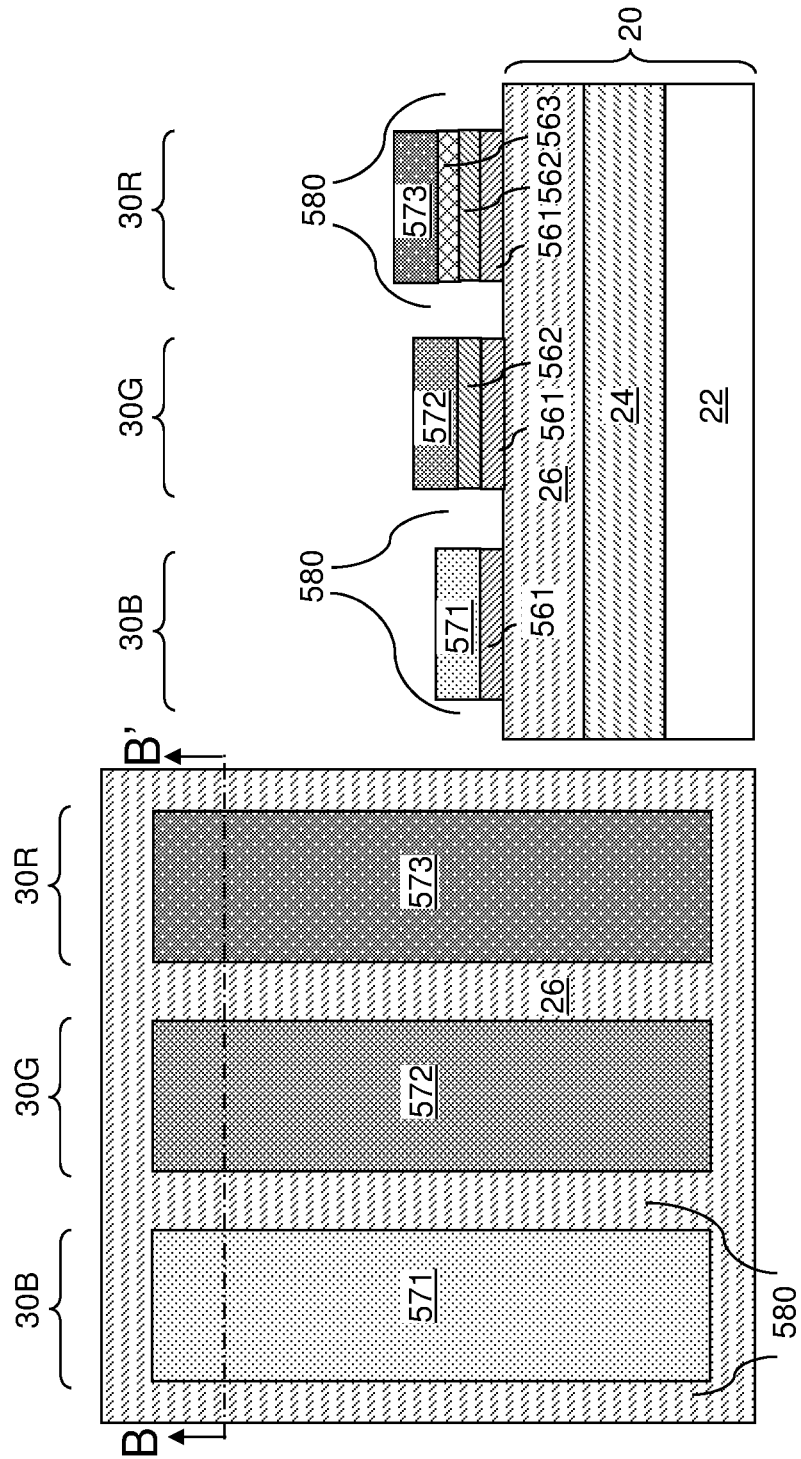
FIG. 25A is a plan view of the fourth exemplary structure after patterning the active region layers according to an embodiment of the present disclosure.
FIG. 25B is a vertical cross-sectional view along the vertical plane B-B' of FIG. 25A.

Referring to FIGS. 25A and 25B, an etch process can be optionally performed. The etch process etches the materials of the third-type active region layer 563L, the second-type active region layer 562L, and the first-type active region layer 561L selective to the materials of the first, second, and third masking layers (571, 572, 573) can be performed to remove the portions of the active region layers (561L, 562L, 563L) in the field region 580 that are not covered by the first, second, and third masking layers (571, 572, 573). A top surface of the base semiconductor layer 26 can be physically exposed in the field region 580 between areas covered by the first, second, and third masking layers (571, 572, 573). Each remaining portion of the first-type active region layer 561L constitutes an instance of a first-type active region 561. Each remaining portion of the second-type active region layer 562L constitutes an instance of a second-type active region 562. Each remaining portion of the third-type active region layer 563L constitutes an instance of a third-type active region 563. Excess growth may occur at the edge portions of layers 562L and 563L adjacent to the sidewalls of the masking layers 571 and 572. However, since the edge portions of these layers are removed during the etching step shown in FIG. 25B, the excess growth does not significantly affect completed device.

Referring collectively to FIGS. 15, 16, 17, 25A, and 25B, the third embodiment and the fourth embodiment provides different material stacks in different light emitting regions (30B, 30G, 30R). A first instance of the first-type active region (461, 561) is formed over the base semiconductor layer 26 in the first light emitting region 30B. A stack of a second instance of the first-type active region 561 and a first instance of the second-type active region 562 is formed over the base semiconductor layer 26 in the second light emitting region 30G. A stack of a third instance of the first-type active region 561, a second instance of the second-type active region 562, and an instance of the third-type active region 563 is formed over the base semiconductor layer 26 in the third light emitting region 30R.

In the third and fourth embodiments, each instance of the first-type active region (461, 561) can comprise indium gallium nitride active regions, each instance of the second-type active region (462, 562) can comprise indium gallium nitride active regions having a lower indium concentration than the first-type active region, each instance of the first-type active region (461, 561), each instance of the second-type active region (462, 562), and each instance of the third-type active region (463, 563) can be single crystalline and epitaxially aligned to one another. Thus, region 561 is part of the blue emitting LED, regions 561 and 562 are part of the green emitting LED and regions 561, 562 and 563 are part of the red emitting LED.

In some embodiments, the first-type active region (461, 561) can comprise a bulk or quasi-bulk $In_xGa_{1-x}N$ layer or one or more quantum wells having GaN or AlGaN barrier layers and an $In_xGa_{1-x}N$ well layer, wherein x is a real number between 0 and 1. The second-type active region (462, 562) can comprise a bulk or quasi-bulk $In_yGa_{1-y}N$ layer or one or more quantum wells having GaN or AlGaN barrier layers and an $In_yGa_{1-y}N$ well layer, wherein y is a real number between 0 and 1. The third-type active region (463, 563) can comprise at least one bulk, quasi-bulk or quantum well layer selected from aluminum gallium arsenide; aluminum gallium indium phosphide; gallium arsenide phosphide; gallium phosphide; $In_zGa_{1-z}N$, wherein $0.4 \leq z \leq 0.5$, when x and y are less than or equal to 0.3; red emitting dilute III-nitride semiconductor having a formula $In_wGa_{1-w}P_{1-u-v}As_uN_v$, wherein w and u are real numbers between 0 and 1, and $0.01 \leq v \leq 0.1$; and europium doped gallium nitride.

Figures 26A, 26B:
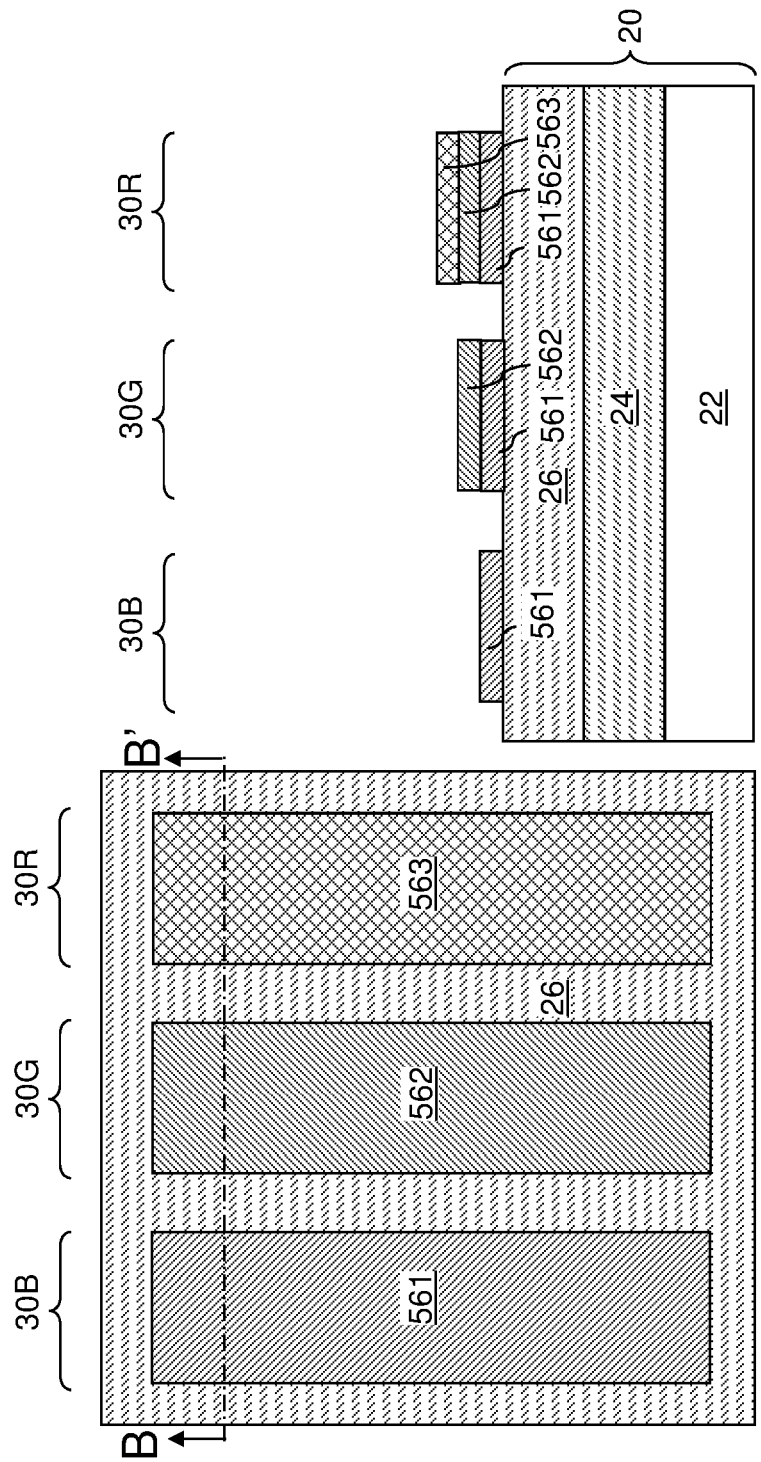
FIG. 26A is a plan view of the fourth exemplary structure after removing the masking layers according to an embodiment of the present disclosure.
FIG. 26B is a vertical cross-sectional view along the vertical plane B-B' of FIG. 26A.

Referring to FIGS. 26A and 26B, the masking layers (571, 572, 573) can be removed selective to the semiconductor materials of the active regions (561, 562, 563) and the base semiconductor layer 26. For example, if the masking layers (571, 572, 573) include silicon oxide, a wet etch employing hydrofluoric acid can be employed to remove the masking layers (571, 572, 573). If the masking layers (571, 572, 573) include silicon nitride, a wet etch employing phosphoric acid can be employed to remove the masking layers (571, 572, 573).

In an alternative embodiment shown in FIGS. 26C-26G, rather than using etch masking layers 571, 572 and 573, lift off masking layers (571, 572) may be used instead. In this embodiment, rather than selectively growing semiconductor second-type and third-type active region layers 562L and 563L on exposed portions of the underlying semiconductor layers, the lift off masking layers (571, 572) are formed first followed by the active region layers (562L, 563L) formed non-selectively over the lift off masking layers (571, 572) and the underlying semiconductor layers (561L, 562L), followed by a lift off process.

Figure 26C:
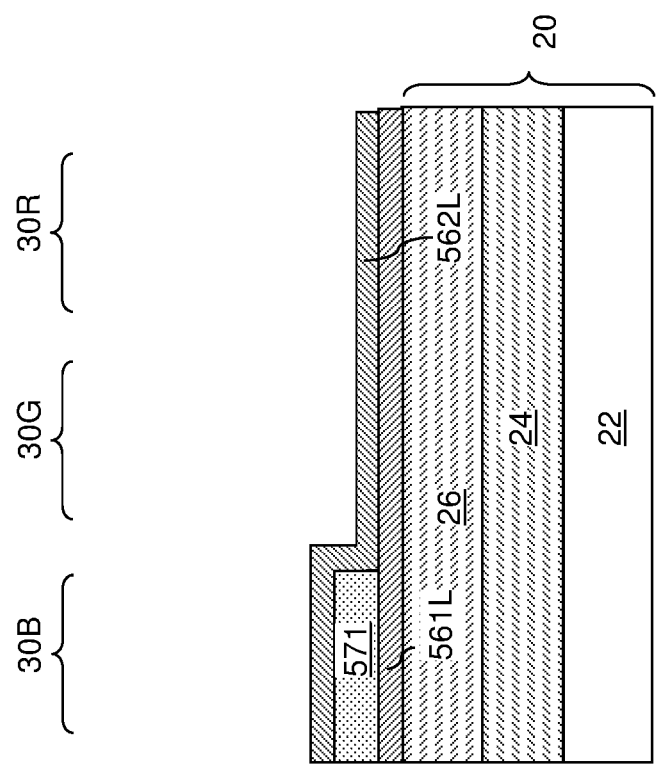

For example, as shown in FIG. 26C, the first-type active region layer 561L is formed as a planar layer having a uniform thickness in first, second and third type regions (30B, 30G, 30R). A first lift off masking layer 571 is formed over the first-type active region layer 561L in the first type region 30B. The second-type active region layer 562L is then formed as a planar layer over the first lift off masking layer 571 in the first type region 30B and on the exposed portions of the first-type active region layer 561L in the second type region 30G and in the third type region 30R.

Figure 26D:
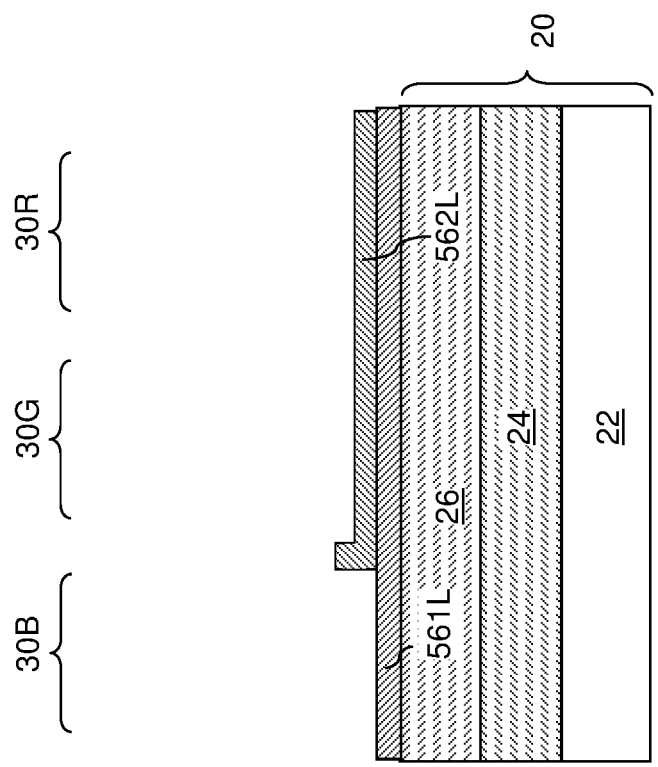

Referring to FIG. 26D, a first lift-off process is performed to remove the first lift off masking layer 571, thereby removing the portion of the second-type active region layer 562L from the first type region 30B.

Figure 26E:
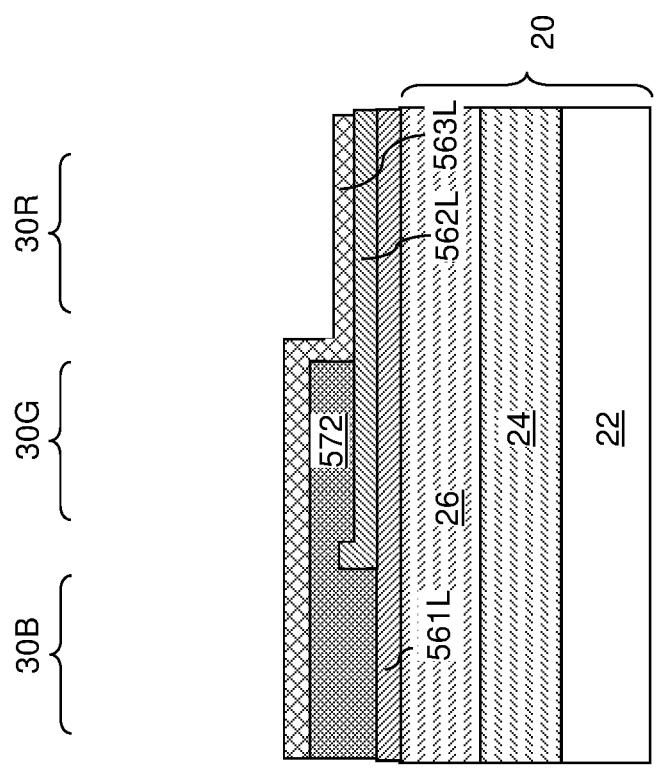

Referring to FIG. 26E, a second lift off masking layer 572 is formed over the second-type active region layer 562L in the second type region 30G and over the first-type active region layer 561L in the first type region 30B. A third-type active region layer 563L is then formed as a planar layer over the second lift off masking layer 572 in the first and second type regions (30B, 30G) and on the exposed portions of the second-type active region layer 562L in the third type region 30R.

Figure 26F:
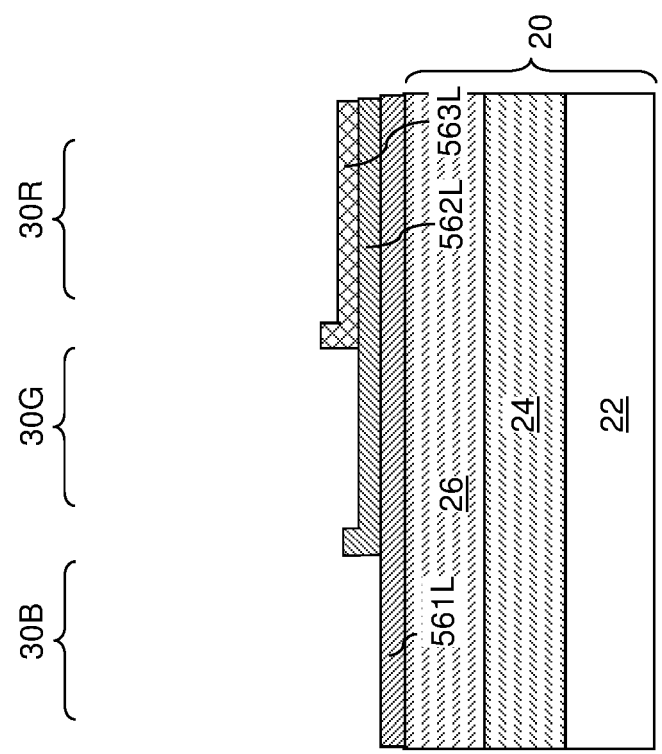

Referring to FIG. 26F, a second lift-off process is performed to remove the second lift off masking layer 572, thereby removing the portion of the third-type active region layer 563L from the first type region 30B and the second type region 30G.

Referring to FIG. 26G, a lithographically patterned etch mask 267 (which may be a patterned photoresist layer) is formed over the stack of the various active region layers (561L, 562L, 563L). An etch process (which may include an anisotropic etch such as a reactive ion etch or an isotropic etch such as a wet etch) may be performed to form the various active regions (561, 562, 563) illustrated in FIGS. 26A and 26B. The lithographically patterned etch mask 267 can be subsequently removed, for example, by ashing.

Figure 26H:
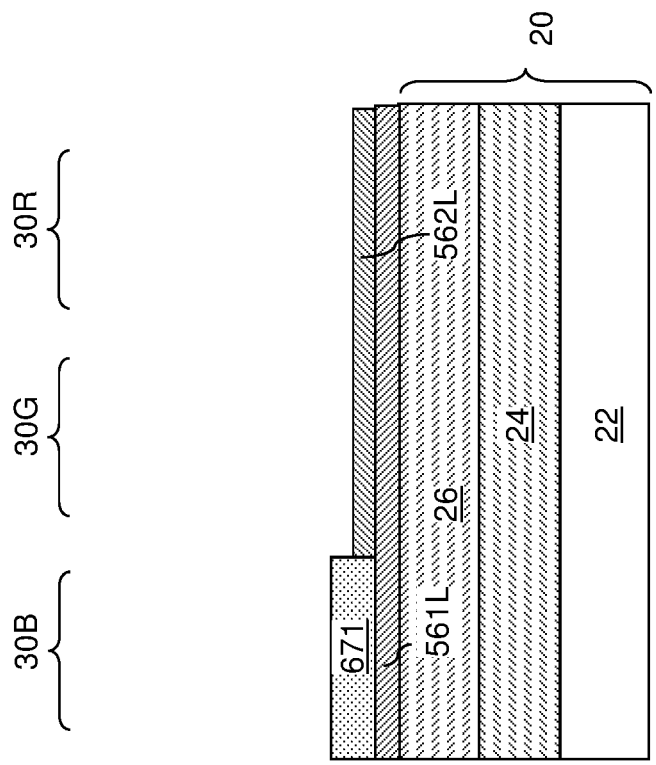
FIGS. 26H-26J are sequential vertical cross-sectional views of another alternative embodiment of the fourth exemplary structure during formation of multiple types of active regions according to an embodiment of the present disclosure.
Figure 26I:
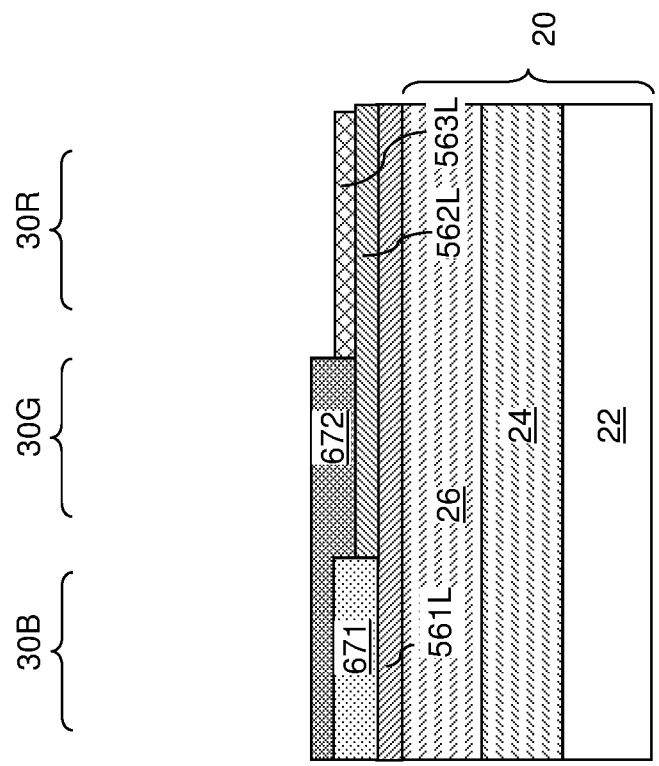
Figure 26J:
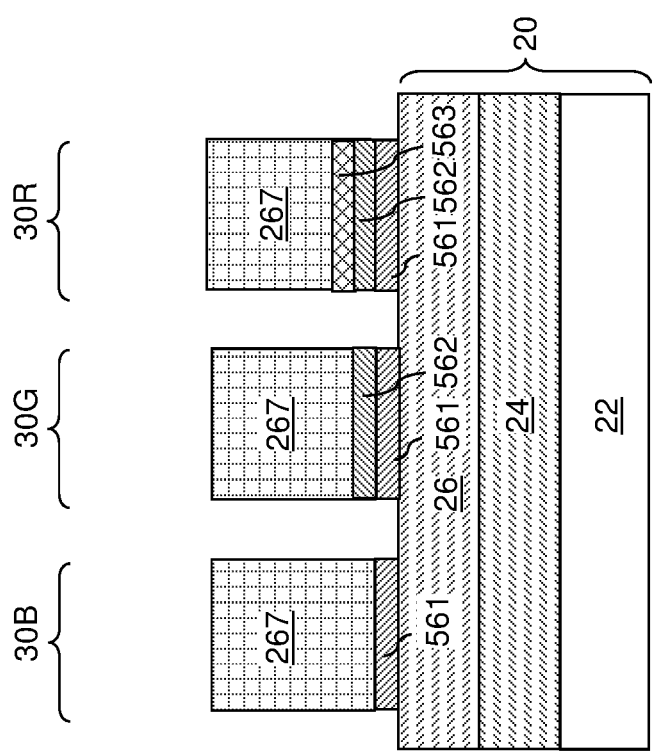

In another alternative embodiment shown in FIGS. 26H-26J, dielectric masking layers (671, 672) may be used instead of etch masking layers 571, 572 and 573. In this case, a selective epitaxy (e.g., selective area growth) process can be employed to prevent deposition of a single crystalline semiconductor material on the dielectric masking layers (671, 672).

For example, as shown in FIG. 26H, the first-type active region layer 561L is formed as a planar layer having a uniform thickness in first, second and third type regions (30B, 30G, 30R). A first dielectric masking layer 671 comprising a dielectric material such as silicon oxide is formed over the first-type active region layer 561L in the first type region 30B. The first dielectric masking layer 671 can be deposited over the entire first-type active region layer 561L and then patterned by photolithography and etching to remain only in the first type region 30B and expose the second and third type regions (30G, 30R). The second-type active region layer 562L is then formed by a first selective epitaxy process as a planar layer on the exposed portions of the first-type active region layer 561L in the second type region 30G and in the third type region 30R but not on the first dielectric masking layer 671.

Referring to FIG. 26I, a second dielectric masking layer 672 comprising a dielectric material such as silicon oxide is formed over the second-type active region layer 562L in the second type region 30G and optionally over first dielectric masking layer 671 in the first type region 30B. The second dielectric masking layer 672 can be deposited over the entire second-type active region layer 562L (and optionally over the first dielectric masking layer 671) and then patterned by photolithography and etching to remain only in the first and second type regions (30B, 30G) and expose the third type region 30R. A third-type active region layer 563L is then formed as a planar layer by a second selective epitaxy process on the exposed portions of the second-type active region layer 562L in the third type region 30R but not on the second dielectric masking layer 672. The second-type and/or third-type active region layers may be formed by pulsed MOCVD to increase selectivity of the deposition.

Subsequently, the second dielectric masking layer 672 and the first dielectric masking layer 671 are removed, for example, by an isotropic etch. For example, if the second dielectric masking layer 672 and the first dielectric masking layer 671 include silicon oxide, a wet etch employing hydrofluoric acid can be employed to remove the second dielectric masking layer 672 and the first dielectric masking layer 671.

Alternatively, the first dielectric masking layer 671 is removed after formation of the second-type active region layer 562L and before formation of the second dielectric masking layer 672. In this case, the second dielectric masking layer 672 is formed on the exposed first-type active region layer 561L and on a portion of the second-type active region layer 562L. The second dielectric masking layer 672 is then removed after growth of third-type active region layer 563L, as described above. Thus, the second masking layer 672 is removed after the step of selectively growing the third semiconductor layer, while the first masking layer 671 can be removed layer before, after and/or during the step of removing the second masking layer 672.

Referring to FIG. 26J, a lithographically patterned etch mask 267 (which may be a patterned photoresist layer) is formed over the stack of the various active region layers (561L, 562L, 563L). An etch process (which may include an anisotropic etch such as a reactive ion etch or an isotropic etch such as a wet etch) may be performed to form the various active regions (561, 562, 563) illustrated in FIGS. 26A and 26B. The lithographically patterned etch mask 267 can be subsequently removed, for example, by ashing.

In an alternative embodiment, a combination of the liftoff method of FIGS. 26C-26G and the selective area growth method of FIGS. 26H-26J may be used. For example, if the second-type and/or third-type active region layers comprise indium gallium nitride deposited on an underlying gallium nitride material, then these active region layers may extend slightly over the respective first and second masking layers in the selective area growth method. In this case, the masking layers may be lifted off as described with regard to FIGS. 26C-26G to remove the portions of the second-type and/or third-type active regions layers from the respective first and second masking layers.

The lateral dimensions of each of the various active regions (561, 562, 563) illustrated in FIGS. 26A, 26B, 26G, and 26J can be in a range from 1 micron to 100 microns, such as from 3 microns to 30 microns. The thickness of each layer in the various active regions (561, 562, 563) can be in a range from 2 nm to 60 nm, such as from 6 nm to 20 nm, although lesser and greater thicknesses can also be employed.

Referring to FIGS. 27A and 27B, a continuous semiconductor junction layer 50L can be deposited on the physically exposed top surfaces of the active regions (561, 562, 563) formed by the etching or the lift off method described above. The continuous semiconductor junction layer 50L can include the same material as the semiconductor junction layers (40B, 40G, 40R) of the previously described embodiments. The continuous semiconductor junction layer 50L includes a doped semiconductor material having an opposite type of doping than the base layer 26 (e.g., if layer 26 is an n-type layer, then layer 50L is a p-type layer, such as a p-type GaN layer, and vise-versa). If the active regions (561, 562, 563) comprise intrinsic semiconductor regions, then a p-i-n junction is formed between the continuous semiconductor junction layer 50L and the semiconductor base layer 26. If the active regions comprise doped semiconductor regions, then a p-n junction is formed at each interface between the continuous semiconductor junction layer 50L and the active regions (561, 562, 563). The thickness of the continuous semiconductor junction layer 50L can be in a range from 30 nm to 300 nm, although lesser and greater thicknesses can also be employed.

Referring to FIGS. 28A and 28B, a masking layer 579 is formed over the continuous semiconductor junction layer 50L to cover areas of the light emitting regions (30B, 30G, 30R).

The masking layer 579 can have the same composition as the same composition as, and the same thickness as, the masking layer 46 or the masking layer stack (44, 46) described above. In one embodiment, the pattern of the masking layer 579 can be substantially the same as the combined patterns of the first, second, and third masking layers (571, 572, 573). Portions of the continuous semiconductor junction layer 50L in the field region 580 that are not covered by the masking layer 579 can be removed by an isolation etch process that etches the semiconductor material of the continuous semiconductor junction layer 50L selective to the material(s) of the masking layer 579. The remaining portion of the continuous semiconductor junction layer 50L in the first light emitting region 30B is herein referred to as a first semiconductor junction layer 50B, the remaining portion of the continuous semiconductor junction layer 50L in the second light emitting region 30G is herein referred to as a second semiconductor junction layer 50G, and the remaining portion of the continuous semiconductor junction layer 50L in the third light emitting region 30R is herein referred to as a third semiconductor junction layer 50R. In case the processing step of FIGS. 25A and 25B is omitted, the etch process of FIGS. 28A and 28B can be extended in duration to remove portions of the active region layers (561L, 562L, 563L) from regions outside of the light emitting regions (30B, 30G, 30R).

Figure 30B:
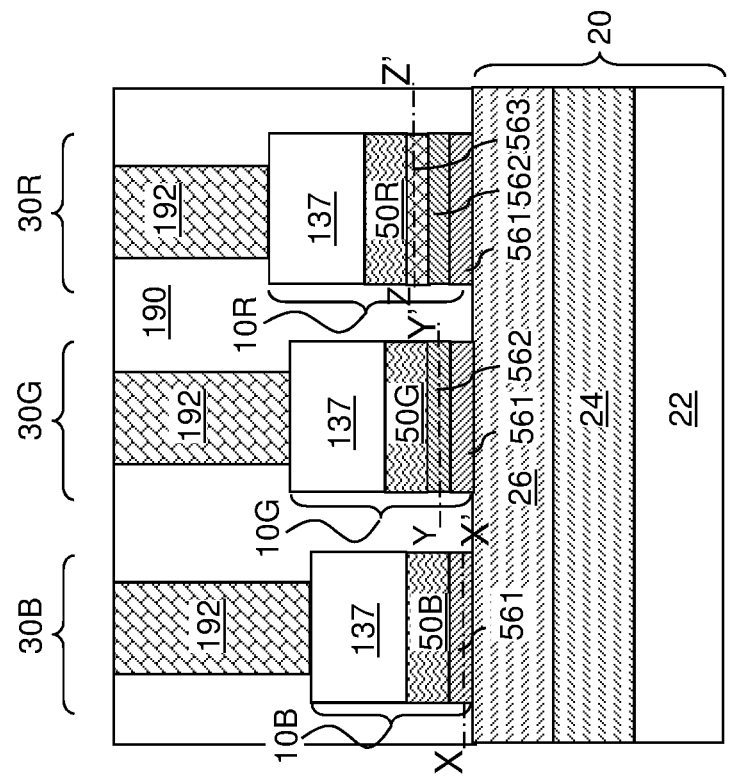
FIG. 30B is a vertical cross-sectional view along the vertical plane B-B' of FIG. 30A.

As shown in FIGS. 29B and 30B, a light emitting device includes first, second and third light emitting diodes (10B, 10G, 10R). The first light emitting diode 10B includes a first stack containing a first-type active region 561, a first portion 50B of the semiconductor junction layer SOL and a first portion of the transparent conductive layer 137. The first LED 10B is configured to emit light at a first peak wavelength (e.g., blue light wavelength).

The second light emitting diode 10G includes a second stack containing the first-type active region 561, the second-type active region 562 having a different composition than the first-type active region, a second portion 50G of the semiconductor junction layer 50L and a second portion of the transparent conductive layer 137. The second LED 10G is configured to emit light at a second wavelength (e.g., green light wavelength) that is different from the first wavelength.

The third light emitting diode 10R includes a third stack containing the first-type active region 561, the second-type active region 562, the third-type active region 563 having a different composition from the first and second-type active regions, a third portion 50R of the semiconductor junction layer 50L and a third portion of the transparent conductive layer 137. The third LED is configured to emit light at a third wavelength (e.g., red light wavelength) that is different from the first and second wavelengths. The second-type active region 562 contacts the third-type active region 563 in the third stack located in the third LED 10R.

The device may also include the semiconductor base layer 26 of the first conductivity type located below the first, second and third stacks. The semiconductor base layer 26 comprises a continuous layer of the first conductivity type.

As noted above, the first 50B, second 50G and third 50R portions of the semiconductor junction layer 50L of the second conductivity type are located above the respective first-type 561, second-type 562 and third-type 563 active regions in the respective first, second and third stacks. The first 50B, second 50G and third 50R portions of the semiconductor junction layer have the same composition and the same thickness.

Figure 30A:
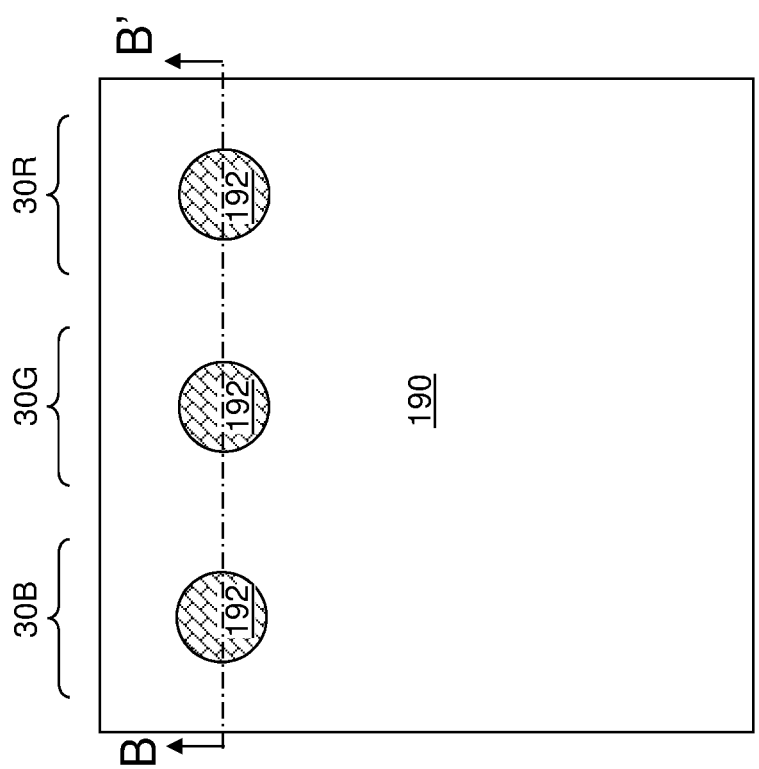
FIG. 30A is a plan view of the fourth exemplary structure after forming contact via structures according to an embodiment of the present disclosure.

The semiconductor base layer 26 and the first 50B, second 50G and third 50R portions of the semiconductor junction layer SOL form first, second and third p-i-n junctions in the respective first, second and third stacks. Each of the first, second, and third p-i-n junctions includes a respective horizontal surface that is parallel to a top surface of the semiconductor base layer 26. As shown in FIGS. 30A and 30B, the horizontal plane Y-Y' located in the second p-i-n junction is located above a horizontal plane X-X' located in the first p-i-n junction. The horizontal plane located in the second p-i-n junction Y-Y' is located below a horizontal plane Z-Z' located in the third p-i-n junction.

The first, second and third portions of a transparent conductive layer 137 contact the respective first 50B, second 50G, and third 50R portions of the semiconductor junction layer 50L. Contact via structures 192 contact the first, second and third portions of the transparent conductive layer 137.

In the case of the third and fourth exemplary structures, the second wavelength (e.g., green light wavelength) can be longer than the first wavelength (e.g., blue light wavelength), and can be shorter than the third wavelength (e.g., red light wavelength). In one embodiment, the light emitting device can comprises a direct view display device, each instance of the first-type active region (461, 561) can comprise an indium gallium nitride active region; each instance of the second-type active region (462, 562) can comprise an indium gallium nitride active region having a lower indium concentration than the first-type active region (461, 561); and the semiconductor base layer 26, the first-type active region (461, 561), the second-type active region (462, 562), and the third-type active region (463, 563) can be single crystalline and epitaxially aligned to one another.

In an alternative aspect of the fourth embodiment, only one or more of the active regions may comprise planar layers, while another one or more of the active regions may comprise shells around a nanowire, as described with respect to the prior embodiment. Thus, the device may contain planar active regions emitting one or more light colors and nanowire shell active regions emitting one or more additional colors.

While the methods described above were directed to a light emitting device, the methods may be used for any other type of semiconductor device. The method of making a semiconductor device may include forming a first semiconductor layer 561, and forming a first masking layer 571 on a first portion of the first semiconductor layer, as shown in FIGS. 22A and 22B.

The method may also include forming a second semiconductor layer 562 on a second portion of the first semiconductor layer 561 exposed by the first masking layer 571, while the first masking layer 571 is located on the first portion of the first semiconductor layer 561, and forming a second masking layer 572 on a first portion of the second semiconductor layer 562, as shown in FIGS. 23A and 23B.

The method may also include forming a third semiconductor layer 563 on a second portion of the second semiconductor layer exposed by the second masking layer 572, while the first masking layer 571 is located on the first portion of the first semiconductor layer and the second masking layer 572 is located on the first portion of the second semiconductor layer. A third masking layer 573 is formed on a first portion of the third semiconductor layer 563, while a second portion of the third semiconductor layer is exposed, as shown in FIGS. 24A and 24B.

The first, the second and third semiconductor layers (561, 562, 563) are then etched to form first, second and third stacks, as shown in FIGS. 25A and 25B. Thus, in the above method, rather than etching each layer individually using a separate masking layer, the semiconductor layers and masking layers are alternately formed followed by etching all of the semiconductor layers using all of the masking layers located in different device levels. This process uses a smaller number of steps than the method in which each layer is etched individually using a separate mask.

In one embodiment, etching the first, second and third semiconductor layers to form the first, second and third stacks includes etching the exposed second portion of the third semiconductor layer 563 using the third masking layer 573 as a mask, etching parts of the second portion of the second semiconductor layer 562 exposed by the third and the second masking layers (573, 572) using the third and the second masking layers as a mask, and etching parts of the second portion of the first semiconductor layer 561 exposed by the third, second and first masking layers (573, 572, 571) using the third, second and first masking layers as a mask, as shown in FIG. 25B. The first, second and third masking layers are then removed, as shown in FIG. 26B.

If the semiconductor device comprises a light emitting device, such as a direct view display, then the first-type active region of the light emitting device contains the first semiconductor layer 561, the second-type active region of the light emitting device contains the first and the second semiconductor layers (561, 562), and the third-type active region of the light emitting device comprises the first, the second and the third semiconductor layers (561, 562, 563).

The first semiconductor layer is a single crystal semiconductor layer located over a substrate 22 (e.g., epitaxially grown on the single crystal semiconductor base layer 26). The second semiconductor layer 562 is epitaxially grown on the second portion of the first semiconductor layer 561 adjacent to the sides of the first masking layer 571. The third semiconductor layer 563 is epitaxially grown on the second portion of the second semiconductor layer 562 adjacent to the sides of second masking layer 572. A single crystal semiconductor junction layer 50L of a second conductivity type can be formed over the first-type active region, the second-type active region, and the third-type active region; and patterned such that a first portion 50B of the semiconductor junction layer is located on the first semiconductor layer 561 in the first-type active region, a second portion 50G of the semiconductor junction layer is located on the second semiconductor layer 562 in the second-type active region; and a third portion 50R of the semiconductor junction layer is located on the third semiconductor layer 563 in the third-type active region.

According to another aspect of the present disclosure, a mix-and-match configuration of the various light emitting diodes first exemplary structure, the second exemplary structure, and the third exemplar structure is provided. In this case, at least one light emitting diode emitting light at a respective peak wavelength in one of the first, second, and third exemplary structures is combined with at least another light emitting diode emitting light at a different peak wavelength on a same substrate to provide a direct view display pixel. In an illustrative example, at least one planar LED epitaxial structure for one or more of the colors (e.g., red) of a direct view display pixel is combined with at least one nanowire LED structure for the remaining colors (e.g., blue and green) of the direct view display device.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A light emitting device, comprising:
a plurality of blue, green and red light emitting diodes (LEDs), wherein each of the plurality of blue, green and red LEDs comprises at least one semiconductor region of a first conductivity type and at least one semiconductor region of a second conductivity type;
wherein:
the blue LEDs further comprise a blue active region located between the least one semiconductor region of the first conductivity type and at least one semiconductor region of the second conductivity type;
the green LEDs further comprise the blue active region and a green active region located between the least one semiconductor region of the first conductivity type and at least one semiconductor region of the second conductivity type; and
the red LEDs further comprise the blue active region, a green active region and a red active region located between the least one semiconductor region of the first conductivity type and at least one semiconductor region of the second conductivity type.

2. The device of claim 1, wherein:
the green active region and the red active region each have a thickness of 1 to 100 nm; and
the device comprises a direct view multicolor light emitting device that contains the blue LED, the green LED and the red LEDs in each pixel.

3. The device of claim 1, wherein:
the at least one semiconductor region of the first conductivity type comprises a plurality of semiconductor nanowires of the first conductivity type;
the blue, green and red active regions comprise shells located over the plurality of semiconductor nanowires; and
the at least one semiconductor region of the second conductivity type comprises outer shells of the second conductivity type located around the blue, green and red active regions and the plurality of semiconductor nanowires.

4. The device of claim 1, wherein:
the at least one semiconductor region of the first conductivity type comprises a planar semiconductor layer of the first conductivity type;
the blue, green and red active regions comprise layers located over the planar semiconductor layer of the first conductivity type; and
the at least one semiconductor region of the second conductivity type comprises a at least one planar semiconductor layer of the second conductivity type located over the layers which comprise the blue, green and red active regions.

5. A light emitting device, comprising:
a first light emitting diode including a first stack containing a first-type active region, and configured to emit light at a first peak wavelength;
a second light emitting diode including a second stack including the first-type active region and a second-type active region having a different composition than the first-type active region, and configured to emit light at a second wavelength that is different from the first wavelength; and
a third light emitting diode including a third stack containing the first-type active region, the second-type active region and a third-type active region having a different composition from the first and second-type active regions, and configured to emit light at a third wavelength that is different from the first and second wavelengths.

* * * * *